United States Patent
Mitani

(10) Patent No.: US 8,981,519 B2
(45) Date of Patent: Mar. 17, 2015

(54) SEMICONDUCTOR SUBSTRATE, METHOD OF MANUFACTURING SEMICONDUCTOR SUBSTRATE, THIN FILM TRANSISTOR, SEMICONDUCTOR CIRCUIT, LIQUID CRYSTAL DISPLAY APPARATUS, ELECTROLUMINESCENCE APPARATUS, WIRELESS COMMUNICATION APPARATUS, AND LIGHT EMITTING APPARATUS

(75) Inventor: Masahiro Mitani, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 28 days.

(21) Appl. No.: 13/882,582

(22) PCT Filed: Nov. 2, 2011

(86) PCT No.: PCT/JP2011/075352
§ 371 (c)(1),
(2), (4) Date: Apr. 30, 2013

(87) PCT Pub. No.: WO2012/060430
PCT Pub. Date: May 10, 2012

(65) Prior Publication Data
US 2013/0221481 A1    Aug. 29, 2013

(30) Foreign Application Priority Data

Nov. 5, 2010 (JP) .................................. 2010-248784

(51) Int. Cl.
*H01L 29/00* (2006.01)
*H01L 29/16* (2006.01)
*H01L 27/12* (2006.01)

(52) U.S. Cl.
CPC ............ *H01L 29/16* (2013.01); *H01L 27/1266* (2013.01)

USPC .... 257/506; 257/508; 257/510; 257/E21.546; 257/E29.02

(58) Field of Classification Search
CPC ............ H01L 29/1608; H01L 29/1606; H01L 29/66068; H01L 29/78; H01L 21/02529
USPC ............ 257/506, 508, 510, E21.546, E29.02
See application file for complete search history.

(56) References Cited

U.S. PATENT DOCUMENTS

| | | |
|---|---|---|
| 5,374,564 A | 12/1994 | Bruel |
| 2003/0183876 A1 | 10/2003 | Takafuji et al. |
| 2004/0161904 A1 | 8/2004 | Berne et al. |
| 2007/0026638 A1 | 2/2007 | Henley |
| 2007/0063281 A1 | 3/2007 | Takafuji et al. |

(Continued)

FOREIGN PATENT DOCUMENTS

| | | |
|---|---|---|
| JP | 06-132264 A | 5/1994 |
| JP | 3048201 B2 | 6/2000 |

(Continued)

OTHER PUBLICATIONS

Official Communication issued in International Patent Application No. PCT/JP2011/075352, mailed on Feb. 7, 2012.

*Primary Examiner* — Andy Huynh
(74) *Attorney, Agent, or Firm* — Keating & Bennett, LLP

(57) ABSTRACT

A semiconductor substrate (41) includes an insulating substrate (30), a plurality of semiconductor thin films (46) which are arranged on the insulating substrate (30) to be separated from each other, and a conductive film (33) which is arranged between the semiconductor thin films (46). Therefore, it is possible to uniformly thin the film thickness of each of the semiconductor thin films.

17 Claims, 20 Drawing Sheets

(56) References Cited

U.S. PATENT DOCUMENTS

| | | |
|---|---|---|
| 2007/0117354 A1 | 5/2007 | Gadkaree et al. |
| 2008/0038908 A1 | 2/2008 | Henley |
| 2009/0079024 A1 | 3/2009 | Yamazaki |
| 2009/0181518 A1 | 7/2009 | Omata et al. |
| 2010/0019242 A1 | 1/2010 | Takafuji et al. |
| 2010/0055872 A1 | 3/2010 | Moriwaka |
| 2010/0112784 A1 | 5/2010 | Gadkaree et al. |
| 2010/0126587 A1 | 5/2010 | Henley |
| 2010/0129950 A1 | 5/2010 | Henley |
| 2010/0129951 A1 | 5/2010 | Henley |
| 2011/0214610 A1 | 9/2011 | Omata et al. |
| 2012/0104568 A1 | 5/2012 | Yamazaki |

FOREIGN PATENT DOCUMENTS

| | | |
|---|---|---|
| JP | 2003-282885 A | 10/2003 |
| JP | 2003-324188 A | 11/2003 |
| JP | 3886959 B2 | 2/2007 |
| JP | 2009-507363 A | 2/2009 |
| JP | 2009-094496 A | 4/2009 |
| JP | 2009-516929 A | 4/2009 |
| JP | 2009-194375 A | 8/2009 |
| JP | 2010-080938 A | 4/2010 |

SEMICONDUCTOR SUBSTRATE, METHOD OF MANUFACTURING SEMICONDUCTOR SUBSTRATE, THIN FILM TRANSISTOR, SEMICONDUCTOR CIRCUIT, LIQUID CRYSTAL DISPLAY APPARATUS, ELECTROLUMINESCENCE APPARATUS, WIRELESS COMMUNICATION APPARATUS, AND LIGHT EMITTING APPARATUS

TECHNICAL FIELD

The present invention relates to a semiconductor substrate in which a plurality of semiconductor thin films are formed on an insulating substrate, a method for manufacturing the semiconductor substrate, a thin film transistor, a semiconductor circuit, a liquid crystal display apparatus, an electroluminescence apparatus, a wireless communication apparatus, and a light emitting apparatus.

BACKGROUND ART

In recent years, a method has been developed which forms an integrated circuit using a Silicon On Insulator (SOI) substrate having thin single crystal silicon layers formed on an insulating layer instead of a bulk silicon substrate for the purpose of high-speed driving and reduction in power consumption. It has been known that, if an integrated circuit is formed using an SOI substrate, it is possible to reduce parasitic capacity.

As a method for manufacturing an SOI, for example, like a Smart-Cut (registered trademark) method disclosed in PTLs 1 and 2, a method of directly transferring single crystal silicon layers to an insulating layer using hydrogen ion injection has been generally well known.

However, since a silicon substrate (wafer) of approximately 6 to 8 inch φ is used for such a general SOI substrate, it is difficult to make a large screen. In addition, the SOI substrate itself is expensive, and thus the SOI substrate becomes an extremely expensive substrate as the area thereof increases.

Here, in recent years, as disclosed in PTLs 3 and 4, a technology has been developed which manufactures an inexpensive and large-area SOI substrate by arranging and bonding a plurality of silicon wafers on an inexpensive and large-area glass substrate, and transferring silicon thin films using the Smart-Cut method or the like.

If the silicon wafers are aligned on and bonded to the large glass substrate one by one when such a large-area SOI substrate is manufactured, it is extremely inefficient. However, in a practical manner, in order to increase manufacturing efficiency, a method has been examined which arranges the silicon wafers in line on a tray, an apparatus, or the like, and then collectively bonds them to the large glass substrate or perform a heat treatment, thereby accomplishing a large area and work efficiency.

In PTL 5, a plurality of semiconductor substrates are bonded to a single large glass substrate.

In PTL 5, the silicon substrates are arranged in substrate arrangement regions which include four depressed portions provided on the substrate support of an apparatus. Subsequently, a single large base substrate is arranged by covering the silicon substrates which are arranged in the four depressed portions provided on the substrate support. Since the base substrate is large, the base substrate is supported by convex portions in the vicinity of the four substrate arrangement regions of the substrate support in order to prevent the base substrate from bending.

In addition, the silicon substrates in the substrate arrangement regions are moved up and down by a plurality of substrates support mechanisms which are on the lower sides of the silicon substrates in the substrate arrangement regions and are arranged to penetrate the substrate support. In addition, when the silicon substrates, which are moved up and down, touch the base substrate and pressure is applied, the plurality of silicon substrates are bonded to the base substrate.

In this way, in PTL 3, the plurality of silicon substrates are bonded to the base substrate which is the single large glass substrate at one time.

As described above, since the base substrate is supported by the convex portions in the vicinity of the four substrate arrangement regions of the substrate support, the plurality of silicon substrates are separated from each other and bonded to the base substrate.

PTLs 6 and 7 disclose a method of arranging silicon substrates on a tray on which a plurality of depressed portions are formed, and then transferring silicon layers which are separated from the silicon substrates to a single base substrate.

A method for manufacturing an SOI substrate disclosed in PTLs 6 and 7 will be described with reference to FIG. 14.

FIG. 14 is a view illustrating the method for manufacturing an SOI substrate disclosed in PTLs 6 and 7.

As shown in FIG. 14(a), silicon substrates 812 are respectively arranged in a plurality of depressed portions which are formed in the tray 810 and are formed to be separated from each other.

Here, when the silicon substrates 812 are arranged in the depressed portions by a machine or the like, it is generally necessary to pick up or adsorb the side surfaces or the rear surface of each silicon substrate 812 by a jig in order to prevent a bonding surface from becoming dirty. Therefore, in order to secure clearance to let the jig out after the arrangement, the plurality of depressed portions which are formed in the tray 810 are arranged to be separated from each other.

In addition, as shown in FIG. 14(b), hydrogen ions 821 are injected into the silicon substrates 812 which are arranged in the depressed portions, damaged regions 813 (fragile layers) being formed in predetermined depths of the silicon substrates 812. In addition, as shown in FIG. 14(c), a base substrate 814 which is a common single large glass substrate is bonded to the surfaces of the silicon substrates 812 in which the damaged regions 813 are formed (surfaces opposite to a side on which the tray 810 is arranged) by applying the pressure. At this time, the base substrate 814 and the tray 810 are turned over.

In addition, semiconductor layers 815 are separated from the damaged regions 813 by performing heat treatment. Therefore, it is possible to transfer the plurality of semiconductor layers 815 to the base substrate 814.

In addition, as shown in FIG. 14(d), the surfaces of the semiconductor layers 815 are planarized by irradiating laser light to the surfaces of the semiconductor layers 815.

In this way, in PTLs 6 and 7, the plurality of semiconductor layers 815 are bonded to the single base substrate 814 at one time.

Since the silicon substrates 812 are separated from each other and arranged on the tray 810, the plurality of semiconductor layers 815 are bonded to the base substrate 814 while being separated from each other.

In addition, PTL 8 discloses a method of arranging a plurality of silicon substrates on a base substrate, covering the silicon substrates using a cover, separating the silicon substrates from damaged regions and transferring silicon layers to the base substrate.

In this manner, the silicon substrates are separated from the damaged regions after being covered using the cover. Therefore, after the silicon substrates are separated, regions on the sides of the substrates which are different from the semiconductor layers to be transferred to the base substrate are prevented from being off to the sides in the silicon substrates, and from damaging the transferred semiconductor layers.

In addition, it is necessary that the semiconductor layers, which are arranged in the base substrate, be thin films in order to acquire desired TFT characteristics (low off leakage current) or secure the coverage of an insulating film to be formed thereon. However, if the semiconductor layers, which have thin film thickness because the damaged regions 813 are shallowly formed, are directly transferred to the base substrate, holes are easily formed in the semiconductor layers, and thus yield is lowered.

Therefore, the semiconductor layers which are thicker than a desired film thickness are transferred to the base substrate in advance. In addition, as shown in FIG. 14(d), after laser light is irradiated and the surfaces of the semiconductor layers are planarized, a so-called etch-back process is performed, and thus the semiconductor layers are thinned.

In the etch-back process, a dry etching process is performed in such a way that the base substrate on which the semiconductor layers are arranged is inserted into a chamber, process gas is introduced to the chamber, and plasma is generated on the surface of the base substrate.

CITATION LIST

Patent Literature

PTL 1: Japanese Patent No. 3048201 (registered Mar. 24, 2000)
PTL 2: Japanese Patent No. 3886959 (registered Dec. 1, 2006)
PTL 3: Japanese Unexamined Patent Application Publication (Translation of PCT Application) No. 2009-507363 (published Feb. 19, 2009)
PTL 4: Japanese Unexamined Patent Application Publication (Translation of PCT Application) No. 2009-516929 (published Apr. 23, 2009)
PTL 5: Japanese Unexamined Patent Application Publication No. 2009-194375 (published Aug. 27, 2009)
PTL 6: Japanese Unexamined Patent Application Publication No. 2009-94488 (published Apr. 30, 2009)
PTL 7: Japanese Unexamined Patent Application Publication No. 2009-94496 (published Apr. 30, 2009)
PTL 8: Japanese Unexamined Patent Application Publication No. 2010-80938 (published Apr. 8, 2010)

SUMMARY OF INVENTION

Technical Problem

As in the above-described PTLs 5 to 7, the plurality of silicon layers which are transferred to the base substrate are generally separated from each other and transferred to the base substrate.

As in PTLs 6 and 7, even when the plurality of silicon substrates 812 are once arranged in the depressed portions of the tray 810, it is necessary that the plurality of silicon substrates 812 be arranged in the depressed portions of the tray 810 without touching the surfaces of silicon substrates 812 such that bonding is not affected.

That is, it is necessary to hold the side surfaces or rear surface of each silicon substrate 812 using a jig, such as a robot arm or the like, to place the silicon substrate 812 in each depressed portion of the tray 810, and then let the jig, such as a robot arm or the like, out.

Since clearance is necessary to let the jig out, it is difficult to arrange the silicon substrates on the tray without intervals in a practical manner. Therefore, each of the plurality of semiconductor layers is transferred to the base substrate while being separated from each other.

In addition, in PTL 8, when recovering regions which are separated from the damaged areas of the silicon substrates and which are on substrate sides different from semiconductor layers which are transferred to the base substrate, in order to prevent the regions from being off to the sides and from damaging the semiconductor layers which are transferred to the base substrate, it is preferable that the silicon substrates be separated from each other and arranged such that the silicon substrates are partitioned off from each other in a tray which receives the silicon substrates in the depressed portions one by one.

Therefore, generally, the plurality of semiconductor layers which are transferred to the base substrate are separated from each other. In addition, in this manner, the etch-back process is performed on the base substrate to which the semiconductor layers are transferred.

FIG. 15 is a view illustrating a case in which the etch-back process is performed on an SOI substrate in which a plurality of semiconductor layers are separated from each other and arranged on a base substrate.

In the SOI substrate 916 in which a plurality of semiconductor thin films 915 are formed on the base substrate 914 through an insulating film 912, if the plurality of semiconductor thin films 915 are transferred, the etch-back process is performed to make the transferred semiconductor thin films 915 have desired film thickness.

In the etch-back process, the SOI substrate 916 is inserted into a chamber 901 and placed on the lower electrode 903.

In addition, etching gas is introduced into the chamber 901 and a high-frequency power of 13.56 MHz is applied to the lower electrode 903, with the result that the introduced etching gas is excited by high-frequency power and plasma is generated between an upper electrode 904 and the lower electrode 903, and thus ions in the plasma gravitate toward the lower electrode 903.

Here, as described above, the plurality of semiconductor thin films 915 which are arranged on the base substrate 914 of the SOI substrate 916 are separated from each other and arranged on the base substrate 914. Therefore, spaces 924 between the semiconductor thin films 915 of the base substrate 914 become regions where insulated sections are exposed.

That is, since the SOI substrate 916 has a structure in which the semiconductor thin films 915 are mixed with insulated sections which are the spaces 924 where the base substrate 914 is exposed, potential difference is generated between the semiconductor thin films 915 and the spaces 924.

In this manner, if a dry etching process is performed on the surface of the SOI substrate 916 in which the semiconductor thin films 915 and the spaces 924 between the semiconductor thin films 915 are mixed, an electric field (line of electric force) converges on the end portions of each of the semiconductor thin films 915 as shown using arrows in FIG. 15, the end portions (peripheral portions) of each of the semiconductor thin films 915 are further etched compared to the center portion of each of the semiconductor thin films 915, and thus the film thickness thereof is thinned.

FIG. 16(a) is a plane view illustrating the configuration of an SOI substrate 916a acquired before the etch-back process is performed, and FIG. 16(b) is a view illustrating the configuration of an SOI substrate 916b acquired after the etch-back process is performed.

As shown in FIG. 16(a), on the SOI substrate 916a acquired before the etch-back process is performed, a plurality of semiconductor thin films 915 are arranged on a base substrate 914 in a matrix shape while including spaces 924 therebetween. An insulating glass substrate is exposed at the spaces 924 between the semiconductor thin films 915.

It is assumed that a single semiconductor thin film 915 has an area which includes a region in which six panels (liquid crystal display panels or the like) 917 can be formed. In other words, the single semiconductor thin film 915 has uniform film thickness sufficient to include a region in which six panels 917 can be formed.

As described above, the etch-back process is performed on the SOI substrate 916a on which the semiconductor thin films 915 are arranged.

If so, as shown in FIG. 16(b), with regard to the semiconductor thin films 915, which are arranged on the SOI substrate 916b acquired after the etch-back process is performed, the peripheral portions 915a of the semiconductor thin films 915 are thinned or eliminated, and thus the areas of the semiconductor thin films 915b which are uniform film thickness regions become small, compared to the semiconductor thin films 915 acquired before the etch-back is performed. Therefore, approximately four panels 917 can be formed in a single semiconductor thin film 915b. Therefore, a problem occurs in that the obtainment efficiency of panels 917 is deteriorated, and thus panel costs increase.

The present invention has been made to solve the above problem, and an object of the present invention is to uniformly thin the film thickness of a plurality of semiconductor thin films, which are arranged on an insulating substrate, up to the peripheral portions thereof.

Solution to Problem

In order to solve the problem, a semiconductor substrate according to the present invention includes: an insulating substrate that is formed of an insulating material; a plurality of semiconductor thin films that are arranged on the insulating substrate to be separated from each other; and a conductive film which is arranged between the semiconductor thin films.

According to the configuration, since the conductive film is formed between the plurality of semiconductor thin films on the insulating substrate, it is possible to suppress the exposure of the surface of the insulating substrate between the semiconductor thin films.

Therefore, when a dry etching process is performed on the surface of the insulating substrate in order to make each of the semiconductor thin films a desired film thickness, (hereinafter, there is a case in which the dry etching process to thin the semiconductor thin films is called an etch-back process), it is possible to acquire semiconductor thin films on which the etch-back process is performed in such a way that the occurrence of potential difference between the semiconductor thin films and in the semiconductor thin films is suppressed, and that the convergence of electric fields on the edge portions in each of the semiconductor thin films is suppressed.

Therefore, it is possible to acquire a semiconductor substrate in which semiconductor thin films, which are uniform up to the peripheral portions thereof and which are thinned to desired film thickness, are formed, by performing the etch-back process.

In order to solve the above problem, a method for manufacturing a semiconductor substrate according to the present invention includes: bonding a plurality of single crystal semiconductor substrates to an insulating substrate such that the plurality of single crystal semiconductor substrates are separated from each other; dividing a part of each of the single crystal semiconductor substrates, and transferring a plurality of semiconductor thin films to the insulating substrate such that the plurality of semiconductor thin films are separated from each other; and forming a conductive film that is formed of a conductive material between the plurality of semiconductor thin films.

Otherwise, in order to solve the above problem, a method for manufacturing the semiconductor substrate according to the present invention includes: forming a film, which is formed of a conductive material, on an insulating substrate; forming the film in such a way as to expose the insulating substrate by removing the film, which is formed of the conductive material, in regions to which a plurality of single crystal semiconductor substrates are bonded, and, at the same time, to cause the conductive film to remain on the insulating substrate in regions in which the single crystal semiconductor substrates are not bonded; bonding the plurality of single crystal semiconductor substrates to the regions where the insulating substrate is exposed by removing the film which is formed of the conductive material such that the plurality of single crystal semiconductor substrates are separated from each other; and dividing a part of each of the single crystal semiconductor substrates, and transferring the plurality of semiconductor thin films to the insulating substrate on which the conductive film is formed such that the plurality of semiconductor thin films are separated from each other.

According to the configuration, since it is possible to form the conductive film between the plurality of semiconductor thin films which are transferred to the insulating substrate, it is possible to suppress the exposure of the surface of the insulating substrate between the semiconductor thin films.

Therefore, when the etch-back process is performed on the semiconductor substrate in order to make each of the semiconductor thin films have a desired film thickness, it is possible to perform the etch-back process in such a way that the occurrence of potential difference between the plurality of semiconductor thin films and the insulating substrate is suppressed, and that the convergence of electric fields on the peripheral portions (end portions) of the semiconductor thin films is suppressed.

Therefore, it is possible to uniformly thin the plurality of semiconductor thin films up to the peripheral portions thereof with desired film thickness by performing the etch-back process.

Advantageous Effects of Invention

The semiconductor substrate according to the present invention includes: an insulating substrate that is formed of an insulating material; a plurality of semiconductor thin films that are arranged on the insulating substrate to be separated from each other; and a conductive film which is arranged between the semiconductor thin films and is formed of a conductive material.

The method for manufacturing the semiconductor substrate according to the present invention includes: bonding surfaces of a plurality of single crystal semiconductor substrates to an insulating substrate such that the plurality of single crystal semiconductor substrates are separated from each other; dividing a part of each of the single crystal semiconductor substrates, and transferring a plurality of semiconductor thin films to the insulating substrate such that the plurality of semiconductor thin films are separated from each other; and forming a conductive film that is formed of a conductive material between the plurality of semiconductor thin films.

A method for manufacturing the semiconductor substrate according to the present invention includes: forming a film, which is formed of a conductive material, on an insulating substrate; forming the film in such a way as to expose the insulating substrate by removing the film, which is formed of the conductive material, in regions to which a plurality of single crystal semiconductor substrates are bonded, and, at the same time, to cause the conductive film to remain on the insulating substrate in regions in which the single crystal semiconductor substrates are not bonded; bonding the surfaces of the plurality of single crystal semiconductor substrates to the regions which expose the insulating substrate because the film which is formed of the conductive material is removed such that the plurality of single crystal semiconductor substrates are separated from each other; and dividing a part of each of the single crystal semiconductor substrates, and transferring the plurality of semiconductor thin films to the insulating substrate on which the conductive film is formed such that the plurality of semiconductor thin films are separated from each other.

Therefore, there is an advantage in that it is possible to acquire a semiconductor substrate in which semiconductor thin films, which are uniform up to the peripheral portions thereof and which are thinned to desired film thickness, are formed.

BRIEF DESCRIPTION OF DRAWINGS

FIG. 1(a) is a plane view illustrating the semiconductor substrate acquired before an etch-back process is performed, and FIG. 1(b) is a plane view illustrating the semiconductor substrate acquired after the etch-back process is performed.

FIG. 12(a) illustrates a conductive film which is formed of a beta film, and FIG. 12(b) illustrates a conductive film which is formed of an island pattern.

DESCRIPTION OF EMBODIMENTS

First Embodiment

Configuration of Semiconductor Substrate

Hereinafter, a first embodiment of the present invention will be described in detail.

FIGS. 1(a) and 1(b) are plane views illustrating the configurations of semiconductor substrates according to the first embodiment of the present invention, FIG. 1(a) is a plane view illustrating a semiconductor substrate acquired before an etch-back process is performed, and FIG. 1(b) is a plane view illustrating a semiconductor substrate acquired after the etch-back process is performed.

The semiconductor substrates 40 and 41 shown in FIGS. 1(a) and 1(b) are substrates which are formed in such a way that a plurality of semiconductor thin films 16 and 46 are transferred to an insulating substrate 30.

Generally, an etch-back process is performed on the semiconductor thin films 16 and 46 which are transferred to the insulating substrate, and thus the semiconductor thin films 16 and 46 are thinned, thereby being adjusted to have desired film thickness.

Figure 1:
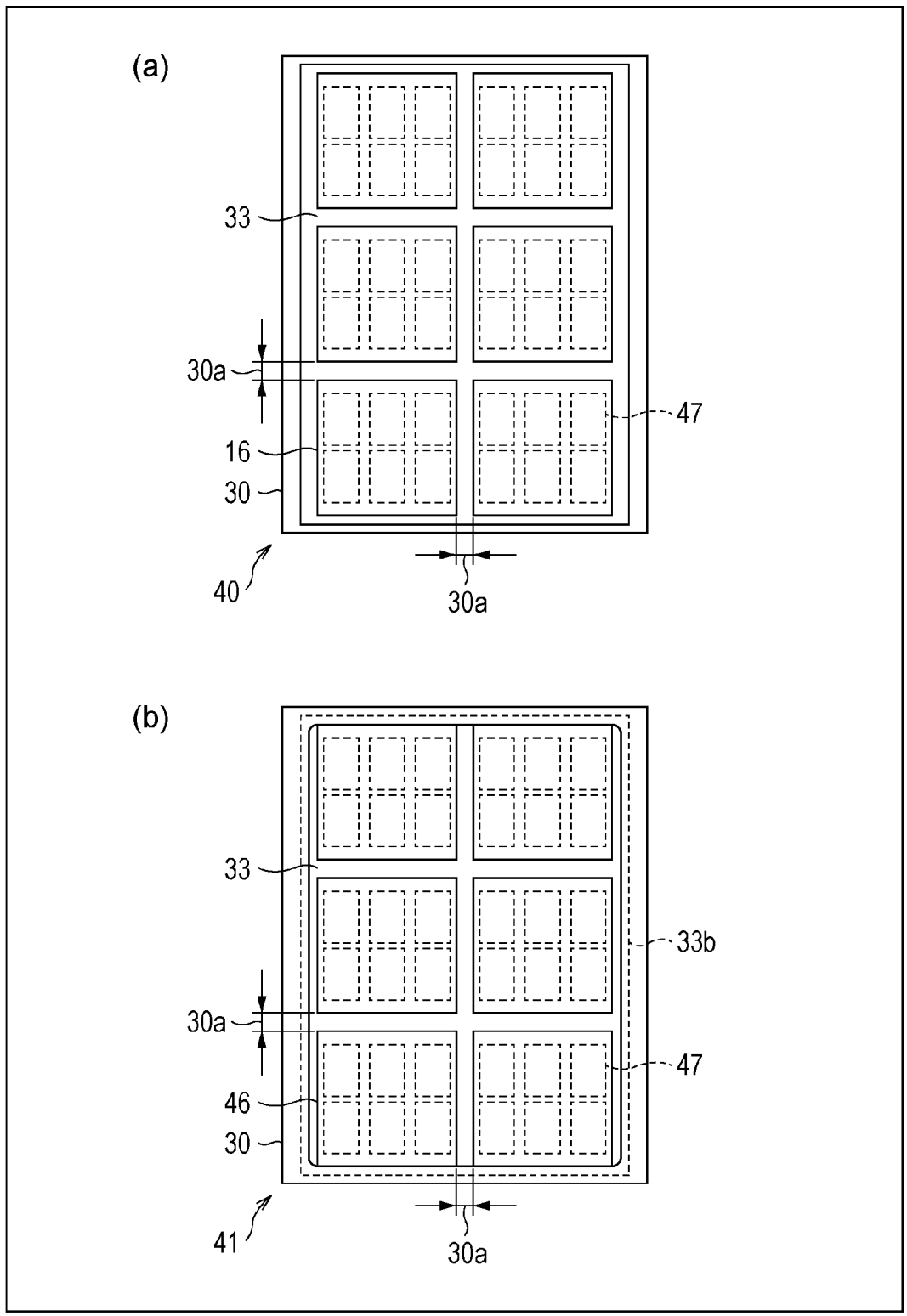
FIGS. 1(a) and 1(b) are plane views illustrating the configuration of a semiconductor substrate according to an embodiment of the present invention.

The semiconductor substrate 40 shown in FIG. 1(*a*) is a semiconductor substrate acquired before the etch-back process is performed, and the semiconductor thin films 16 included in the semiconductor substrate 40 are formed to be thicker than the desired film thickness.

On the other hand, the semiconductor substrate 41 shown in FIG. 1(*b*) is a semiconductor substrate on which the etch-back process is performed, and the semiconductor thin films 46 are adjusted to have the desired film thickness.

Each of the semiconductor substrates 40 and 41 includes an insulating substrate 30 which is formed of an insulating material, the plurality of semiconductor thin films 16 and 46 which are arranged on the insulating substrate 30 and are separated from each other, and a conductive film 33 which is interposed between the plurality of semiconductor thin films 16 and 46 and is formed of a conductive material.

In the first embodiment, as will be described below, each of the semiconductor substrates 40 and 41 is an SOI substrate in which the semiconductor thin films 16 and 46 formed of silicon are transferred to the insulating substrate 30 which is formed of glass as the insulating material.

Since the conductive film 33 is arranged between the plurality of semiconductor thin films 16 and 46, each of the semiconductor substrates 40 and 41 has a structure in which an insulated section is not exposed throughout almost a whole surface.

The insulating substrate 30 is formed of an insulating material. It is possible to use, for example, quartz, glass, or the like, as the insulating substrate 30. It is possible to configure an inexpensive and large-area SOI substrate using a glass substrate.

In particular, when a mother glass substrate, which has been developed to manufacture a liquid crystal panel, is used as the insulating substrate 30, it is possible to manufacture a liquid crystal display panel using the completed semiconductor substrates 40 and 41.

For example, when a large-sized glass substrate for liquid crystal display panel of the fourth generation (730 mm×920 mm), the sixth generation (1500 mm×1850 mm), the eighth generation (2200 mm×2400 mm), or the like is used as the insulating substrate 30, it is possible to acquire a large-area SOI substrate in which, for example, a plurality of pieces of semiconductor thin films 16 and 46 of approximately 5-inch squares (125 mm×125 mm) are bonded.

It is possible to use a semiconductor, such as a-Si (amorphous silicon), poly-Si (poly-silicon), or the like, a transparent conductive film, such as ITO or the like, a metal material, such as Ta, W, Mo, Ti, Al, Cr, or the like, a conductive resist, or the like as the conductive film 33.

The semiconductor thin films 16 and 46 are formed on the insulating substrate 30 through an insulating layer which is formed between the insulating substrate 30 and the semiconductor thin films 16 and 46.

The plurality of semiconductor thin films 16 and 46 are separated from each other and formed on the insulating substrate 30. The plurality of semiconductor thin films 16 and 46 are arranged in a matrix, and arranged on the insulating substrate 30. As an example, in the first embodiment, six pieces of semiconductor thin films 16 and 46 are formed on a single insulating substrate 30 while being separated from each other.

As an example, it is preferable that the semiconductor thin films 16 and 46 be separated from each other at intervals of 5 mm or larger. Therefore, when semiconductor substrates are placed on the tray, a minimum of clearance for picking up by a jig or for letting the jig out is secured between the semiconductor substrates, and thus it is possible to arrange a plurality of single crystal semiconductor substrates in order to form the semiconductor thin films 16 and 46 on the insulating substrate 30 without touching the surfaces thereof. Therefore, it is possible to acquire the semiconductor substrates 40 and 41 on which the semiconductor thin films 16 and 46 having little occurrence of defects, such as damages, holes, or the like, are arranged.

Further, if the intervals between the plurality of semiconductor thin films 16 and 46 are 50 mm or less, it is possible to suppress the deterioration of panel obtainment efficiency due to the deterioration of the efficiency of arranging the plurality of semiconductor thin films 16 and 46 on the insulating substrate 30.

That is, it is possible to suppress the deterioration of the panel obtainment efficiency by causing the intervals between the plurality of semiconductor thin films 16 and 46 to be equal to or larger than 5 mm and equal to or less than 50 mm, and it is possible to obtain the semiconductor substrates 40 and 41 on which the semiconductor thin films 16 and 46, having little occurrence of defects, such as damage, holes, or the like, are arranged.

The semiconductor thin films 16 and 46 are arranged in a matrix shape on the insulating substrate 30. Therefore, since the semiconductor thin films 16 and 46 are regularly and closely spread and arranged on the insulating substrate 30, it is possible to increase the panel obtainment efficiency by minimizing the region in which the semiconductor thin films 16 and 46 are not arranged on the insulating substrate 30. In addition, since the arrangement of the semiconductor thin films 16 and 46 is simple and regular with the matrix shaped arrangement, it is possible to reduce the number of exposure shots which is necessary when the conductive film 33 is formed between the semiconductor thin films 16 and 46, and thus it is possible to efficiently form the conductive film 33 between the semiconductor films 16 and 46.

As described above, it is possible to acquire the semiconductor substrates 40 and 41 in which the plurality of semiconductor thin films 16 and 46, which are separated from each other, and the conductive film 33 therebetween are efficiently formed on the insulating substrate 30.

The semiconductor thin films 16 and 46 are formed on the insulating substrate 30 by being transferred using, for example, the Smart-Cut (registered trademark) method or the like.

Semiconductor layers, which configure the semiconductor thin films 16 and 46, are formed of single crystal silicon in the first embodiment. The semiconductor thin films 16 before the etch-back process is performed are formed to be thicker than desired film thickness.

As an example, the semiconductor thin films 16 are formed to be equal to or larger than 50 nm and equal to or less than 200 nm. Therefore, when the semiconductor thin films 16 are transferred to the insulating substrate 30, the semiconductor thin films 16 secure sufficient film thickness in advance, and thus it is possible to prevent holes from being made in the semiconductor thin films 16 or prevent bad transfer.

In addition, the etch-back process is performed on the semiconductor thin films 16 which are transferred to the insulating substrate 30 so as to have desired film thickness, and thus the semiconductor thin films 46 are formed.

It is preferable to suppress the amount (film thickness) of the etched semiconductor thin films 16 to approximately 100 nm or less. Therefore, since it is possible to suppress the film thickness for etching or for etching time, it is difficult to receive the difference in the etching rate depending on positions in the substrate (in-plane distribution effect), and thus it is possible to acquire a semiconductor substrate which includes semiconductor thin films having uniform film thickness.

In addition, as an example, the semiconductor thin films 46 acquired after the etch-back process is performed are formed with the desired film thickness which is be equal to or larger than 30 nm and equal to or less than 100 nm. Therefore, it is possible to form the semiconductor layers each having the film thickness which is suitable for, for example, a TFT for driving pixels which are formed in the liquid crystal display panel.

It is possible to configure a semiconductor which is used for, for example, the TFT for driving pixels in the liquid crystal display panel from the semiconductor thin films 46.

For example, it is possible to acquire a panel for manufacturing six liquid crystal display panels from a single piece of semiconductor thin film 46. That is, for example, a single piece of semiconductor thin film 46 has a region having uniform film thickness to the extent that it is possible to acquire a panel 47 for manufacturing six liquid crystal display panels.

(Etch-Back Process)

Figure 2:
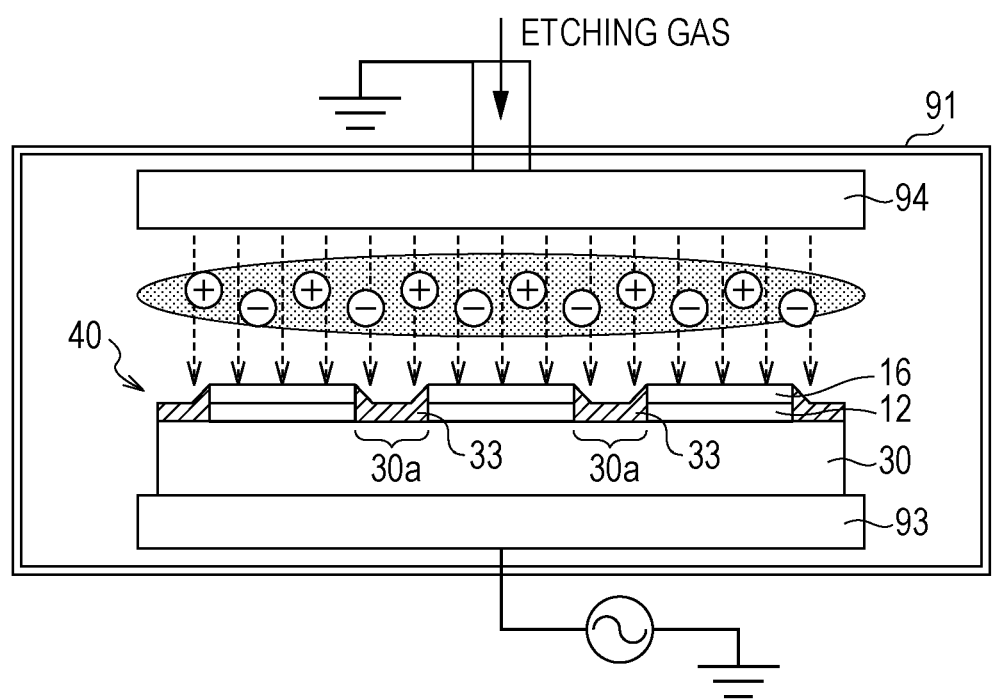
FIG. 2 is a view illustrating an etch-back process according to an embodiment of the present invention.

Subsequently, the etch-back process to make the semiconductor thin films 16 have the desired film thickness will be described with reference to FIG. 2. FIG. 2 is a view illustrating the etch-back process.

In the semiconductor substrate 40 shown in FIG. 1(*a*), the semiconductor thin films 16 and insulating layers 12, which are arranged on the lower layers of the semiconductor thin films 16, are formed on the insulating substrate 30 through transfer. As described above, in order to make the plurality of semiconductor thin films 16 which are transferred to the insulating substrate 30 have the desired film thickness, the etch-back process is performed on the semiconductor substrate 40 to which the semiconductor thin films 16 are transferred.

A dry etching apparatus which performs the etch-back process includes an upper electrode 94 which is arranged on an upper side in a chamber 91, and a lower electrode 93 which is arranged to face the upper electrode 94 on a lower side in the chamber 91. In addition, the chamber 91 is configured to be able to introduce etching gas into the chamber 91.

The semiconductor substrate 40 is placed on the surface of the lower electrode 93.

In addition, etching gas is introduced into the chamber 91 and a high-frequency power of 13.56 MHz is applied to the lower electrode 93, with the result that the introduced etching gas is excited by the high-frequency power and plasma is generated between the upper electrode 94 and the lower electrode 93, and thus ions in the plasma gravitate toward the lower electrode.

Figure 15:
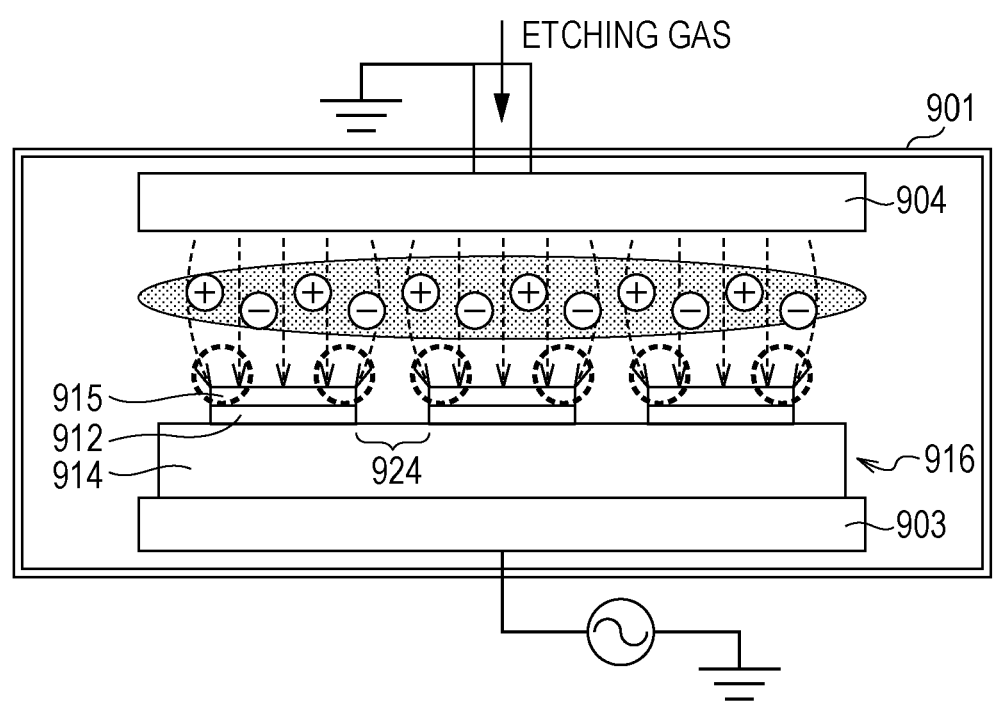
FIG. 15 is a view illustrating a state in which the etch-back process is performed on the SOI substrate, on which a plurality of semiconductor layers are separated from each other and arranged, in a base substrate in the related art.

As described with reference to FIG. 15, in the SOI substrate 916, the base substrate 914 which is formed of the insulating material is exposed in the spaces 924 between the plurality of semiconductor layers 915. As described above, since the SOI substrate 916 has a structure in which the semiconductor layers are mixed with the insulating region, potential difference is generated between the semiconductor layers 915 and the spaces 924, and an electric field (line of electric force) converges on the end portions of the semiconductor layers 915.

On the other hand, as shown in FIG. 2, in the semiconductor substrate 40, the conductive film 33 is arranged to surround the peripheries in the semiconductor thin films 16, and the spaces 30*a* between the plurality of semiconductor thin films 16 are filled with the conductive film 33. That is, the surface of the insulating substrate 30 is suppressed from being exposed between the plurality of semiconductor thin films 16.

Therefore, in the semiconductor substrate 40, when plasma is emitted by performing the etch-back process, the in-plane distribution of the potential difference is not generated in the semiconductor substrate 40. That is, potential difference is suppressed from being generated in the spaces 30*a* between the semiconductor thin films 16 and in the semiconductor thin films 16, and thus it is possible to perform uniform in-plane etching.

As a result, as shown in FIG. 1(*b*), it is possible to acquire the semiconductor thin films 46 on which the etch-back process is performed while electric fields are suppressed from converging on the in-plane peripheral portions (edge portions) of the semiconductor thin films 16. That is, it is possible to sufficiently secure the area in which the panel 47 can be formed (the area of the region in which the film thickness of the semiconductor thin films 46 is uniform), and to form the semiconductor thin films 46 which are adjusted to have desired film thickness.

In particular, in the semiconductor substrate 40 according to the first embodiment, since the plurality of semiconductor thin films 16 are connected to the conductive film 33, it is possible to completely prevent the insulating substrate 30 from being exposed between the plurality of semiconductor thin films 16. Therefore, when the etch-back process is performed on the semiconductor thin films 16, it is possible to securely prevent the electric field from converging on the peripheries in the semiconductor thin films 16, and it is possible to acquire the semiconductor substrate 41, on which the semiconductor thin films 46 having thinned film thickness are formed, while securely maintaining uniform film thickness.

In the semiconductor substrate 41 shown in FIG. 1(*b*), like the semiconductor substrate 40 acquired before the etch-back process is performed, an area in which six pieces of panels 47 can be formed in a single semiconductor thin film 46 is secured in each of the semiconductor thin films 46.

Figure 16:
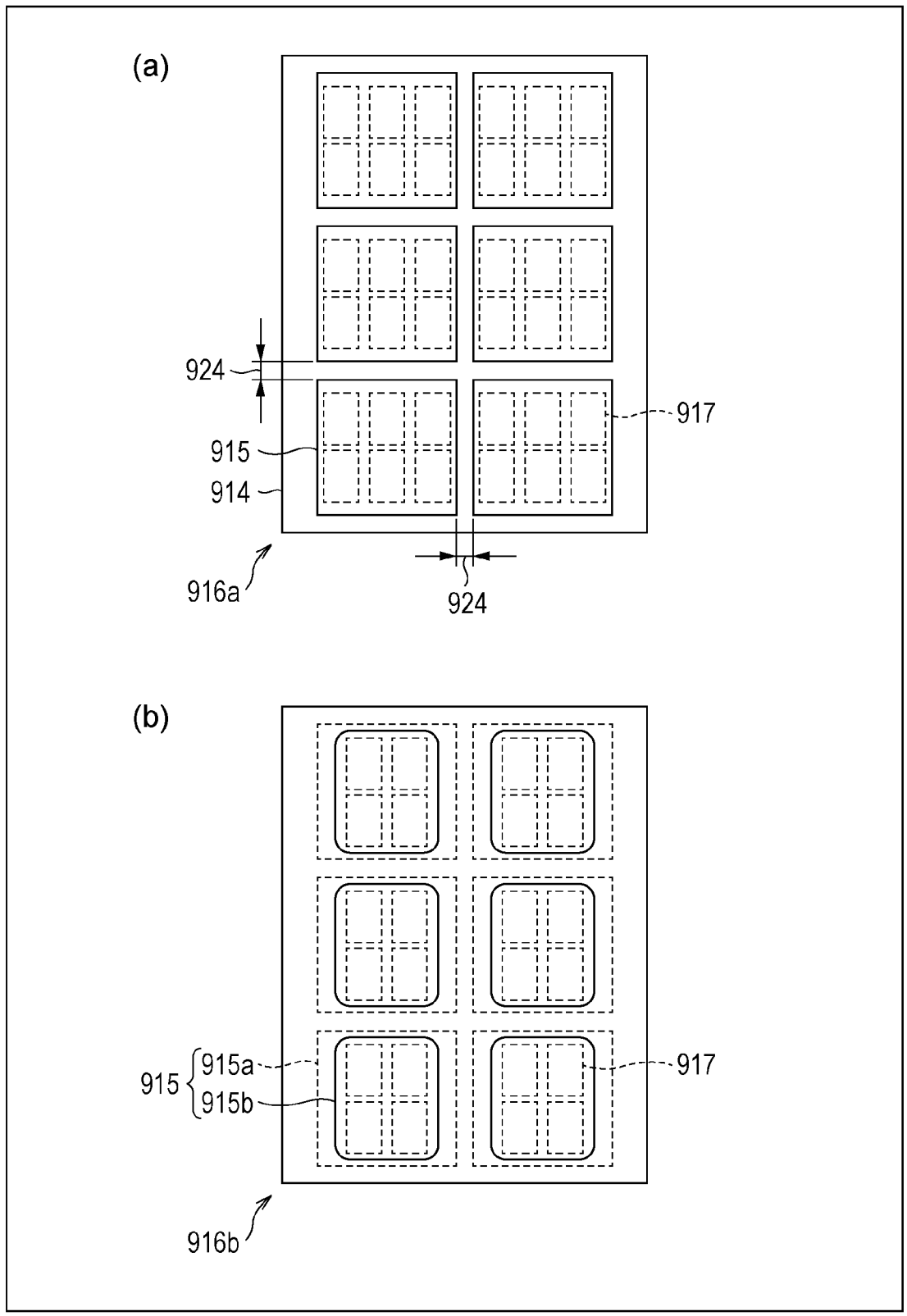
FIG. 16(a) is a plane view illustrating the semiconductor substrate in the related art and the configuration of the SOI substrate acquired before the etch-back process is performed, and FIG. 16 (b) is a view illustrating the configuration of the SOI substrate acquired after the etch-back process is performed.

Therefore, in the semiconductor substrate 41, compared to a case in which the conductive film 33 is not provided (FIG. 16(*b*)), it is possible to increase the number of panels 47 which are acquired from a single semiconductor thin film 46, and thus it is possible to realize the improvement of yield and reduction in costs by improving the obtainment efficiency of the panels 47.

(Method of Manufacturing Semiconductor Substrate)

Subsequently, a method for manufacturing the semiconductor substrate 41 will be described with reference to FIGS. 3 to 5.

<Process before Bonding to Insulating Substrate>

First, each process to bond single crystal semiconductor substrates to an insulating substrate will be described with reference to FIG. 3.

Figure 3:
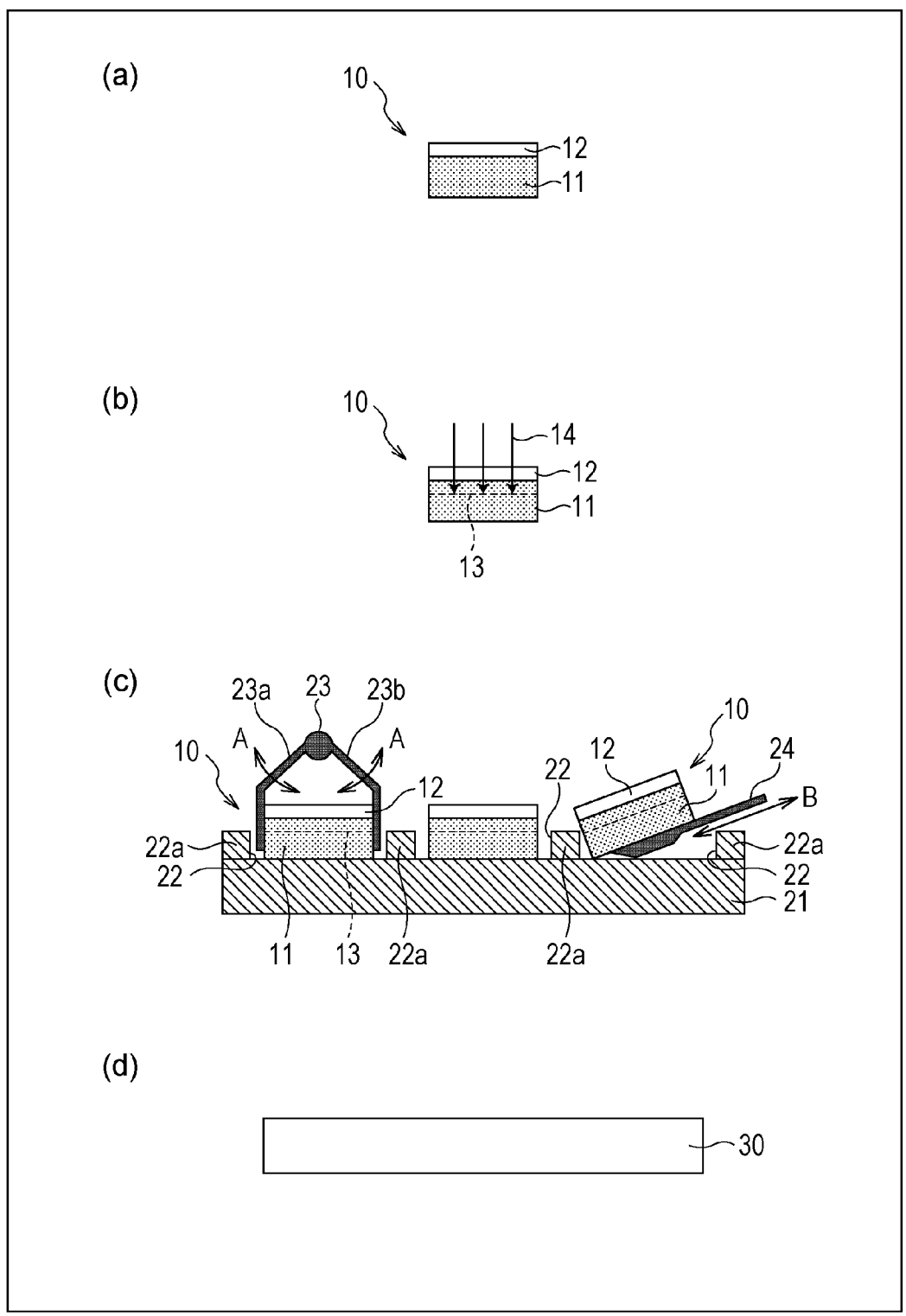
FIG. 3 is a view illustrating a process to manufacture single crystal semiconductor substrates and an insulating substrate, and a process to place the single crystal semiconductor substrates on a tray in a process to manufacture the semiconductor substrate according to the present invention.

FIG. 3 is a view illustrating a process to manufacture single crystal semiconductor substrates and an insulating substrate, and a process to place the single crystal semiconductor substrates on a tray.

As shown in FIG. 3(*a*), in an oxide film forming process, first, an oxide film 12 (insulating film) is formed on the surface of a single crystal semiconductor substrate 11. Meanwhile, the single crystal semiconductor substrate 11 and the oxide film 12 are called a substrate 10.

In the first embodiment, single crystal silicon is used for the single crystal semiconductor substrate 11. When the silicon substrate is used for the single crystal semiconductor substrate 11, in order to form the oxide film 12 on the surface of the single crystal semiconductor substrate 11, a thermal oxidation process is performed on the single crystal semiconductor substrate 11 acquired before the oxide film 12 is formed.

In the thermal oxidation process, a general vertical furnace or horizontal furnace is used, and a heat of an extent of 900 to 1000° C. is applied to the single crystal semiconductor substrate 11 (that is, the silicon substrate) acquired before the oxide film 12 is formed for 1 to 3 hours. Therefore, as a $SiO_2$ film which is laminated on the single crystal semiconductor substrate 11, the oxide film 12 is formed. In this way, it is possible to form the substrate 10 which includes the single crystal semiconductor substrate 11 and the oxide film 12. The oxide film 12 is formed on the surface of the single crystal semiconductor substrate 11 in a thickness of an extent of 50 to 100 nm.

When the silicon substrate is used for the single crystal semiconductor substrate 11, for example, a circular silicon wafer of 8 inches (200 mm), 12 inches (300 mm), 18 inches (450 mm), or the like is cut off in rectangular forms, and the thermal oxidation process is performed thereon, thereby forming the substrate 10.

Meanwhile, the single crystal semiconductor substrate 11 is not limited to silicon, and the semiconductor material of single crystal may be used.

In addition to silicon, for example, germanium, a semiconductor material which includes silicon and germanium, a silicon compound, a group of III-V compound semiconductor such as GaAs, GaN, or the like, can be used for the single crystal semiconductor substrate 11.

When the single crystal semiconductor substrate 11 is formed of a semiconductor material other than silicon, the substrate 10 may be formed by depositing the oxide film 12 ($SiO_2$ film) on the single crystal semiconductor substrate 11 using, for example, the Chemical Vapor Deposition (CVD) method.

Subsequently, as shown in FIG. 3(b), in a fragile layer forming process, a fragile layer 13 is formed on each of the plurality of single crystal semiconductor substrates 11 by irradiating ions on each of the single crystal semiconductor substrates 11 on which the oxide film 12 is laminated.

Ion beams 14 are radiated (hydrogen ion injection, hydrogen ion doping) from the side of the surface of the oxide film 12 to each of the plurality of single crystal semiconductor substrates 11 in which the oxide film 12 is formed on the surface thereof in the oxide film forming process. In this manner, the fragile layer 13 is formed inside each of the plurality of single crystal semiconductor substrates 11 in such a way that hydrogen ions are poured into a predetermined depth of the inside of each of the plurality of single crystal semiconductor substrates 11.

For example, the fragile layer 13 is formed at a position in a depth to the extent of 50 to 200 nm from the interface between the oxide film 12 and each of the plurality of single crystal semiconductor substrates 11.

For example, when ion injection is performed on each of the plurality of single crystal semiconductor substrates 11 using $H^+$ ions, injection energy: an extent of 5 to 20 keV and injection amount: an extent of $1 \times 10^{16}/cm^2$ to $1 \times 10^{17}/cm^2$ are set as hydrogen ion injection (doping) conditions.

When ions including ions, such as $H_3^+$ ions, are injected to each of the plurality of single crystal semiconductor substrates 11, ion injection is performed under the conditions of injection energy: an extent of 30 to 90 keV and injection amount: $1 \times 10^{16}/cm^2$ to $1 \times 10^{17}/cm^2$.

Subsequently, as shown in FIG. 3(c), in a process to place each of the plurality of single crystal semiconductor substrates 11, the plurality of single crystal semiconductor substrates 11, on which the fragile layers 13 are formed, are placed on a tray 21.

A plurality of depressed portions 22, in order that the single crystal semiconductor substrates 11 are placed, are formed in a matrix shape on the surface of the tray 21. Each of the single crystal semiconductor substrates 11 is transported to and placed on each of the depressed portions 22 by picking up or adsorbing it using, for example, a jig or a robot arm. Therefore, the plurality of single crystal semiconductor substrates 11 are placed on the tray 21 in a matrix.

Here, if the surface of the oxide film 12 which is laminated on each of the plurality of single crystal semiconductor substrates 11 is touched when each of the plurality of single crystal semiconductor substrates 11 is transported in order to be placed in the depressed portion 22 of the tray 21, there is a strong possibility that a defect will occur when each of the plurality of single crystal semiconductor substrates 11 is bonded to the insulating substrate in a subsequent process.

Therefore, the jig or the robot arm which transports each of the plurality of single crystal semiconductor substrates 11 has a configuration such as that of a placing jig 23 or a placing jig 24 as shown in FIG. 3(c).

The placing jig 23 has arms 23a and 23b which can be opened and closed in the arrow A direction. The placing jig 23 places each of the plurality of single crystal semiconductor substrates 11 in the depressed portion 22 of the tray 21 by picking up or dropping the side surfaces of each of the plurality of single crystal semiconductor substrates 11 using the arms 23a and 23b.

In addition, the placing jig 24 fixes and transports each of the plurality of single crystal semiconductor substrates 11 by supporting and adsorbing the rear surface of each of the plurality of single crystal semiconductor substrates 11 (surface which is opposite to the surface on which the oxide film 12 is formed). The placing jig 24 can operate in the oblique direction (in the arrow B direction in FIG. 3(c)) with regard to the depressed portions 22 of the tray 21.

In addition, when each of the plurality of single crystal semiconductor substrates 11 is placed in the depressed portion 22 of the tray 21, the placing jig 24 is inclined obliquely, and is taken out in the oblique direction while reducing adsorption.

Otherwise, although not shown in the drawing, the substrate 10 is placed on a poking-up pin which can move up and down and is arranged on the bottom surface of the depressed portion 22 of the tray 21. After the substrate 10 is placed, the placing jig 24 which releases the adsorption may be taken out in the horizontal direction. Thereafter, the poking-up pin drops and the substrate 10 is settled in the depressed portion 22 of the tray 21.

In this way, the single crystal semiconductor substrates 11 are placed in the depressed portions 22 of the tray 21 by the placing jig 24. In addition, even when any method is used, each of the plurality of substrates 10 are separated from each other and placed on the tray 21.

When the single crystal semiconductor substrates 11 are placed on the tray 21, in order to prevent the single crystal semiconductor substrates 11 which are adjacently placed from being damaged, walls 22a between the depressed portions 22, used to divide the single crystal semiconductor substrates 11, are necessary.

In addition, since the single crystal semiconductor substrates 11 are transported to and placed in the depressed portions 22 of the tray 21 in such a way that the side surfaces or the rear surfaces thereof are supported by the placing jig 23 or 24, a distance is provided between the plurality of single crystal semiconductor substrates 11 which are placed on the tray 21 to some extent.

That is, it is necessary to provide the interval (the width of the wall 22a) between the depressed portions 22, the side walls of the wall 22a which configure the depressed portion 22, and the interval between the single crystal semiconductor substrates 11 which are placed in the depressed portions 22 (clearance space) to some extent. That is, the plurality of single crystal semiconductor substrates 11 are necessarily separated from each other and arranged on the tray 21.

As an example, with regard to the interval between the single crystal semiconductor substrates 11, which is necessary when the side surfaces of each of the single crystal semiconductor substrates 11 are picked up and each of the single crystal semiconductor substrates 11 is placed in each of the depressed portions 22 of the tray 21 using the placing jig 23, 1 mm or larger is necessary for the thickness of the arm 23a (23b) of the placing jig 23 which touches the side surface of the wall 22a of each of the single crystal semiconductor substrates 11a, an extent of 1 mm or larger is necessary for one side of the clearance between the wall 22a of the depressed portion 22 and each of the single crystal semiconductor substrates 11, and 1 mm or larger is necessary for the width of the wall 22a between the depressed portions 22 which partition the single crystal semiconductor substrates 11a from each other.

Therefore, the plurality of single crystal semiconductor substrates 11 which are arranged in the depressed portions 22 of the tray 21 are separated at intervals of at least 5 mm or larger.

The depth of each of the depressed portions 22 (that is, the height of the wall 22a) is shallower than the thickness of each of the single crystal semiconductor substrates 11 and each of the oxide films 12 which is laminated on each of the single crystal semiconductor substrates 11, and thus the surface of each of the oxide films 12 is taken out from each of the depressed portions 22. The reason for this is that each of the single crystal semiconductor substrates 11 is bonded to the insulating substrate in a subsequent process.

It is preferable that a vacuum adsorption mechanism be arranged on the tray 21, and, in addition, the tray 21 be formed of a material which has medical fluid resistance (alkaline resistance). The reason for this is that, when the surface process is collectively performed on the plurality of substrates 10 which are arranged on the tray 21, there is a case in which SC1 cleaning or the like is performed, or spin drying, air-knife drying, or the like is performed instead of the plasma process in a subsequent process. That is, if the tray 21 has the alkaline resistance, it is possible to collectively perform a hydrophilization process on the surfaces of the substrates 10 using an alkaline chemical in a state in which the substrates 10 are placed on the tray 21.

It is possible to configure the tray 21 using a material of, for example, quartz, stainless steel, or the like. It is preferable that the tray 21 which has medical fluid resistance (alkaline resistance) be formed of a material such as Teflon (registered trademark), PFA (perfluoroalkoxy), or the like.

In this manner, in the process to place the single crystal semiconductor substrates 11, each of the single crystal semiconductor substrates 11 is arranged in such a way as to make the oxide film 12 which is laminated on each of the depressed portions 22 of the tray 21, in which the plurality of depressed portions 22 arranged to be separated from each other are formed, be an upper side.

In addition, as shown in FIG. 3(d), the insulating substrate 30 to bond the single crystal semiconductor substrates 11 is prepared.

As the insulating substrate 30, a glass substrate, a quartz substrate, or the like can be used. In the first embodiment, as an example, a mother glass substrate for liquid crystal display panels having a size of fourth generation, sixth generation, or eight generation is used. Since the insulating substrate 30 is bonded to the single crystal semiconductor substrates 11 through the oxide films 12, it is preferable that a planarization process be performed on surfaces, to which the oxide films 12 which are laminated on the single crystal semiconductor substrates 11 are bonded, by performing Chemical Mechanical Polishing (CMP).

<Bonding Process>

Subsequently, each process to bond the single crystal semiconductor substrates to the insulating substrate will be described with reference to FIG. 4.

Figure 4:
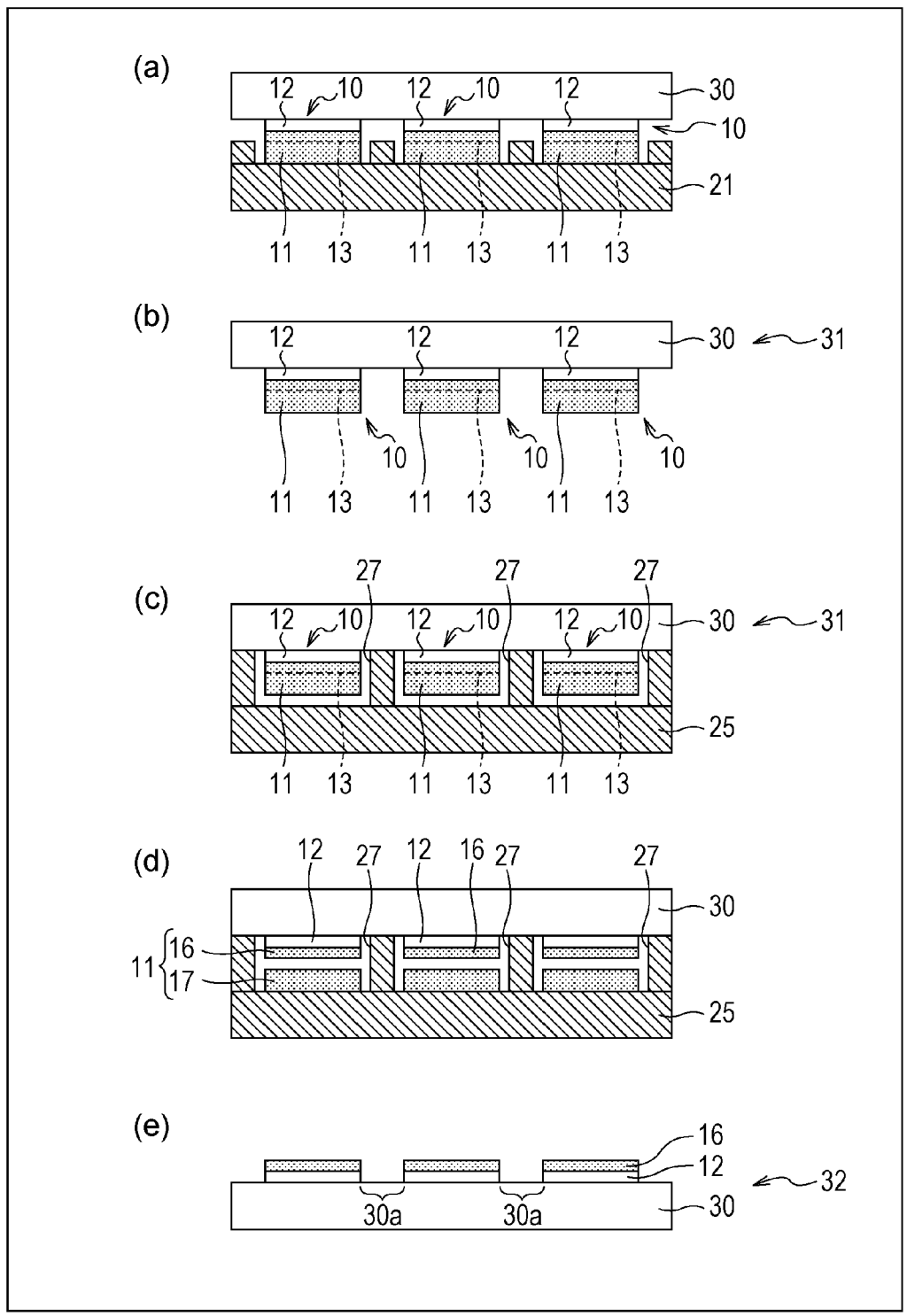
FIG. 4 is a view illustrating each process to bond the single crystal semiconductor substrates to the insulating substrate in the process to manufacture the semiconductor substrate according to the present invention.
Figure 5:
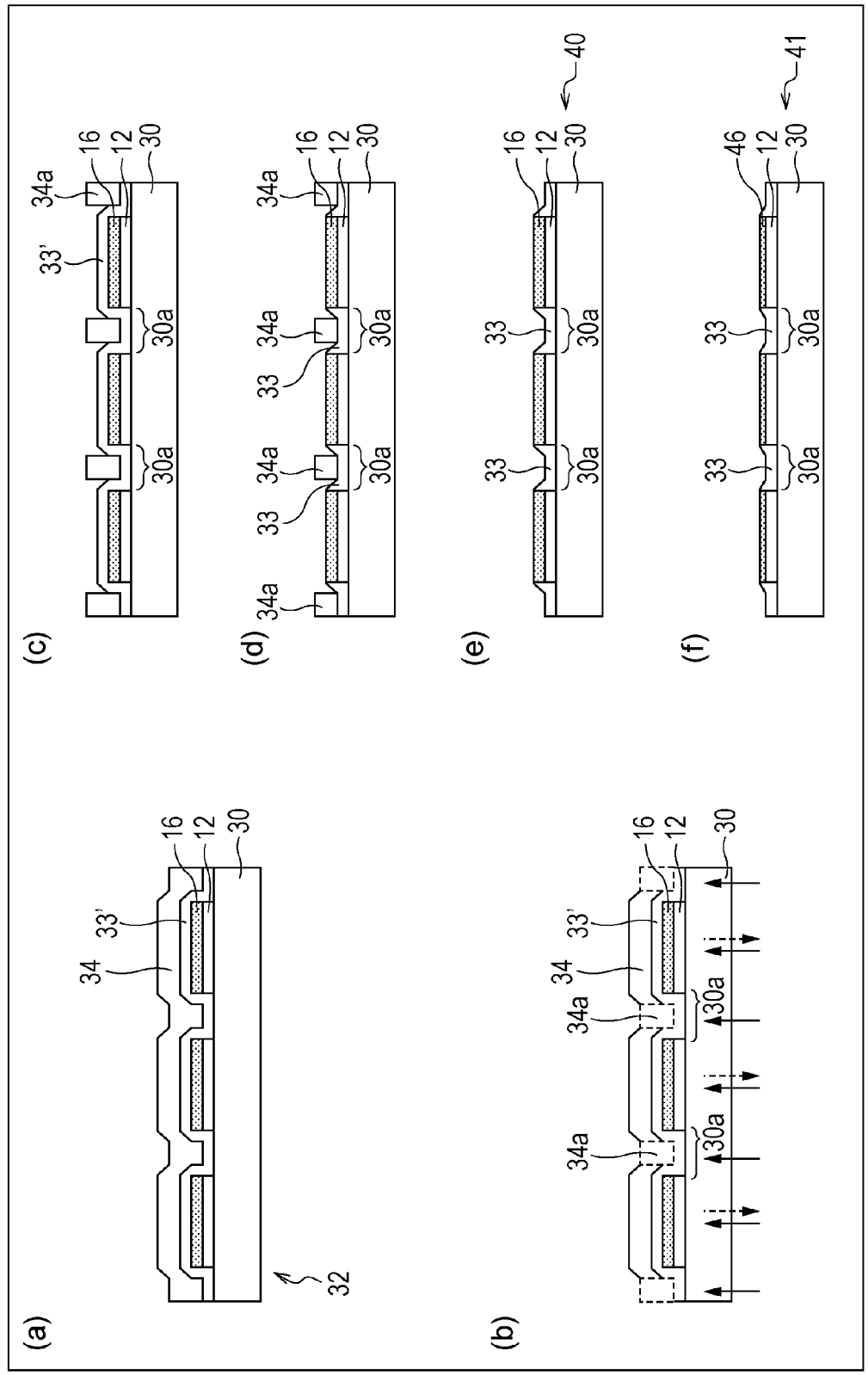
FIG. 5 is a view illustrating a process to form a conductive film and each process to thin semiconductor thin films in the process to manufacture the semiconductor substrate according to the present invention.

FIG. 4 is a view illustrating each process to bond the single crystal semiconductor substrates to the insulating substrate.

As shown in FIG. 4(a), in the bonding process, the plurality of single crystal semiconductor substrates 11 which are placed on the tray 21 are bonded to the insulating substrate 30 which is prepared in advance. That is, in the bonding process, the surfaces of the oxide films 12 which are laminated on the plurality of single crystal semiconductor substrates 11 are bonded to the insulating substrate 30. In this way, in the bonding process, the plurality of single crystal semiconductor substrates 11 are bonded to the insulating substrate 30 such that the plurality of single crystal semiconductor substrates 11 are separated from each other.

In the surface process and bonding process which are performed on the oxide films 12 and the insulating substrate 30, it is possible to use a generally used Smart-Cut (registered trademark) method.

That is, the plasma process or the chemical process is performed on the surfaces of the plurality of substrates 10 which are placed on the tray 21 (that is, the surfaces of the oxide films 12) and the surface of the insulating substrate 30, thereby causing each of the surfaces to be hydrophilized.

Therefore, it is preferable that the tray 21 have alkali resistance. Therefore, it is possible to perform a hydrophilization process using an alkaline chemical, such as SC1 cleaning or the like.

When the plasma process is performed, it is possible to use Ar plasma, atmospheric pressure plasma, or the like. In addition, a chemical process, such as ozone water cleaning, SC1 cleaning, or the like may be performed on the surfaces of the substrates 10 and the surface of the insulating substrate 30 for an extent of a few minutes, and the hydrophilization process may be performed on each of the surfaces.

If the substrates 10 and the insulating substrate 30 are bonded to face each other in a state in which the substrates 10 are placed on the tray 21, the substrate 10 and the insulating substrate 30 are bonded due to van der Waals attraction. In this manner, the single crystal semiconductor substrates 11 are bonded to the insulating substrate 30 via the oxide films 12.

After the substrates 10 and the insulating substrate 30 are bonded, a pre-anneal process is performed at 200° C. for an extent of two hours, and thus a dehydration reaction progresses on the interface between the substrates 10 and the insulating substrate 30, covalent bonding being formed, thereby reinforcing the bonding.

In this manner, in the bonding process, since each of the plurality of single crystal semiconductor substrates 11 which are arranged on each of the depressed portions 22 and the insulating substrate 30 are bonded collectively, it is possible to reduce the time that is taken for alignment or bonding, compared to a case in which the plurality of single crystal semiconductor substrates 11 are individually bonded to the insulating substrate 30.

Meanwhile, the surface process which causes the surfaces of the substrates 10 to be hydrophilized may be performed in a stage before the substrates 10 are placed on the tray 21, that is, between the above-described process to form the fragile layers and the process to place the single crystal semiconductor substrates 11.

As shown in FIG. 4(b), in a process to reprint the single crystal semiconductor substrates 11, the tray 21 on which the plurality of single crystal semiconductor substrates 11 bonded to the insulating substrate 30 are placed is removed. Therefore, the plurality of single crystal semiconductor substrates 11 which are placed on the tray 21 are reprinted on the insulating substrate 30, and thus a bonded substrate 31 is acquired.

As described above, since the plurality of single crystal semiconductor substrates 11 are separated from each other and placed on the tray 21, the plurality of single crystal semiconductor substrates 11 which are reprinted on the insulating substrate 30 are also arranged on the insulating substrate 30 to be separated from each other.

As shown in FIG. 4(c), in a process to place the bonded substrate 31 on the tray 25, the bonded substrate 31 is placed on the tray 25 which is provided on the lower side of the bonded substrate 31.

The tray 25 includes depressed portions 27 which are formed to be able to store the plurality of single crystal semiconductor substrates 11. The depths of the depressed portions 27 which are included in the tray 25 are different from the depths of the depressed portions 22 of the tray 21.

In the process to place the bonded substrate on the tray, the tray 25 which includes the depressed portions 27 is arranged on the lower side of the insulating substrate 30 to which the plurality of single crystal semiconductor substrates 11 are bonded, and thus the plurality of single crystal semiconductor substrates 11 are stored in the depressed portions 27.

The size of each of the depressed portions 27 of the tray 25 is one size larger than the size of each of the substrates 10, and the depth of each of the depressed portions 27 is formed to be deeper than the thickness of each of the substrates 10, that is, the thickness of each of the single crystal semiconductor substrates 11 and the thickness of each of the oxide films 12. Therefore, each of the substrates 10 which includes the single crystal semiconductor substrates 11 and the oxide films 12 is stored in each of the depressed portions 27 of the tray 25.

In this manner, the reason that the substrate 10 is stored in the depressed portion 27 of the tray 25 is to drop a semiconductor layer which is separated in a subsequent heat treatment to the depressed portion 27 of the tray 25 and recover the semiconductor layer.

Meanwhile, the tray 25 may not be necessarily located on the lower side of the bonded substrate 31. For example, in such a way that the plurality of substrates 10 are arranged on the upper side of the insulating substrate 30 as in PTL 8, the direction of the bonded substrate 31 may be changed, and, in addition, the tray 25 may be placed on the bonded substrate 31 such that the substrate 10 is covered with the depressed portions 27. That is, a configuration in which FIG. 4(c) is vertically turned over may be used.

Since a high temperature heat treatment is performed in a subsequent process, it is preferable that the material of the tray 25 be quartz. If the tray 25 is formed of quartz, even when a heat of comparatively high temperature of 600° C. or higher is applied to the tray 25 in a case of separation performed by applying heat, it is possible to prevent the tray 25 from being deformed.

In addition, since it is difficult to perform minute processing on quartz, an extent of several mm are necessary for the width of the wall 27a which separates the depressed portion 27 of the tray 25 and an adjacent depressed portion 27. For this reason, it is inevitably necessary that the plurality of substrates 10 be bonded to the insulating substrate 30 with intervals therebetween.

Meanwhile, the tray 25 may not necessarily have the above configuration. For example, although not shown in the drawing, a poking-up pin which can move up and down may be arranged on the bottom surface of each of the depressed portions 27 of the tray 25, and a separated part of each of the single crystal semiconductor substrates of the single crystal semiconductor substrates 11 due to the heat treatment may drop on the poking-up pin and may be recovered.

As shown in FIG. 4(d), in a semiconductor layer separation process, the part of each of the single crystal semiconductor substrates 11 is separated along each of the fragile layers 13 by heating each of the single crystal semiconductor substrates 11 which is stored in each of the depressed portions 27.

In the heat treatment, a heat at an extent of 500 to 700° C. is applied to the bonded substrate 31. Therefore, minute holes which are formed in each of the fragile layers 13 expand in each of the single crystal semiconductor substrates 11, and thus cracks are generated. In addition, each of the single crystal semiconductor substrates 11 is separated along each of the fragile layers 13.

Therefore, in the single crystal semiconductor substrates 11, the semiconductor thin films 16, each having a film thickness of 50 to 200 nm, are transferred to the insulating substrate 30. That is, the oxide films 12 and the semiconductor thin films 16 which are formed on the upper layers of the single crystal semiconductor substrates 11 are transferred to the insulating substrate 30.

On the other hand, in the single crystal semiconductor substrates 11 which are separated from the fragile layer 13, the single crystal semiconductor substrates 17 on a side which is different from a side of the semiconductor thin films 16 (substrate side portion of the substrate 10) are arranged on the lower sides of the semiconductor thin films 16, and thus the single crystal semiconductor substrates 17 respectively drop to the bottom surfaces in the depressed portions 27 of the tray 25 due to gravity. In addition, when the tray 25 is removed from the insulating substrate 30, the single crystal semiconductor substrates 17 acquired through separation are recovered.

Since the single crystal semiconductor substrates 17 acquired through separation are stored and recovered in the respective depressed portions 27 one by one, there is not a case in which the single crystal semiconductor substrates 17 come into contact with or damage their transferred semiconductor thin films 16 or adjacent semiconductor thin films 16 in such a way that the single crystal semiconductor substrates 17 move or are deviated after the division is performed, and thus it is possible to acquire the semiconductor substrate 40 which has few holes or scratches and has excellent yield.

If the tray 25 is removed, the insulating substrate 30 to which the semiconductor thin films 16 are reprinted is vertically turned over. That is, the direction of the insulating substrate 30 is turned over in the direction in which the semiconductor thin films 16 are laminated on the upper side of the insulating substrate 30. In addition, the insulating substrate 30 to which the semiconductor thin films 16 are reprinted is transmitted to a subsequent process.

As shown in FIG. 4(e), in a peripheral removing process, the peripheral portions of the semiconductor thin films 16 which are reprinted to the insulating substrate 30 are removed as necessary. The peripheral portions of the semiconductor thin films 16 which are reprinted on the insulating substrate 30 (an extent of several tens to several hundreds of μm from an end) have weak adhesion due to the edge roll off performed on the semiconductor thin films 16. Therefore, as necessary, the peripheral portions of the semiconductor thin films 16 which are reprinted to the insulating substrate 30 are removed in advance by performing photolithography and etching.

Therefore, the quite small areas of the semiconductor thin films 16 are reduced.

Subsequently, in a surface planarization process, a laser process is performed on the surfaces of the semiconductor thin films 16 which are separated from the fragile layers 13. If the laser process is performed on the surfaces of the semiconductor thin films 16, it is possible to recover from the damage which is applied to the semiconductor thin films 16 because hydrogen ions are injected in the fragile layer forming process.

With regard to a laser, for example, a XeCl excimer laser which has a wavelength of 308 nm can be used. An irradiation energy density is appropriately adjusted based on the film thickness of the transferred semiconductor thin films 16. As an example, when the film thickness of each of the semiconductor layers 16 is at an extent of 130 nm, the irradiation energy density is at an extent of 400 to 700 mJ/cm$^2$.

Therefore, the semiconductor substrate 32, on which the plurality of semiconductor thin films 16 are separated from each other and arranged, is formed on the insulating substrate 30. That is, each of the spaces 30a is provided between the plurality of semiconductor thin films 16 which are arranged on the semiconductor substrate 32.

Meanwhile, the peripheral removing and the laser process are not necessarily required, and may be performed as necessary.

In addition, the peripheral removing and the laser process may be performed after an etch-back process (FIG. 5(f)) which is a post process which will be described later.

Further, the peripheral removing may be performed by removing the peripheries in the single crystal semiconductor substrates 11 after the fragile layer forming process (FIG. 3(b)), which is a stage before the bonding, is performed.

Subsequently, a conductive film forming process and each process to thin the plurality of semiconductor thin films 16 which are arranged on the insulating substrate 30 will be described with reference to FIG. 5.

FIGS. 5(a) to 5(f) are views illustrating the conductive film forming process and each process to thin the semiconductor thin films 16.

As shown in FIG. 5(a), in the conductive film forming process, a conductive film (a film formed of a conductive material) 33' which is formed of a conductive material and which becomes the conductive film 33 is formed on the whole surface of the semiconductor substrate 32. As will be described later, the conductive film 33 is formed by patterning the conductive film 33'.

That is, in the insulating substrate 30, the conductive film 33' is formed between the plurality of semiconductor thin films 16, which are bonded to be separated from each other, and on the semiconductor thin films 16.

It is possible to use a semiconductor, such as a-Si (amorphous silicon), poly-Si (poly silicon), or the like, a transparent conductive film, such as ITO or the like, a metal material, such as Ta, W, Mo, Ti, Al, Cr, or the like, a conductive resist, or the like as the conductive film 33' which becomes the conductive film 33.

When the semiconductor, such as a-Si (amorphous silicon), poly-Si (poly silicon), or the like, is used as the conductive film 33', it is possible to form the conductive film 33' by performing n-type or p-type doping in such a way as to add dopant gas, such as $B_2H_6$, $AsH_3$, $PH_3$, or the like, to silane gas, such as $SiH_4$ or the like, using, for example, a Chemical Vapor Deposition (CVD) method or a Low Pressure CVD (LPCVD) method.

When a transparent conductive film, such as ITO or the like, or a metal material is used as the conductive film 33', it is possible to form the conductive film 33' by using, for example, a sputtering method.

When a conductive resist is used as the conductive film 33', it is possible to apply the conductive film 33' by using a spin coater or a slit coater.

Here, in a post process (FIG. 5(b)), if the reflectance of the conductive film 33' is high when a back exposure is performed, it is difficult to perform the back exposure. Therefore, it is preferable that the reflectance of the conductive film 33' be lower than the reflectance of the semiconductor thin films 16. Further, it is preferable that the conductive film 33' be formed of a transparent material in order to perform the back exposure. It is preferable that a transparent conductive film, such as a-Si, poly-Si, ITO, or the like, be used for the conductive film 33' as a material which has lower reflectance than the semiconductor thin films 16.

Therefore, it is possible to pattern the spaces 30a between the semiconductor thin films 16 and the resist 34 which is formed on the upper side of the semiconductor thin film 16 using the back exposure.

It is possible to determine the film thickness of the conductive film 33' by considering a selection ratio of etching gas, used when the etch-back process (FIG. 5(f)) which will be described later is performed, to the semiconductor thin films 16.

In the first embodiment, the semiconductor thin films 16 are formed of Si (silicon).

For example, when a-Si is used as the conductive film 33', the selection ratio with Si is approximately 1. Therefore, the film thickness of the conductive film 33' is to the extent of 50 to 200 nm.

In addition, when the metal material is used as the conductive film 33', the selection ratio with Si is high. Therefore, the conductive film 33 may have a film thickness to the extent of several nm to several tens nm.

Subsequently, in a resist applying process, the resist 34 is applied to the conductive film 33' using the spin coater or the slit coater.

When the back exposure is performed in a subsequent process, a negative resist is applied to the conductive film 33' as the resist 34. In addition, when exposure is performed from a normal surface in a subsequent process, a positive resist is applied to the conductive film 33' in order to form the film of the resist 34.

As shown in FIG. 5(b), in a resist exposure process, the resist 34 which is applied to the conductive film 33' is exposed. Here, a case in which the back exposure is performed from the rear surface of the insulating substrate 30 will be described.

The resist 34, which is arranged in the spaces 30a between the semiconductor thin films 16, is exposed from the rear surface of the insulating substrate 30 by self-alignment while the semiconductor thin films 16 are used as masks.

Since the silicon which configures each of the semiconductor layers 16 has high reflectance, ultraviolet light which is radiated from the rear surface sides of the semiconductor layers 16 is reflected onto the semiconductor thin films 16, and thus the resist 34 which is formed on the upper layers of the semiconductor films 16 is not exposed.

On the other hand, the conductive film 33' which is arranged in the spaces 30a is formed of, for example, a material, such as a-Si, ITO, or the like, which has lower reflectance than the reflectance of the semiconductor thin films 16, and thus the resist 34 on the conductive film 33' which is arranged in the spaces 30a is exposed, and becomes the exposed resist 34a.

Subsequently, as shown in FIG. 5(c), in a developing process, the resist 34 which is on the semiconductor thin films 16 and which is not exposed is removed by developing the resist 34 on which the exposed resist 34a is formed by performing the back exposure, and thus it is possible to cause the exposed resist 34a to remain in the spaces 30a between the semiconductor thin films 16.

In this way, in order to form the conductive film 33 between the semiconductor thin films 16, the resist 34 which is applied between the semiconductor thin films 16 and on the upper sides of the semiconductor thin films 16 is patterned by the self-alignment using the back exposure. In this manner, since the back exposure is used in order to pattern the resist 34, a mask used to pattern the resist 34 is not necessary, and it is possible to reduce the manufacturing costs.

In addition, since the resist 34 is patterned using the self-alignment, it is not necessary to perform high-precision alignment on the mask and the substrate when a large-sized glass substrate is exposed, and it is possible to extract a desired pattern. Therefore, since high-precision and expensive exposure equipment is not necessary, it is possible to suppress the manufacturing costs.

In addition, when the positive resist is applied to the conductive film 33', exposure is performed from a surface side instead of the back exposure in the resist exposure process in FIG. 5(b). In this case, a mask is necessary to form an exposure portion and a non-exposure portion in the resist 34. In addition, the resist 34 on the semiconductor thin films 16, on which the surface exposure is performed, is developed in a subsequent developing process, and thus it is possible to form the pattern of the resist 34a in the spaces 30a in the same manner.

As shown in FIG. 5(d), in a conductive film etching process, in the conductive film 33' in which the resist 34a is formed (patterned) on the upper layer thereof, the conductive film 33' which is on the semiconductor thin films 16 is removed by performing etching. Therefore, the conductive film 33 is formed between the plurality of semiconductor thin films 16. When etching is performed on the conductive film 33' which is on the semiconductor thin films 16, it is preferable to perform dry etching by using any one of $ClF_3$, $BrF_2$, $F_2$, $CF_4$, or $XeF_2$ as etching gas. As necessary, gas, such as $O_2$, Ar, or the like, may be used by combination thereof. In addition, wet etching may be combined as necessary.

Here, when the conductive resist is used for the conductive film 33', the above-described resist 34 is not necessary, and thus it is possible to pattern the conductive film 33' in the exposure process (FIG. 5(b)) and the developing process (FIG. 5(c)) instead of the resist 34. That is, it is possible to form the conductive film 33 by removing the conductive film 33' on the semiconductor thin films 16 and causing the conductive film 33' to remain in the spaces 30a.

Therefore, when the conductive resist is used for the conductive film 33', it is not necessary to apply the resist 34. Therefore, it is possible to omit the conductive film etching process (FIG. 5(d)) and a resist peeling process (FIG. 5(e)) which will be described later. Therefore, since it is possible to reduce the number of processes, it is possible to increase productivity (throughput).

As shown in FIG. 5(e), in the resist peeling process, the resist 34a which is formed on the conductive film 33 of the space 30a is peeled off by performing asking, peeling and cleaning, and thus it is possible to acquire the semiconductor substrate 40 in which the plurality of semiconductor thin films 16 are arranged on the insulating substrate 30 to be separated from each other and in which the conductive film 33 is arranged between the semiconductor thin films 16.

As described with reference to FIGS. 5(a) to 5(e), the conductive film forming process, the resist exposure process, the developing process, the conductive film etching process, and the resist peeling process are included in the process to form the conductive film 33 between the plurality of semiconductor thin films 16.

As shown in FIG. 5(f), in the etch-back process, in order to adjust (thin) the semiconductor thin films 16 which are formed in the semiconductor substrate 40 to have a desired film thickness, a dry etching process using plasma is performed on the acquired semiconductor substrate 40. Therefore, the semiconductor layers 16 are thinned, and semiconductor thin films 46 which are thinned to a desired film thickness are acquired.

That is, it is possible to acquire the semiconductor substrate 41 in which the thinned semiconductor thin films 46 are arranged on the insulating substrate 30 to be separated from each other and in which the conductive film 33 is arranged between the semiconductor thin films 46 by performing the etch-back process on the semiconductor substrate 40.

The semiconductor substrate 40 which is acquired before the etch-back process is performed includes the conductive film 33 formed between the semiconductor thin films 16. In particular, the semiconductor thin films 16 are connected using the conductive film 33, and the insulating substrate 30 is completely covered by the conductive film 33 and the semiconductor thin films 16 such that the surface of the insulating substrate 30 is not exposed. Therefore, potential difference in-plane distribution does not occur in the semiconductor substrate 40, and, electric field convergence does not occur in the peripheral portions of the semiconductor thin films 16 when the dry etching process is performed. Therefore, it is possible to realize uniform etching in plane of the semiconductor substrate 40.

As a result, an area in which panels can be formed (an area in which the film thickness of the semiconductor thin films 46 is uniform) is sufficiently secured, and thus it is possible to acquire the semiconductor substrate 41 which includes the thinned semiconductor thin films 46. Therefore, the obtainment efficiency of the panel increases, and thus it is possible to realize the increase in yield and reduction in costs.

Subsequently, in particular, although not shown in the drawing, a TFT forming process is performed using the acquired semiconductor substrate 41. In the TFT forming process, a TFT may be formed on the semiconductor substrate 41 based on a general TFT forming process of a general poly-Si or the like (islanding semiconductor thin films→forming a gate insulating film→forming gate electrodes→forming LDD regions→injecting source/drain ions→interlayer deposition→activation→forming contact holes→forming metal lines).

Figure 17:
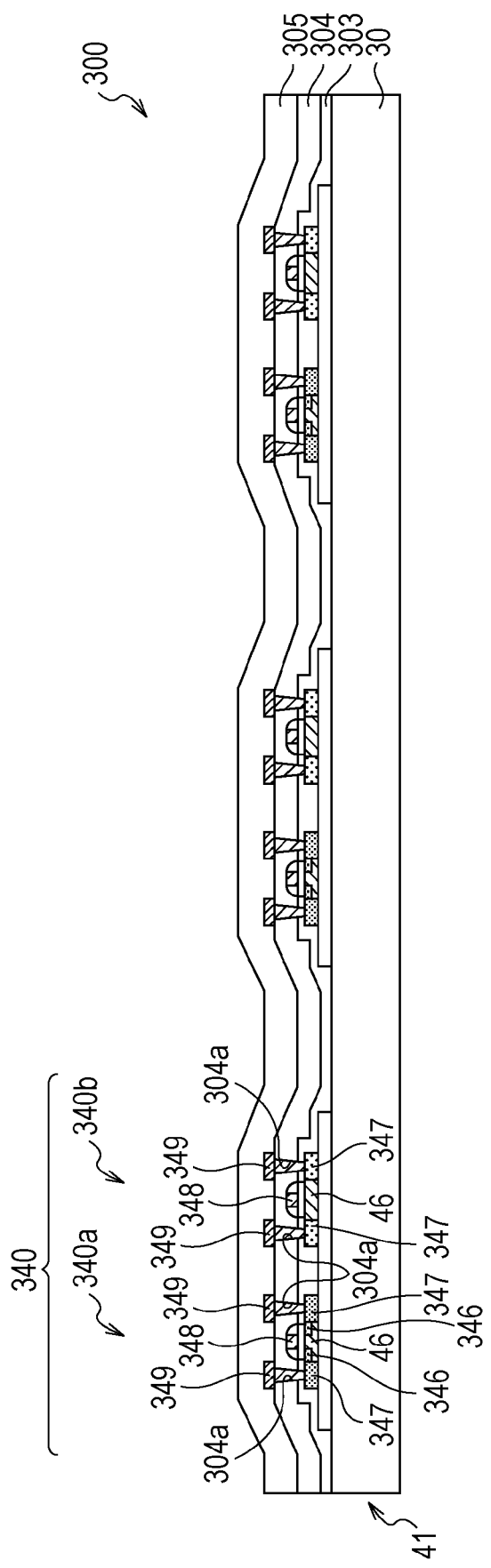
FIG. 17 is a cross-sectional view illustrating the configurations of a thin film transistor and a semiconductor circuit according to the present invention.

Therefore, it is possible to form an n-channel type TFT (nch-TFT) 340a and a p-channel type TFT (pch-TFT) 340b in which the semiconductor thin films 46 are n-type semiconductors, respectively, as shown in FIG. 17. Since the panels which are acquired from the semiconductor thin films 46 of the semiconductor substrate 41 have less fluctuation in the film thickness of the semiconductor thin films 46 in the panels, it is possible to acquire the TFTs 340a and 340b which have less fluctuation in TFT characteristics (threshold).
(First Main Advantage According to Semiconductor Substrates 40 and 41)

Subsequently, the main advantage of the above-described semiconductor substrates 40 and 41 will be described with reference to FIGS. 1(a) and 1(b), FIG. 6, and FIG. 7.

Figure 6:
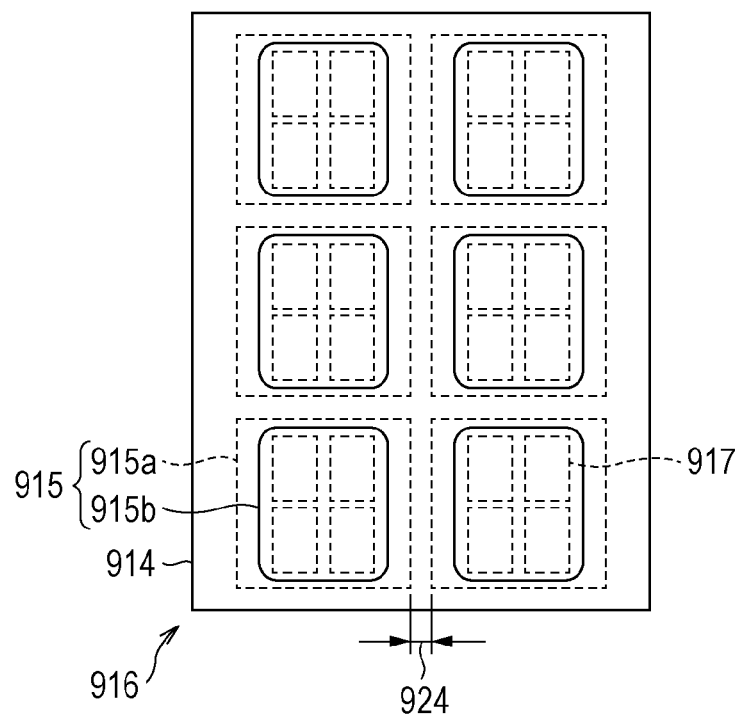
FIG. 6 is a plane view illustrating the configuration of a semiconductor substrate in the related art.
Figure 7:
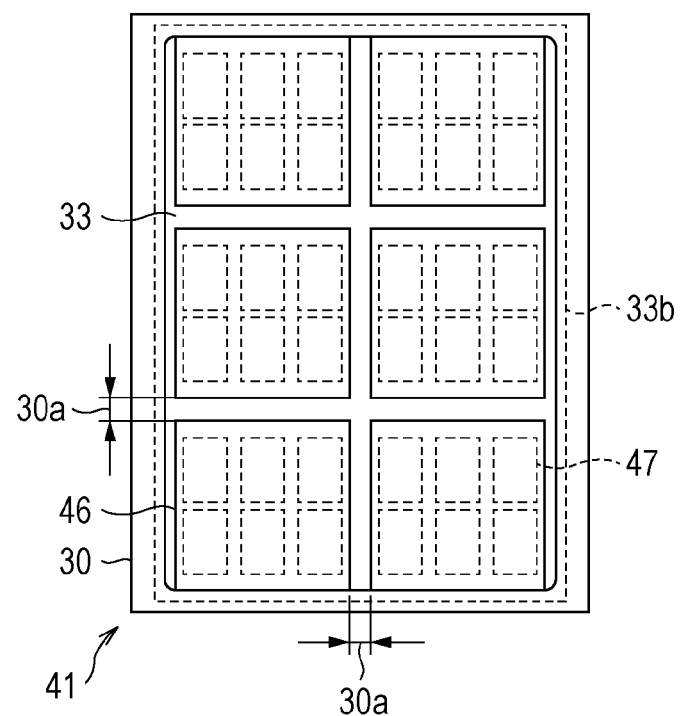
FIG. 7 is a plane view illustrating the configuration of the semiconductor substrate according to the present invention after the etch-back process is performed.

FIG. 6 is a plane view illustrating the configuration of a semiconductor substrate in the related art. FIG. 7 is a plane view illustrating the configuration of the semiconductor substrate acquired after the etch-back process according to the embodiment is performed.

As one main advantage of the above-described semiconductor substrates 40 and 41, it is possible to adduce the expansion of areas in which the panels 47 can be arranged (areas each having a uniform size) and the improvement effect of the panel obtainment efficiency by performing uniform etching in the semiconductor substrates 40 and 41.

When the conductive film 33 is not arranged between semiconductor thin films 915, the peripheral portions 915a of the semiconductor thin films 915 are thinned or caused to vanish when the etch-back is performed. Therefore, compared to the semiconductor thin films 915 acquired before the etch-back is performed, the area of the semiconductor thin film 915b, which is a region having uniform film thickness to the extent that the panels can be arranged after the etch-back is performed, becomes small or the number of panels 917 acquired from the semiconductor thin film 915b becomes small.

As a detailed example, before the etch-back process is performed, each of the semiconductor thin films 915 has an area to the extent that six pieces of panels 917 (36 pieces from a single semiconductor substrate 916) can be acquired from each of the single semiconductor thin films 915. However, after the etch-back process is performed, the film thickness of the peripheral portion 915a of each of the semiconductor thin films 915 is thinned, and each of the semiconductor thin films 915 has an area, to the extent that four pieces of panels 917 (24 pieces from the single semiconductor substrate 916) can be acquired from the single semiconductor thin film 915b, and thus the panel obtainment efficiency is bad.

On the other hand, the semiconductor substrate 40 has a configuration in which the spaces 30a between the semiconductor thin films 16 are filled with the conductive film 33 after the semiconductor thin films 16 are reprinted, and thus etching targets (that is, the semiconductor thin films 16 and the peripheries in the semiconductor thin films 16 including the spaces 30a between the semiconductor thin films 16, which are formed on the surface of the insulating substrate 30) are equipotential throughout the entire surface of the insulating substrate 30 which is a large-sized substrate.

In addition, if the semiconductor substrate 40 is formed, it is possible to realize uniform etching in plane in the dry etching process (the etch-back process to thin the semiconductor thin films 16) thereafter, and it is possible to form the semiconductor substrate 41 which sufficiently secures an area in which the panels 47 can be formed (an area of a region in which the film thickness of the semiconductor thin films 46 is uniform).

When each of the semiconductor thin films 16 has an area to the extent that six pieces of panels 47 can be acquired from the single semiconductor thin film 16 before the etch-back process is performed, it is possible to secure an area to the extent that six pieces of panels 47 (36 pieces from the single semiconductor substrate 41) can be acquired from the single semiconductor thin film 46 after the etch-back process is performed, and thus the panel obtainment efficiency is excellent.

In the semiconductor substrate 40, the conductive film 33 is arranged not only between the semiconductor thin films 16 but also in the surround of each of the semiconductor thin films 16.

If the etch-back process is performed on the semiconductor substrate 40, in the conductive film 33 which is formed on the insulating substrate 30, the peripheral portion 33b of the conductive film 33 which surrounds each of the semiconductor thin films 16 (a portion which is adjacent to the exposed portion of the insulating substrate 30) has thinned film thickness. However, the peripheries in the semiconductor thin films 16 are completely surrounded by the conductive film 33. Therefore, when the etch-back process is performed, it is possible to prevent electric fields from converging on the semiconductor thin films 16 in the vicinity of the peripheral portion 33b and it is possible to suppress that the peripheral portions of the semiconductor thin films 16 are thinned, and thus it is further possible to acquire the semiconductor thin films 46 which include an area having uniform film thickness.

In this manner, according to the semiconductor substrate 41, it is possible to prevent the obtainment efficiency of the panels 47, which are acquired from each of the semiconductor thin films 48, from being reduced, to prevent yield from lowering, and to realize cost reduction.
(Second Main Advantage According to Semiconductor Substrates 40 and 41)

As a second main advantage of the above-described semiconductor substrates 40 and 41, it is possible to adduce a TFT characteristic fluctuation-reducing effect by performing uniform etching in the semiconductor substrates 40 and 41.

In the semiconductor substrate 916a which has been described with reference to FIG. 16(a), the conductive film 33 is not arranged between the semiconductor thin films 915. Therefore, if the etch-back process is performed on the semiconductor substrate 916a, as shown in FIG. 16(b), it is possible to acquire the semiconductor substrate 916b in which the semiconductor thin films 915b, which have desired film thickness, and the peripheral portion 915a of the semiconductor thin film 915b, which is a section having film thickness thinner than the desired film thickness, are formed in the semiconductor thin film 915.

Therefore, if the TFT for driving pixels in the liquid crystal display panel is manufactured on the semiconductor substrate 916b on which the etch-back process is performed, the film thickness fluctuation of the semiconductor layer 915b and the peripheral portion 915a thereof is reflected, and thus the TFT characteristics (threshold) fluctuation of the manufactured TFT becomes large.

On the other hand, as shown in FIGS. 1(a) and 1(b), and FIG. 7, in the semiconductor substrates 40 and 41, even though the etch-back process is performed, it is possible to suppress the fluctuation in the film thickness of the acquired (etch-back process performed) semiconductor thin films 46. Therefore, it is possible to acquire the TFT for driving pixels in the liquid crystal display panel having less fluctuation in TFT characteristics (threshold) fluctuation from the semiconductor thin films 46. Therefore, it is possible to suppress circuit design margin being small, and thus it is possible to realize a high-speed and low-power consumption circuit.
(Third Main Advantage According to Semiconductor Substrates 40 and 41)

As a third main advantage of the above-described semiconductor substrates 40 and 41, the reduction in high mask costs and a point that it is possible to maximally secure an usable semiconductor thin film area by performing the back exposure can be adduced.

As described with reference to FIG. 5(b), in the resist exposure process, the resist 34 which is the negative resist is formed on the upper layer of the conductive film 33', and the back exposure is performed, and thus it is possible to form the conductive film 33 between the semiconductor thin films 16 without using a mask.

Therefore, it is possible to reduce expensive mask charges. In addition, since the resist 34 is exposed using the self-alignment, it is possible to form a desired pattern without requiring high-precision alignment of the mask and the substrate when a large-sized glass substrate is exposed. Therefore, since an exposure machine which includes a high-precision and expensive stage is not necessary, it is possible to suppress the manufacturing costs.

In addition, it is preferable to form a thin film transistor, a semiconductor circuit, a liquid crystal display apparatus, an electroluminescence (EL) apparatus, a wireless communication apparatus, and a light emitting apparatus using the semiconductor substrate 41 manufactured as described above.

Second Embodiment

Subsequently, a second embodiment of the present invention will be described with reference to FIG. 8(a) to FIGS. 12(a) and 12(b). Meanwhile, for convenience of description, the same reference numerals are used for members which have the same function as in the drawings described in the first embodiment, and the description thereof will not be repeated.

The semiconductor substrates 140 and 141 according to the embodiment are different from the semiconductor substrates 40 and 41 according to the first embodiment in that semiconductor thin films 16 and 46 are bonded to an insulating substrate 30 on which a conductive film 133 is patterned in advance so as to be manufactured.

(Process before Bonding to Insulating Substrate)

First, each process performed before a single crystal semiconductor substrate is bonded to an insulating substrate will be described with reference to FIGS. 8(a) to 8(d).

Figure 8:
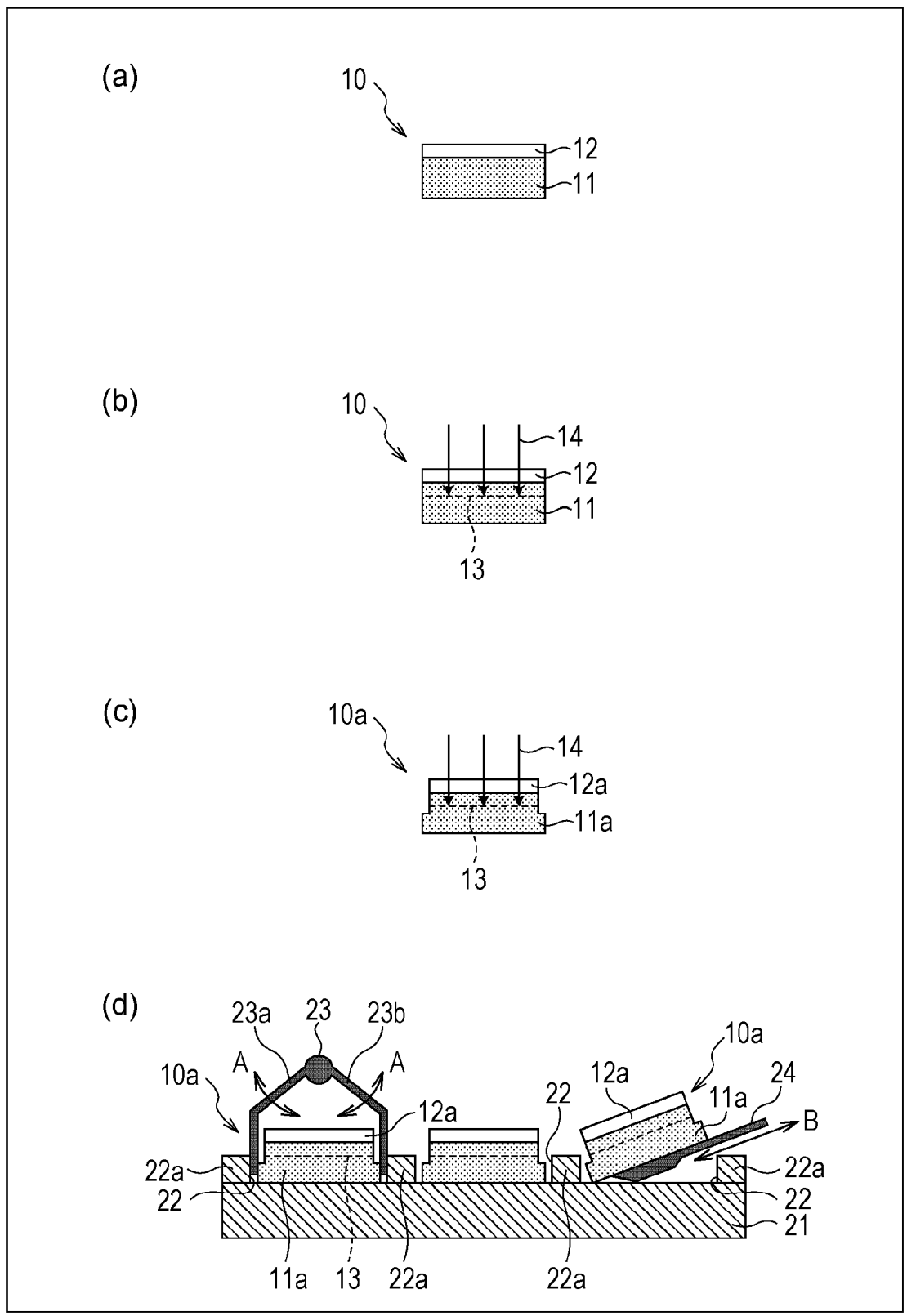
FIG. 8 is a view illustrating a process to manufacture single crystal semiconductor substrates and a process to place the single crystal semiconductor substrates on a tray in a process to manufacture a semiconductor substrate according to a second embodiment of the present invention.

FIG. 8 is a view illustrating a process to manufacture single crystal semiconductor substrates and a process to place the single crystal semiconductor substrates on a tray.

As shown in FIG. 8(a), in an oxide film forming process, first, an oxide film 12 is formed on the surface of the single crystal semiconductor substrate 11.

In the embodiment, single crystal silicon is used for the single crystal semiconductor substrate 11. When the silicon substrate is used for the single crystal semiconductor substrate 11, a thermal oxidation process is performed on the single crystal semiconductor substrate 11, acquired before an oxide film 12 is formed, in order to form the oxide film 12 on the surface of the single crystal semiconductor substrate 11.

In the thermal oxidation process, a general vertical furnace or horizontal furnace is used, and a temperature of 900 to 1000° C. is applied to the single crystal semiconductor substrate 11 (that is, the silicon substrate) acquired before the oxide film 12 is formed for 1 to 3 hours. Therefore, as a $SiO_2$ film which is laminated on the single crystal semiconductor substrate 11, the oxide film 12 is formed. In this way, it is possible to form a substrate 10 which includes the single crystal semiconductor substrate 11 and the oxide film 12. The oxide film 12 is formed on the surface of the single crystal semiconductor substrate 11 in a thickness of 50 to 100 nm.

When the single crystal semiconductor substrate 11 is formed of a semiconductor material other than the silicon, the substrate 10 may be formed by depositing the oxide film 12 ($SiO_2$ film) on the single crystal semiconductor substrate 11 using, for example, a Chemical Vapor Deposition (CVD) method.

Subsequently, as shown in FIG. 8(b), in a fragile layer forming process, a fragile layer 13 is formed on the single crystal semiconductor substrate 11 on which the oxide film 12 is laminated.

Ion beams 14 are radiated (hydrogen ion injection, hydrogen ion doping) from the side of the surface of the oxide film 12 to the single crystal semiconductor substrate 11 in which the oxide film 12 is formed on the surface thereof in the oxide film forming process. In this manner, the fragile layer 13 is formed inside the single crystal semiconductor substrate 11 in such a way that hydrogen ions are poured into a predetermined depth inside the single crystal semiconductor substrate 11.

For example, the fragile layer 13 is formed at a position in a depth of 50 to 200 nm from the interface between the oxide film 12 and the single crystal semiconductor substrate 11.

For example, when ion injection is performed on the single crystal semiconductor substrate 11 using $H^+$ ions, injection energy: 5 to 20 keV and injection amount: $1 \times 10^{16}/cm^2$ to $1 \times 10^{17}/cm^2$ are set as hydrogen ion injection (doping) conditions.

When ions, such as $H_3^+$ ions, are injected to the single crystal semiconductor substrate 11, ion injection is performed under the conditions of injection energy: 30 to 90 keV and injection amount: $1 \times 10^{16}/cm^2$ to $1 \times 10^{17}/cm^2$.

As shown in FIG. 8(c), in a peripheral portion removing process, a substrate 10a, which includes a single crystal semiconductor substrate 11a, from which the peripheral portion thereof is removed, and an oxide film 12a (insulating film), is acquired by removing the peripheral portion of the substrate 10 in which the fragile layer 13 is formed on the single crystal semiconductor substrate 11. It is possible to remove the peripheral portion of the substrate 10 by performing photolithography and etching.

In this manner, in the embodiment, it is preferable to remove the peripheral portions of the single crystal semiconductor substrate 11 and the oxide film 12 which have weak adhesion, before the single crystal semiconductor substrate 11 is bonded to the insulating substrate 30.

Here, as will be described later, in the embodiment, the single crystal semiconductor substrates 11a are bonded to the insulating substrate 30 on which a conductive film 133 is patterned in advance. Therefore, if the peripheral portions are removed after the semiconductor thin films which are formed from the single crystal semiconductor substrates 11a are bonded to the insulating substrate 30, the interval with adjacent conductive films 133 widens, and thus it should be prevented.

As shown in FIG. 8(d), in a process to place the single crystal semiconductor substrates 11a, the plurality of single crystal semiconductor substrates 11a, the peripheral portions of which are removed, are placed on a tray 21.

The tray 21 is the same as in the first embodiment. That is, a plurality of depressed portions 22 are formed in a matrix shape in the tray 21.

In addition, when a plurality of single crystal semiconductor substrates 11a are placed in the depressed portions 22, it is necessary to transfer the single crystal semiconductor substrates 11a without touching the surfaces of oxide films 12a (that is, the surface of the substrate 10a) which are laminated on the single crystal semiconductor substrates 11a. Therefore, in order to transfer the single crystal semiconductor substrates 11a, for example, a jig or the like, such as a placing jig 23 or a placing jig 24 shown in FIG. 8(d), is used.

For example, the plurality of single crystal semiconductor substrates 11a are placed in the respective depressed portions 22 by picking up the side surfaces of each of the single crystal semiconductor substrates 11a or dropping it using the placing jig 23.

In addition, the single crystal semiconductor substrates 11a are placed in the depressed portions 22 while inclining the single crystal semiconductor substrates 11a which are fixed by supporting and adsorbing the rear surfaces of the single crystal semiconductor substrates 11a (surfaces on the rear sides of the surfaces on which the oxide films 12a are formed) using, for example, the placing jig 24.

Meanwhile, each of the substrates 10a is placed on a poking-up pin which is arranged on the bottom surface of each of the depressed portions 22 of the tray 21 and which can move up and down. After each of the substrates 10a is placed, the placing jig 24 which releases the adsorption may be taken out in the horizontal direction. Thereafter, the poking-up pin drops and each of the substrates 10 falls into each of the depressed portions 22 of the tray 21.

Therefore, even when any method is used, the clearance space between the wall 22a of each of the depressed portions 22 and each of the single crystal semiconductor substrates 11a, and the wall 22a between the depressed portions 22 used to distinguish the single crystal semiconductor substrates 11a from each other are necessary.

In this manner, the plurality of single crystal semiconductor substrates 11a are inevitably arranged to be separated from each other on the tray 21.

As an example, with regard to the interval between the single crystal semiconductor substrates 11a, which is necessary when the side surfaces of each of the single crystal semiconductor substrates 11a are picked up and each of the single crystal semiconductor substrates 11a is placed in each of the depressed portions 22 of the tray 21 by the placing jig 23, 1 mm or larger is necessary for the thickness of the arm 23a (23b) of the placing jig 23 which touches the side surface of the wall 22a of each of the single crystal semiconductor substrates 11a, 1 mm or larger is necessary for one side of the clearance between the wall 22a of each of the depressed portions 22 and each of the single crystal semiconductor substrates 11a, and 1 mm or larger is necessary for the width of the wall 22a between the depressed portions 22 which distinguish the single crystal semiconductor substrates 11a from each other.

In this manner, when a plurality of semiconductor substrates are arranged on the tray, the plurality of semiconductor substrates are usually separated from each other at intervals of at least 5 mm or larger.

The depth of each of the depressed portions 22 (that is, the height of the wall 22a) is shallower than the thickness of each of the single crystal semiconductor substrates 11a and each of the oxide films 12a which is laminated on each of the single crystal semiconductor substrates 11a, and thus the surface of each of the oxide films 12a is taken out from each of the depressed portions 22. The reason for this is that each of the single crystal semiconductor substrates 11a is bonded to the insulating substrate in a subsequent process.

It is preferable that a vacuum adsorption mechanism be arranged on the tray 21, and, in addition, the tray 21 be formed of a material which has medical fluid resistance (alkaline resistance). The reason for this is that, when the surface process is collectively performed on the plurality of substrates 10 which are arranged on the tray 21, there is a case in which SC1 cleaning or the like is performed, or spin drying, air-knife drying, or the like is performed in a subsequent process.

(With Regard to Insulating Substrate)

Subsequently, a method for manufacturing an insulating substrate, to which the single crystal semiconductor substrates 11a are bonded, will be described with reference to FIGS. 9, 11, and 12.

Figure 9:
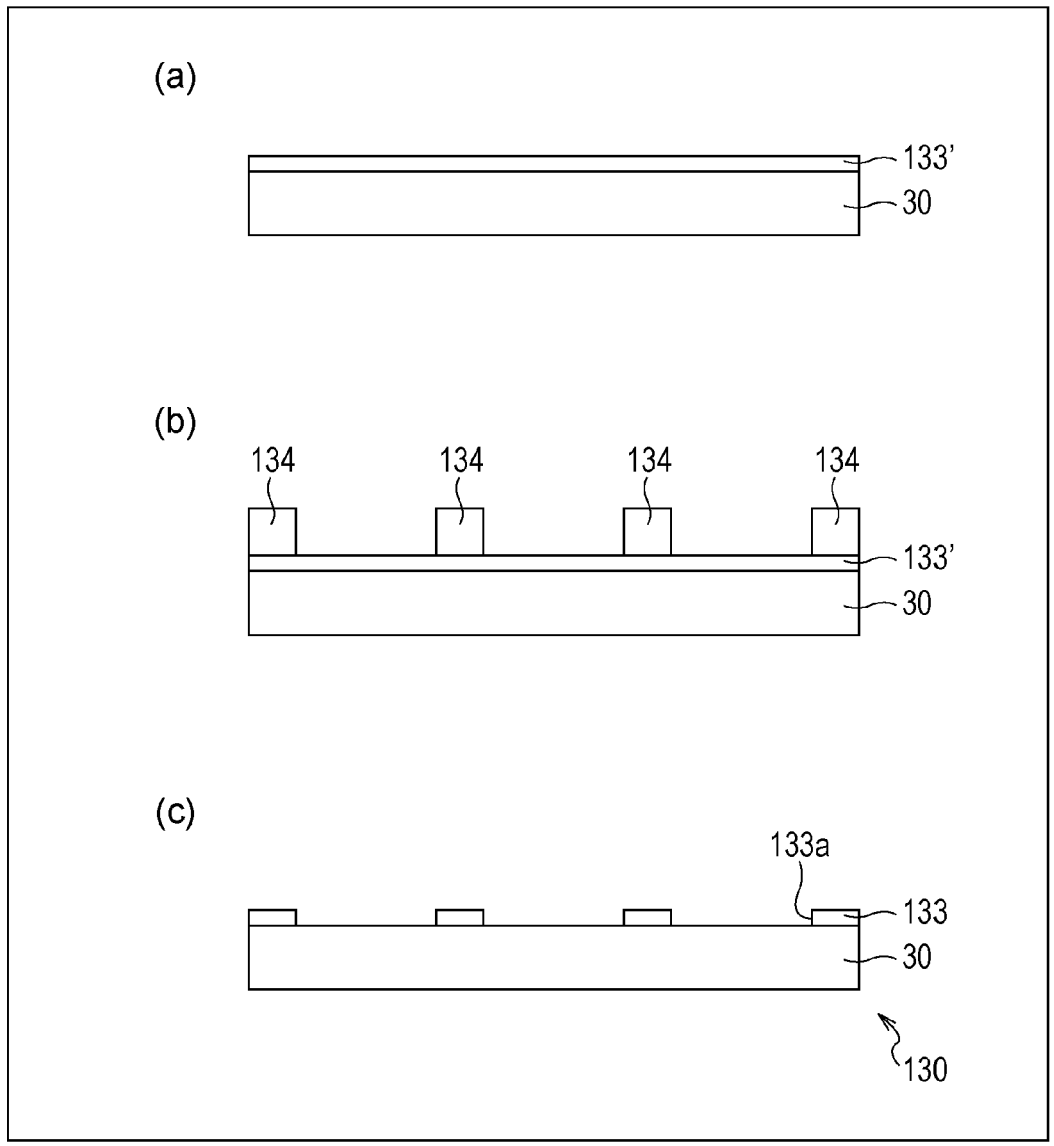
FIG. 9 is a view illustrating a method for manufacturing the insulating substrate, to which the single crystal semiconductor substrates are bonded, in the process to manufacture the semiconductor substrate according to the second embodiment of the present invention.

FIG. 9 is a view illustrating a method for manufacturing an insulating substrate, to which single crystal semiconductor substrates are bonded.

As shown in FIG. 9(a), in a conductive film forming process, a conductive film 133' formed of a conductive material (a film formed of a conductive material) which becomes the conductive film 133 is formed on the whole surface of the insulating substrate 30. As will be described later, opening sections are formed in the conductive film 133', and thus the conductive film 133 is formed.

It is possible to form the conductive film 133' in such a way that a semiconductor, such as a-Si, poly-Si, or the like, on which n-type or p-type doping is performed, is formed using a Chemical Vapor Deposition (CVD) method or a Low Pressure CVD (LPCVD) method, or that a transparent conductive film, such as ITO or the like, or a metal, such as Ta, W, Mo, Ti, Al, Cr, or the like, is formed using a sputtering method.

It is possible to determine the film thickness of the conductive film 133' taking into consideration the selection ratio of etching gas, used when an etch-back process (FIG. 10(f)) which will be described later is performed, with the semiconductor thin films 16.

For example, in a bonding process which will be described later in FIG. 10(a), when the area of a single crystal semiconductor substrate 11a which is bonded to the insulating substrate 30 is smaller than an opening section 133a provided in the conductive film 133 which is formed on the insulating substrate 30 in order to bond the single crystal semiconductor substrate 11a, the step of the conductive film 133 is of no concerned when bonding is performed.

Therefore, it is possible to form the conductive film 133' which has thick film thickness and has a small selection ratio with the material Si which configures the single crystal semiconductor substrate 11a of the substrate 10a. That is, it is possible to use a material, in which an etching rate acquired when the dry etching is performed is approximately the same as the etching rate with Si, for the conductive film 133'. As an example, as the conductive film 133, it is possible to form a-Si or poly-Si having the selection ratio with Si which is close to 1, that is, equal to or larger than 0.8 and equal to or less than 1.2 at a film thickness of approximately 50 to 200 nm.

In this manner, when a material, which has the selection ratio with the material which configures the single crystal semiconductor substrate 11a of the substrate 10a of equal to or larger than 0.8 and equal to or less than 1.2, is used as the conductive film 133', it is easy to control remaining film of the conductive film 133' in dry etching performed when etch-back which will be described later is performed, with the result that it is possible to use normal gas used to perform etching on the semiconductor thin films 16 without change even though gases are not complicatedly combined or dangerous gas is not used for prevention of the elimination of the conductive film 133' on the way, and thus it is possible to simplify the process or suppress manufacturing costs.

It is apparent that the conductive film 133' which has thin film thickness and a high selection ratio with Si may be formed.

On the other hand, although not shown in the drawing, when the area of the single crystal semiconductor substrate 11a which is bonded to the insulating substrate 30 is larger than the opening section 133a provided in the conductive film 133 which is formed on the insulating substrate 30 in order to bond the single crystal semiconductor substrate 11a, the peripheral portions of the single crystal semiconductor substrate 11a (that is, the peripheral portions of the substrate 10a) run over the step of the conductive film 133.

Therefore, if the step of the conductive film 133 is large, gaps are generated between the peripheral portion of the substrate 10a and the insulating substrate 30 (the corners of step), and thus regions which cannot be bonded are generated.

Further, when the step is extremely large, the repulsion force based on the warping of the substrate 10a is larger than the bonding force based on van der Waals attraction, and thus there is a case in which the entire substrate 10a cannot be bonded.

Therefore, in this case, in order that the substrate 10a is excellently bonded, it is necessary to cause the film thickness of the conductive film 133 to be extremely thin.

However, if the film thickness of the conductive film 133 is too thin, in an etch-back process (FIG. 10(f)) in a subsequent process, the etch-back is performed on the conductive film 133 and the conductive film 133 is eliminated before the semiconductor thin films 16a are thinned up to the semiconductor thin films 46a which have desired film thickness, and thus the base insulating substrate 30 is exposed during the etch-back.

Therefore, the insulated sections and the semiconductor layers are mixed on the surface of the insulating substrate 30, the peripheral portions of the semiconductor layers are greatly etched, and thus it is not possible to solve the problem to be solved.

Therefore, when the area of the single crystal semiconductor substrate 11a which is bonded to the insulating substrate 30 is larger than the opening section which is provided in the conductive film 133 formed on the insulating substrate 30 in order to bond the single crystal semiconductor substrate 11a, the conductive film 133 is formed by forming the conductive film 133' which is thin and which has a large selection ratio with Si, which is a material configuring the semiconductor thin films 16, when the etching (etch-back) is performed.

As the conductive film 133, it is possible to cause, for example, a metal thin film (Ar, Cr, or the like) having the selection ratio with Si which is equal to or larger than 10 and equal to or less than 50 to be formed to have extremely thin film thickness, that is, approximately several to several tens of nm.

Since the film thickness of the conductive film 133 is formed to be approximately several to several tens of nm, the conductive film is an extremely thin film. Therefore, although the substrates 10a run on the edge portions of the opening sections which are provided in the conductive film 133 when the substrates 10a are transferred, step is small (the film thickness of the conductive film 133 is thin), and thus only few regions which are not bonded remain and the substrates 10a are bonded to almost the whole surfaces of the opening sections. Therefore, it is possible to form the semiconductor substrates 140 and 141 which have high panel obtainment efficiency.

In addition, the selection ratio is equal to or larger than 10. Therefore, in an etching process in a subsequent process (FIG. 10(f)), even if the semiconductor thin films 16a are etched-back by approximately several tens to 100 nm, the conductive film 133 is etched back by approximately only several nm to 10 nm, and thus the conductive film 133, which is arranged between the semiconductor thin films 16a, remains between the semiconductor thin films 16a in the etch-back process. Therefore, in the semiconductor substrate 51 which will be described later, it is suppressed that the surface of the insulating substrate 30 is exposed, electric field convergence does not occur, and thus it is possible to realize uniform etching in plane.

Further, in the etching process, it is preferable to perform dry etching on the semiconductor thin films 16a using any one of $ClF_3$, $BrF_2$, $F_2$, $CF_4$, and $XeF_2$ as etching gas. Therefore, since it is possible to increase the selection ratio of the etching rate of the conductive film 133 to the semiconductor thin films 16a to 10 or greater (that is, it is possible to cause the etching rate of the conductive film 133 slow down by 10 times or greater, compared to the etching rate of the semiconductor thin films 16a), it is possible to form the conductive film 133 to have thin film thickness.

As shown in FIG. 9(b), in a resist patterning process, first, a resist is applied to the conductive film 133' which is formed on the surface of the insulating substrate 30, and photolithography is further performed.

Resist patterns 134 are formed by patterning the applied resist in a lattice shape such that positions on insulating substrate 30 to which the substrates 10a are bonded are open in advance. That is, the resist patterns 134 are formed on the regions of the conductive film 133' expect for the opening sections which are provided in the conductive film 133' in order to bond the single crystal semiconductor substrates 11a.

Normally, the sizes of the opening sections which are provided on the conductive film 133 in order to bond the single crystal semiconductor substrates 11a are one size larger than the single crystal semiconductor substrates 11a to be bonded such that step due to the conductive film 133 does not affect the bonding with the single crystal semiconductor substrates 11a.

However, as described above, depending on the kind or film thickness of the conductive film 133 to be used, the step of the conductive film 133 is less of an obstacle to the bonding with the single crystal semiconductor substrates 11a, and the conductive film 133 is not eliminated even when the etch-back process is performed, and thus it is possible to form the opening sections of the conductive film 133 to be one size smaller than the single crystal semiconductor substrates 11a.

As shown in FIG. 9(c), in a process to etch the conductive film 133', the resist patterns 134 on the conductive film 133' are used as masks, the opening section forming regions of the conductive film 133', which are provided to bond the single crystal semiconductor substrates 11a, are etched and removed by performing the dry etching, and patterning is performed in a lattice shape so as to expose the surface of the insulating substrate 30 which is located at the positions to which the single crystal semiconductor substrates 11a are bonded. Therefore, a bonding substrate 130, on which the conductive film 133 having the opening sections 133a used to bond the single crystal semiconductor substrates 11a is formed, is formed on the insulating substrate 30.

In this manner, the conductive film 133', which is on the regions to which the plurality of substrates 10a are bonded, is removed by performing the resist patterning process and the process to etch the conductive film 133 which are described with reference to FIGS. 9(b) and 9(C), and thus the insulating substrate 30 in the opening sections 133a is exposed, and, at the same time, the conductive film 133 is left and formed on the insulating substrate 30 in regions to which the substrates 10a are not bonded.

Figure 11:
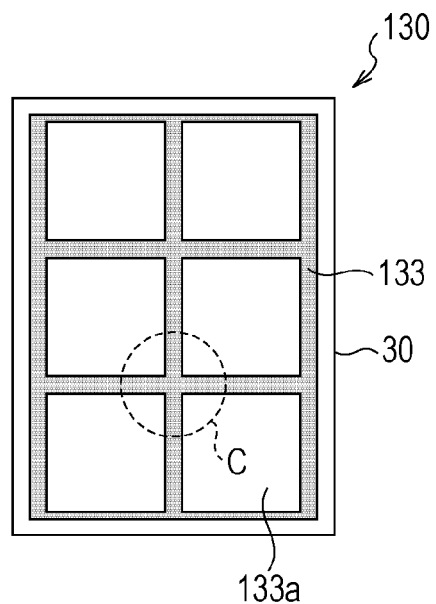
FIG. 11 is a plane view illustrating the insulating substrate of the semiconductor substrate according to the present invention.
Figure 12:
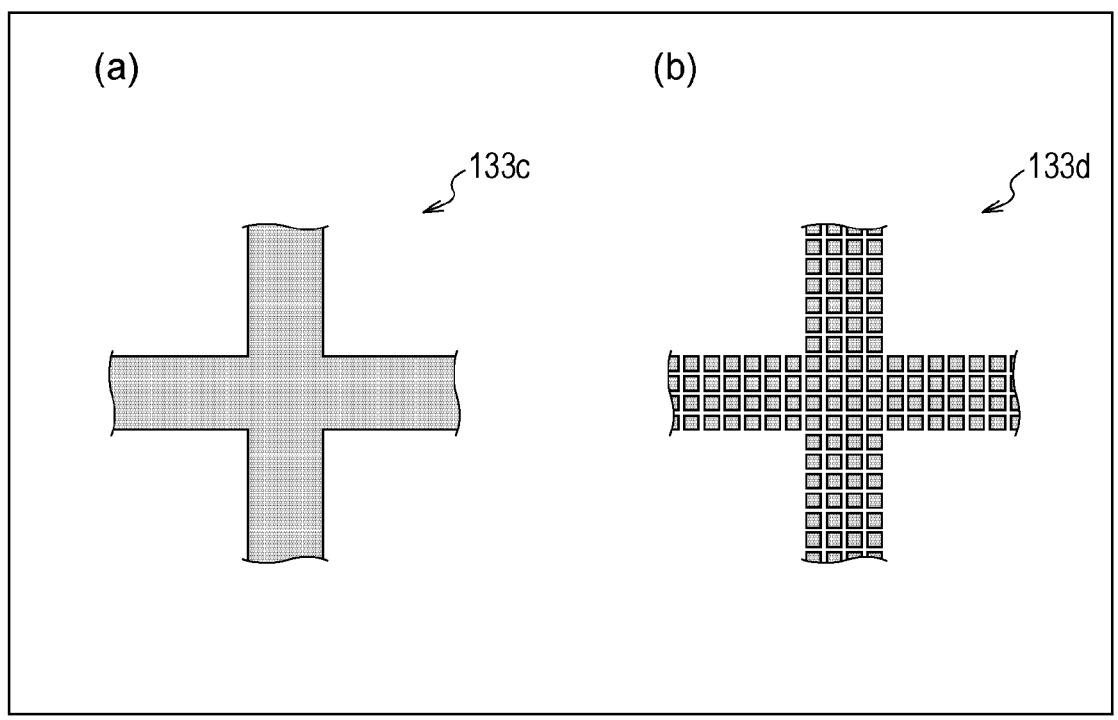
FIG. 12 is a view enlarging a region C in FIG. 11.

FIG. 11 is a plane view illustrating a bonding substrate 130.

In the bonding substrate 130, the conductive film 133, on which opening sections 133a are formed to bond the single crystal semiconductor substrates 11a to the insulating substrate 30 is formed. That is, when the bonding substrate 130 is viewed through a planar view, the conductive film 133 is arranged to surround the peripheries in the opening sections 133a.

FIGS. 12(a) and 12(b) are views in which a region C in FIG. 11 is enlarged, FIG. 12(a) shows a conductive film 133c which is formed of a beta film, and FIG. 12(b) shows a conductive film 133d which is formed in an island pattern.

The conductive film 133, which is formed in a lattice shape by forming the opening sections 133a, is generally formed of a beta film which is continuously connected, as shown in the conductive film 133c in FIG. 12(a).

However, the conductive film 133 may be intentionally formed using a group of small island patterns (island patterns), like the conductive film 133d shown in FIG. 12(b).

If the conductive film is formed using a group of the small island patterns like the conductive film 133d, the etching rate of the section of the conductive film 133d which is a tight pattern becomes yet slower due to a micro loading effect when an etch-back process in a subsequent process is performed.

Therefore, the selection ratio with Si becomes substantially large, and thus it is possible to further thin the film thickness of the conductive film 133' which is formed in the conductive film forming process (FIG. 9(a)).

Accordingly, even when the size of the single crystal semiconductor substrate 11a to be bonded is greater than the opening section 133a, it is possible to form the conductive film 133 with lower step. Therefore, when the single crystal semiconductor substrate 11a is bonded to the insulating substrate 30, it is possible to further decrease the occurrence of defective transfer due to step.

(Bonding Process)

Subsequently, each process to bond the single crystal semiconductor substrates to the insulating substrate will be described with reference to FIG. 10.

Figure 10:
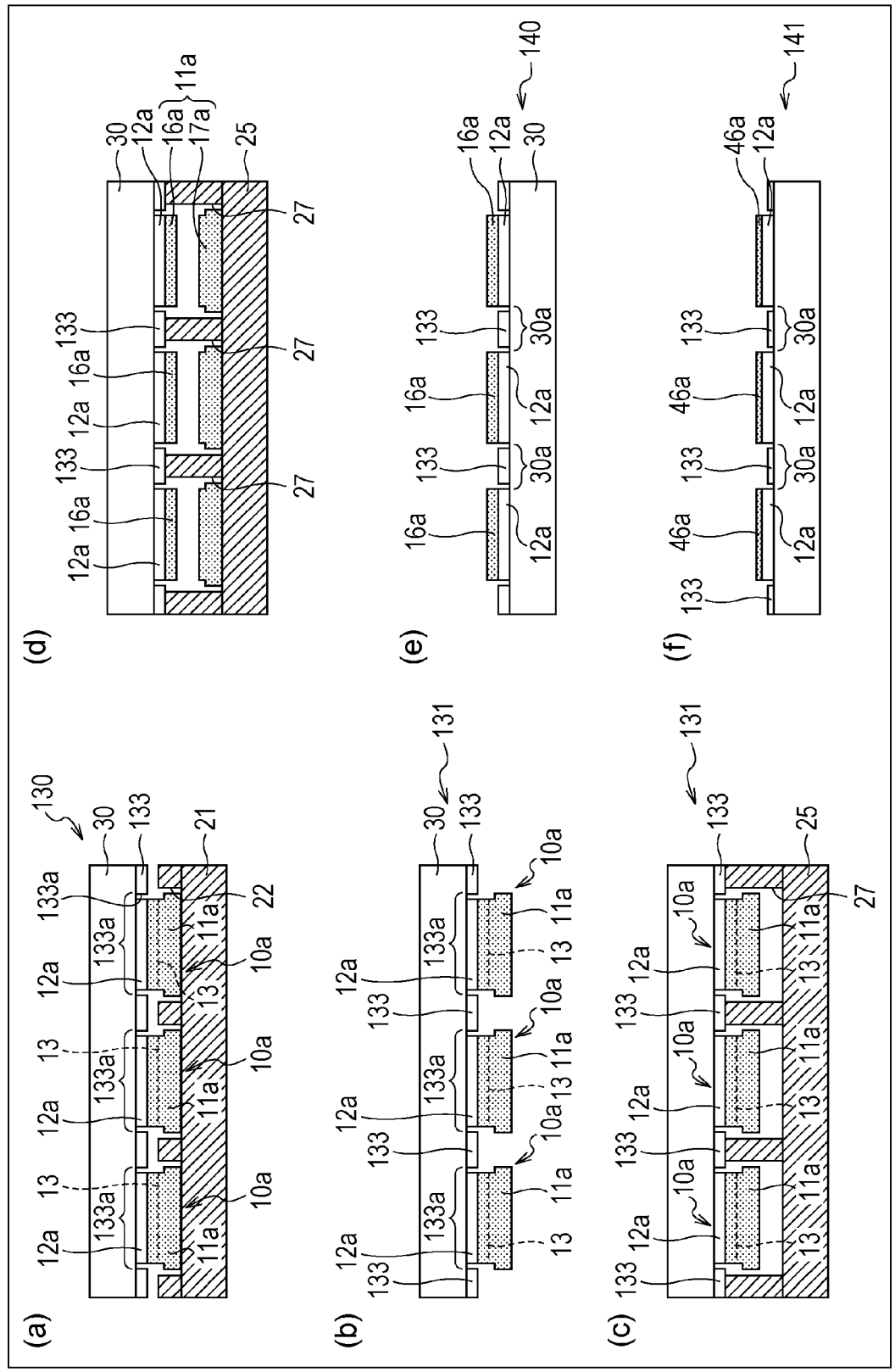
FIG. 10 is a view illustrating each process to bond the single crystal semiconductor substrates to the insulating substrate in the process to manufacture the semiconductor substrate according to the second embodiment of the present invention.

FIG. 10 is a view illustrating each process to bond the single crystal semiconductor substrates to the insulating substrate.

As shown in FIG. 10(a), in a bonding process, the plurality of substrates 10a, which are placed on the tray 21, are bonded to the bonding substrate 130 (the insulating substrate 30) which is prepared in advance in the above-described process in FIG. 9.

It is possible to use the Smart-Cut (registered trademark) method, which has been generally used, in order to perform a surface process on the oxide films 12a and the insulating substrate 30 and to bond them.

That is, a plasma process or a chemical process is performed on the surfaces of the plurality of substrates 10a which are placed on the tray 21 (that is, the surfaces of the oxide films 12) and the surface of the insulating substrate 30, and thus each of the surfaces is hydrophilized.

When the plasma process is performed, it is possible to use Ar plasma, atmospheric pressure plasma, or the like. In addition, a hydrophilization process may be performed on each of the surfaces in such a way that the chemical process, such as ozone water cleaning, SC1 cleaning, or the like, is performed on the surfaces of the substrates 10a (that is, the surfaces of the oxide films 12) and the surface of the insulating substrate 30 for a few minutes.

Meanwhile, the surface process to hydrophilize the surfaces of the substrates 10a may be performed at a stage before the substrates are placed on the tray 21, that is, between the above-described fragile layer forming process and the process to place the single crystal semiconductor substrates 11a.

In a state in which the substrates 10a are placed on the tray 21, the substrates 10a are bonded to the insulating substrate 30 (opening sections 133a) to face each other.

That is, the surface of each of the plurality of substrates 10a (that is, the surfaces of the oxide films 12) is bonded to each of the opening sections 133a, which are regions that expose the insulating substrate 30 since the conductive film 133' is removed, such that the plurality of single crystal semiconductor substrates 11a are separated from each other.

If so, the substrates 10a are bonded to the insulating substrate 30 due to the van der Waals attraction. In this manner, the single crystal semiconductor substrates 11a are bonded to the insulating substrate 30 through the oxide films 12a.

After the substrates 10a are bonded to the insulating substrate 30, a pre-anneal process is performed at 200° C. for two hours, and thus a dehydration reaction progresses on the interface between the substrates 10a and the insulating substrate 30, and covalent bonding is formed, thereby reinforcing the bonding.

Normally, since the opening sections 133a of the conductive film 133 which is formed in the insulating substrate 30 are one size larger than the single crystal semiconductor substrates 11a to be bonded, it is possible to bond the substrates 10a to the insulating substrate 30 while the single crystal semiconductor substrates 11a do not run over the conductive film 133.

On the other hand, although not shown in the drawing, when the opening sections 133a of the conductive film 133 which is formed in the insulating substrate 30 are smaller than the single crystal semiconductor substrates 11a to be bonded, the peripheral portions of the single crystal semiconductor substrates 11a (that is, the peripheral portions of the substrates 10a) protrude from the opening sections 133a of the conductive film 133, and the protruding peripheral portions of the single crystal semiconductor substrates 11a (that is, the peripheral portions of the substrates 10a) run over the conductive film 133.

Therefore, gap regions which are difficult to be bonded to the insulating substrate 30 are generated in the peripheral portions of the substrates 10a in the opening sections 133a. However, as described above, since the conductive film 133 having extremely thin film thickness is formed, the width of the region of the peripheral portion of each of the substrates 10a, which is difficult to be bonded, is quite small in each of the opening sections 133a, and thus it is possible to cover almost the whole region of the surface of the insulating substrate 30 using the conductive film 133 and the semiconductor thin films 16a such that the insulating substrate 30 is not exposed.

After the substrates 10a and the insulating substrate 30 are bonded, a pre-anneal process is performed at 200° C. for two hours, and thus a dehydration reaction progresses on the interface between the substrates 10a and the insulating substrate 30, covalent bonding is formed, thereby reinforcing the bonding.

As shown in FIG. 10(b), in a process to reprint the single crystal semiconductor substrates 11a, the tray 21, on which the plurality of substrates 10a bonded to the insulating substrate 30 are placed, is removed, and thus the plurality of single crystal semiconductor substrates 11a which are placed on the tray 21 are reprinted to the insulating substrate 30.

As described above, since the plurality of single crystal semiconductor substrates 11a are separated from each other and arranged on the tray 21, the plurality of single crystal semiconductor substrates 11a which are reprinted to the insulating substrate 30 are also arranged on the insulating substrate 30 to be separated from each other.

As shown in FIG. 10(c), in a process to place the bonded substrates on the tray, the bonded substrate 131, in which the single crystal semiconductor substrates 11a are bonded to the insulating substrate 30, is placed on a tray 25 which is arranged on the lower side of the bonded substrate 131.

The substrates 10a are stored in the respective depressed portions 27 provided in the tray 25.

The size of each of the depressed portions 27 of the tray 25 is one size larger than each of the substrates 10a, and the depth of each of the depressed portions 27 is formed to be deeper than the thickness of each of the substrates 10a.

In this manner, the reason for storing the substrates 10a in the depressed portions 27 of the tray 25 is to drop semiconductor layers, which are divided through a heat treatment in a subsequent process, into the depressed portions 27 of the tray 25 and recover them.

Meanwhile, the tray 25 is not necessarily located on the lower side of the bonded substrate 131. For example, as in PTL 8, the direction of the bonded substrate 131 may be changed such that the plurality of substrates 10a are arranged on the upper side of the insulating substrate 30, and, in addition, the tray 25 may be placed on the bonded substrate 131 such that the depressed portions 27 cover the substrates 10a.

In order to perform high-temperature heat treatment in a subsequent process, it is desirable that the material of the tray 25 be quartz. In addition, since it is difficult to process the quartz, it is necessary that the depressed portions 27 of the tray 25 (width of separation wall) be separated at intervals of approximately several mm. From this reason, it is necessary that the plurality of single crystal semiconductor substrates 11a be bonded to the insulating substrate 30 while inevitably having intervals therebetween.

Meanwhile, the tray 25 may not be necessarily configured as above. For example, although not shown in the drawing, a poking-up pin which can move up and down may be arranged on the bottom surface of the depressed portion 27 of the tray 25, and single crystal semiconductor substrates which are a part of the single crystal semiconductor substrate 11a on which division is performed through the heat treatment may be dropped on the poking-up pin and may be recovered.

As shown in FIG. 10(d), in a semiconductor layer separation process, the heat treatment is performed on the bonded substrate 131 in a state in which the bonded substrate 131 is placed on the tray 25, and the single crystal semiconductor substrates 11a are separated from the fragile layers 13.

In the heat treatment, a heat of approximately 500 to 700° C. is applied to the bonded substrate 131. Therefore, cracks are generated in the single crystal semiconductor substrates 11a because minute holes which are formed in the fragile layer 13 are expanded. In addition, the single crystal semiconductor substrates 11a are separated from the fragile layers 13. Therefore, in the single crystal semiconductor substrates 11a, the semiconductor thin films 16a having a film thickness of approximately 50 to 200 nm are transferred to the insulating substrate 30. That is, the oxide films 12a and the semiconductor thin films 16a which are formed on the upper layers of the single crystal semiconductor substrates 11a are transferred to the insulating substrate 30.

On the other hand, in the single crystal semiconductor substrates 11a which are separated from the fragile layers 13, the single crystal semiconductor substrates 17a opposite to the semiconductor thin films 16a (substrate side portions of the substrates 10a) are arranged on the lower sides of the semiconductor thin films 16a, and thus the single crystal semiconductor substrates 17a are dropped to bottom surfaces in the depressed portions 27 of the tray 25 due to gravity. In addition, when the tray 25 is detached from the insulating substrate 30, the single crystal semiconductor substrates 17a are recovered.

If the tray 25 is detached, the insulating substrate 30 to which the semiconductor thin films 16a are reprinted is vertically turned over. That is, the direction of the insulating substrate 30 is reversed in the direction in which the semiconductor thin films 16a are laminated on the upper side of the insulating substrate 30. In addition, the insulating substrate 30 to which the semiconductor thin films 16a are reprinted is transmitted to a subsequent process.

In this manner, in a semiconductor layer separation process, a part of each of the substrates 10a is divided, and the plurality of semiconductor thin films 16a are transferred such that the plurality of semiconductor thin films 16a are separated from each other on the insulating substrate 30 on which the conductive film 133 is formed. Therefore, since it is possible to form the conductive film 133 between the plurality of semiconductor thin films 16a which are transferred to the insulating substrate 30, it is possible to suppress that the surface of the insulating substrate 30 is exposed between the semiconductor thin films 16a.

Therefore, in order to cause the semiconductor thin films 16a to have desired film thickness, when the etch-back process is performed on the semiconductor thin films 16a, it is possible to perform the etch-back process by suppressing the generation of potential difference between the plurality of semiconductor thin films 16a and the insulating substrate 30, and suppressing the convergence of electric fields to the peripheral portions (end portions) of the semiconductor thin films 16a.

Therefore, it is possible to thin the plurality of semiconductor thin films 16a to be uniform up to the peripheral portions thereof with desired film thickness by performing the etch-back process.

As shown in FIG. 10(e), in a surface planarization process, a laser process is performed on the surfaces of the semiconductor thin films 16a which are separated from the fragile layers 13. It is possible to recover the damage, added to the semiconductor thin films 118 because hydrogen ions are injected in the fragile layer forming process, by performing a laser process on the surfaces of the semiconductor thin films 16a in addition to the planarization of the semiconductor thin films 16a.

With regard to a laser, for example, a XeCl excimer laser which has a wavelength of 308 nm can be used. An irradiation energy density is appropriately adjusted based on the film thickness of the transferred semiconductor thin films 16a. As an example, when the film thickness of each of the semiconductor layers 16a is 130 nm, the irradiation energy density is 400 to 700 mJ/cm$^2$.

Therefore, the semiconductor substrate 140, in which the plurality of semiconductor thin films 16a are arranged on the insulating substrate 30 to be separated from each other, is formed. That is, each of the spaces 30a is provided between the plurality of semiconductor thin films 16a which are arranged on the insulating substrate 30. In addition, the conductive film 133 is arranged in each of the spaces 30a.

That is, it is possible to acquire the semiconductor substrate 140 in which the plurality of semiconductor thin films 16a are arranged on the insulating substrate 30 to be separated from each other and in which the conductive film 133 is arranged between the semiconductor thin films 16a.

Meanwhile, the laser process is not inevitably necessary, and may be performed as necessary.

As shown in FIG. 10(f), in the etch-back process, in order to adjust (thin) the semiconductor thin films 16a which are formed on the semiconductor substrate 140 to the desired film thickness, a dry etching process is performed on the acquired semiconductor substrate 140 using plasma. Therefore, the semiconductor thin films 16a are thinned, and thus the semiconductor thin films 46a, which are thinned and adjusted to the desired film thickness, are acquired.

That is, when the etch-back process is performed on the semiconductor substrate 140, it is possible to acquire the semiconductor substrate 141 in which the plurality of thinned semiconductor thin films 46a are arranged on the insulating substrate 30 to be separated from each other, and in which the conductive film 133 is arranged between the semiconductor thin films 46a.

In the semiconductor substrate 140 acquired before the etch-back process is performed, the conductive film 133 is formed between the plurality of semiconductor thin films 16a which are transferred to the insulating substrate 30. That is, almost of the surface of the insulating substrate 30 is covered by the conductive film 133 and the semiconductor thin films 46a such that the surface of the insulating substrate 30 is not exposed. Therefore, when plasma is generated on the surface of the semiconductor substrate 140 in the dry etching process, the in-plane distribution of the potential difference does not occur in the semiconductor substrate 140, and electric fields do not converge on the peripheral portions of the semiconductor thin films 46a. Therefore, it is possible to realize uniform etching in plane of the semiconductor substrate 140.

As a result, it is possible to acquire the semiconductor substrate 141 which includes thinned semiconductor thin films 46a by sufficiently securing panel formable areas (regions in which the film thickness of the semiconductor thin films 46a is uniform). Therefore, the panel obtainment efficiency increases, and thus it is possible to realize yield improvement and cost reduction.

Subsequently, in particular, although not shown in the drawing, a TFT forming process is performed using the acquired semiconductor substrate 141. In the TFT forming process, a TFT may be formed from the semiconductor substrate 141 based on a general TFT forming process of poly-Si or the like (islanding semiconductor thin films→forming a gate insulating film→forming gate electrodes→injecting source/drain ions→interlayer deposition→activation→forming contact holes→forming metal lines). Therefore, it is possible to form an n-channel type TFT (nch-TFT) 340a and a p-channel type TFT (pch-TFT) 340b in which the semiconductor thin films 46 are n-type semiconductors, respectively, as shown in FIG. 17. Since the panel which are acquired from the semiconductor thin films 148 of the semiconductor substrate 141 have less fluctuation in the film thickness of the semiconductor thin films 46a in the panels, it is possible to acquire the TFTs 340a and 340b which have less fluctuation in TFT characteristics (threshold).

As described above, the semiconductor substrate 141 is formed by transferring the plurality of semiconductor thin films 46a to the insulating substrate 30 on which the conductive film 133 is patterned in advance. Therefore, in the semiconductor substrate 141, each of the plurality of semiconductor thin films 46a and the conductive film 133 are separated from each other and arranged. It is preferable that the distance, by which each of the semiconductor thin films 46a and the conductive film 133 are separated from each other, be 1 mm or less. Therefore, even though each of the semiconductor thin films 46a and the conductive film 133 are separated from each other, the distance therebetween is close, with the result that it is possible to prevent electric fields from converging on the peripheries in the semiconductor thin films 46a when the etch-back process is performed, and thus it is possible to acquire the semiconductor substrate 141 in which semiconductor thin films 46a having thinned film thickness are formed while maintaining a uniform film thickness.

Further, preferably, it is preferable that each of the plurality of semiconductor thin films 46a and the conductive film 133 be separated from each other in a range of 100 μm or less. Therefore, since the distance between each of the semiconductor thin films 46a and the conductive film 133 is further closer, it is possible to further securely prevent electric fields from converging on the peripheries in the semiconductor thin films 46a when the etch-back process is performed, and thus it is possible to acquire the semiconductor substrate 141 in which semiconductor thin films 46a having thinned film thickness are formed while maintaining a uniform film thickness.

Third Embodiment

Subsequently, a third embodiment of the present invention will be described with reference to FIG. 13.

Figure 13:
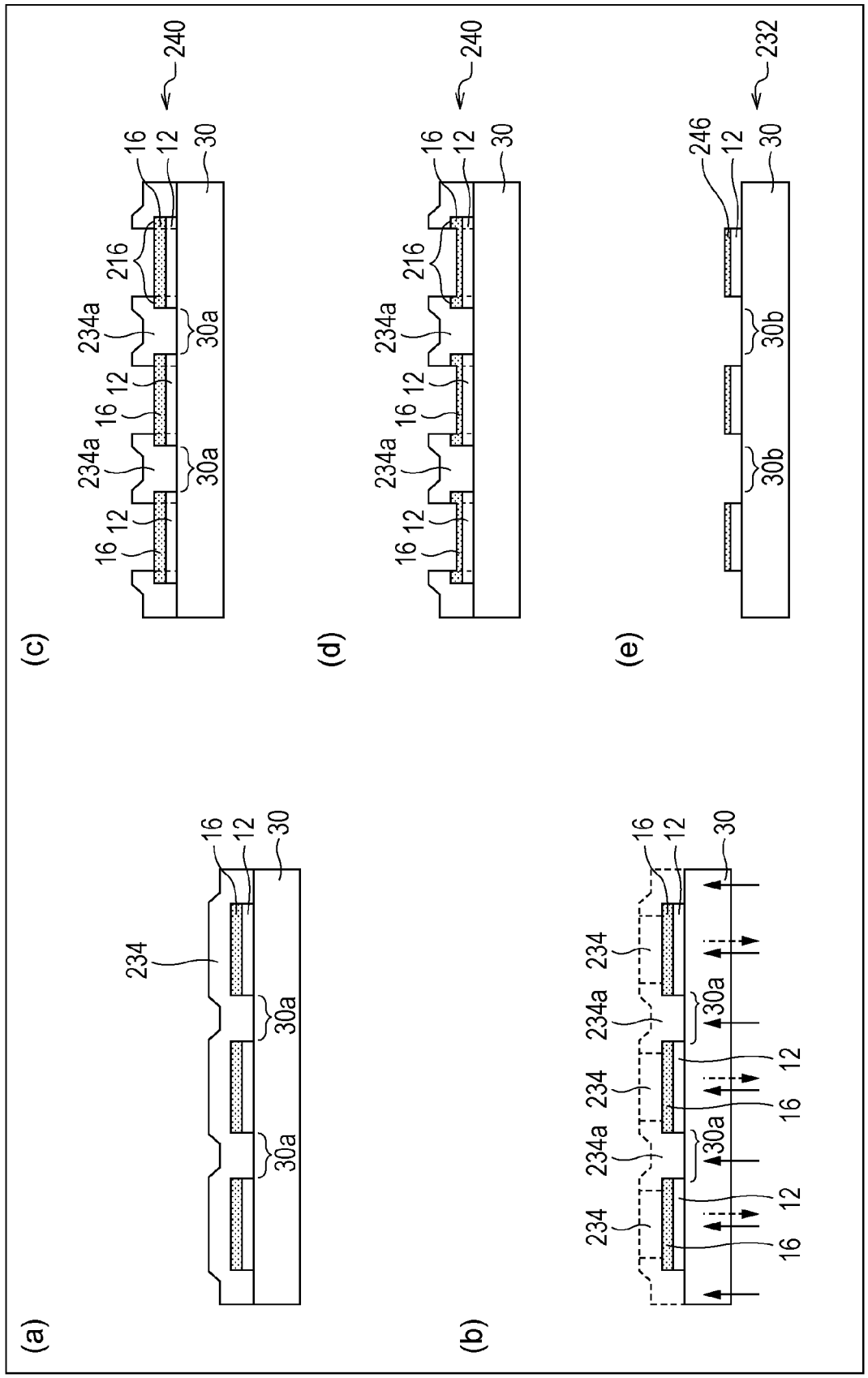
FIG. 13 is a view illustrating a process to manufacture a semiconductor substrate according to a third embodiment of the present invention.
Figure 14:
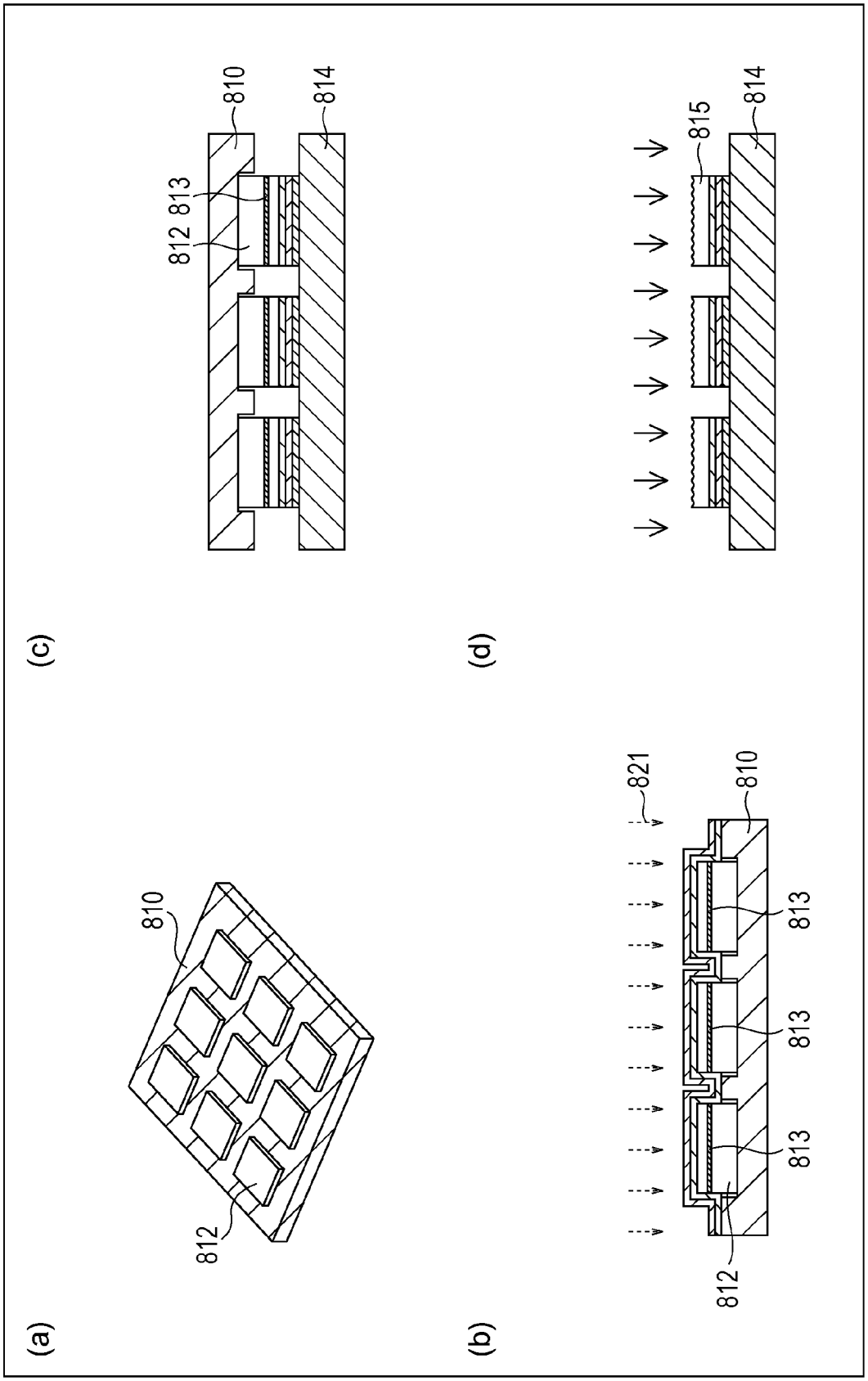
FIG. 14 is a view illustrating a method for manufacturing an SOI substrate in the related art.

FIG. 13 is a view illustrating a process to manufacture a semiconductor substrate according to the third embodiment. Meanwhile, for convenience of description, the same reference numerals are used for members which have the same function as in the drawings described in the first and second embodiments, and the description thereof will not be repeated.

In the above-described first and second embodiments, almost of the surface of the insulating substrate which is exposed is covered by the conductive film, and thus the electric potential of the semiconductor substrate is caused to be equal, thereby preventing electric fields from converging on the outer peripheries of the semiconductor thin films.

On the other hand, in the third embodiment, instead of the surface of the semiconductor substrate not being covered by the conductive film, each of the outer peripheries of the semiconductor thin films which are formed on the semiconductor substrate are protected by laminating a resist. If an etch-back process is performed on the semiconductor substrate, even though electric fields converge on the outer peripheries of the semiconductor thin films, only the laminated resist is etched and the semiconductor thin films at the bottom of the resist are not etched.

Hereinafter, detailed description will be made. Meanwhile, the descriptions of the processes which are the same as in the first embodiment will not be repeated for simplification.

In a process performed on a single crystal semiconductor substrate side, as described with reference to FIGS. 3(a) to 3(c), the substrates 10 are formed through the oxide film forming process, the fragile layer forming process, and the placing process in the same manner.

In a process performed on an insulating substrate side, as described with reference to FIG. 3(d), the insulating substrate 30 used to bond the single crystal semiconductor substrates is prepared in the same manner.

Subsequently, as described with reference to FIGS. 4(a) to 4(d), the insulating substrate 30 to which the semiconductor thin films 16 are reprinted is formed through the bonding process, the process to reprint the single crystal semiconductor substrates 11, the process to place the bonded substrate on the tray, and the semiconductor layer separation process.

Subsequently, the peripheral removing process and the surface planarization process, which are described with reference to FIG. 4(e), are skipped (in the embodiment, after the etch-back process is performed, the peripheral removing and the surface planarization are performed), and a resist 234 is applied to the whole surface of the insulating substrate 30, to which the semiconductor thin films 16 are reprinted, as shown in FIG. 13(*a*). When the back exposure is performed, a negative resist is applied as the resist 234. On the other hand, when the surface exposure is performed, a positive resist is applied as the resist 234.

As shown in FIG. 13(*b*), in a resist exposure process, the resist 234, arranged in the space 30*a* between the semiconductor thin films 16, is exposed from the rear surface of the insulating substrate 30 by self-alignment while the semiconductor thin films 16 are used as masks.

Since the silicon which configures the semiconductor thin films 16 has high reflectance, ultraviolet light which is radiated from the rear surface sides of the semiconductor thin films 16 is reflected by the semiconductor thin films 16, and thus the resist 234, which is a negative resist formed on the upper layers of the semiconductor thin films 16, is not exposed.

On the other hand, since the resist 234 is directly formed on the insulating substrate 30 formed of glass in the section of the space 30*a*, transmittance is high, the resist 234 which is arranged in the space 30*a* is exposed, and thus the resist 234 becomes the exposed resist 234*a*.

Further, when the back exposure is performed, over exposure is performed as the exposure condition. Therefore, since the width of the pattern of the resist 234 to be exposed expands, it is possible to form a negative resist pattern (that is, a resist 234*a*) having an interval which is wider than the space 30*a* between the single crystal semiconductor substrates 18.

As shown in FIG. 13(*c*), if the resist 234, in which the exposed resist 234*a* is formed by performing the back exposure, is developed in a subsequent process, the unexposed resist 234 on the semiconductor thin films 16 is removed, and thus it is possible to leave the exposed resist 234*a* in the space 30*a* between the semiconductor thin films 16. In this way, it is possible to form the resist 234*a* between the semiconductor thin films 16 using self-alignment.

In addition, since the back exposure is performed using the over exposure, it is possible to form the resist 234*a* using self-alignment in such a way as to protect the peripheral portions (angles) 216 of the semiconductor thin films 16.

In addition, although a mask is necessary, the resist pattern may be formed in such a way as to protect the peripheral portions (angles) 216 of the semiconductor thin films 16 by exposing the resist 234 formed of a positive resist using a mask as in normal exposure from the surface and developing the resist 234.

In this manner, it is possible to acquire a semiconductor substrate 240 in which the plurality of semiconductor thin films 16 are arranged on the insulating substrate 30 to be separated from each other, and in which the resist 234*a* is arranged between the semiconductor thin films 16.

Since it is possible to protect the peripheral portions (angles) 216 of the semiconductor thin films 16 using the resist 234*a*, when the etching process is performed in a subsequent etch-back process, electric fields converge on corner sections (parts of the resist 234*a* laminated on the peripheral portions (angles) 216 of the semiconductor thin films 16). Therefore, although the resist 234*a*, which is laminated on the peripheral portions (angles) 216 of the semiconductor thin films 16, is etched, the peripheral portions (angles) 216 of the semiconductor thin films 16 on the lower layer of the resist 234*a* are not etched, and thus it is possible to solve the problem in that the peripheral portions of the semiconductor thin films 246 are thinned after the etch-back process is performed.

As shown in FIG. 13(*d*), in the etch-back process, in order to adjust (thin) the semiconductor thin films 216 which are formed on the semiconductor substrate 240 to desired film thickness, the dry etching process is performed on the acquired semiconductor substrate 240. Therefore, a semiconductor thin films in which exposed parts of the semiconductor thin films 16 are thinned, is in acquired semiconductor thin films 16.

Since the peripheral portions 216 of the semiconductor thin films 16 are protected by the resist 234*a*, when plasma is generated, electric fields converge on the peripheral portions 216 of the semiconductor thin films 16 and the resist 234*a* on the peripheral portions 216 is etched. However, the peripheral portions 216 of the semiconductor thin films 16 on the lower layer of the resist 234*a* are protected and are not etched. Therefore, it is possible to solve the problem in that the peripheral portions of the semiconductor thin films 246 are thinned after the etch-back process is performed.

In the embodiment, since the peripheral portions 216 of the semiconductor thin films 16 which are protected by the resist 234*a* are not etched and left, it may be superficially considered that the areas of the semiconductor thin films 246 (inside areas of the peripheral portions 216), which are thinned in the etch-back process are one size reduced.

However, as described in the first and second embodiments, since the adhesion of the peripheral portions (several tens to several hundred μm) of the semiconductor thin films is weak, it is desirable to remove the peripheral portions.

Although the peripheral portions are removed in advance before the etch-back process is performed in the peripheral portion removing process in the first and second embodiments, the peripheral portions 216 are removed after the etch-back process is performed, as will be described later, in the embodiment. Therefore, eventually, it is possible to acquire the thinned semiconductor thin films 246 which have almost the same area as that of the semiconductor thin films 46 and 146 which have been described in the first and second embodiments. Therefore, the panel obtainment efficiency increases, and thus it is possible to realize yield improvement and cost reduction.

As shown in FIG. 13(*e*), in a peripheral removing process, the peripheral portions of the semiconductor thin films 246 which are reprinted on the insulating substrate 30 are removed as necessary.

The peripheral portions 216 of the semiconductor thin films 16 which are reprinted on the insulating substrate 30 have weak adhesion. Therefore, as necessary, the peripheral portions 216 of the semiconductor thin films 16 which are reprinted on the insulating substrate 30 are removed by performing photolithography and etching.

Therefore, the semiconductor thin films 246 are acquired in which the areas of the semiconductor thin films 16 are one size reduced.

Subsequently, in the surface planarization process, a laser process is performed on the surfaces of the semiconductor thin films 246 which are separated from the fragile layers 13. It is possible to recover the damage, added to the semiconductor thin films 249 because hydrogen ions are injected in the fragile layer forming process, by performing a laser process on the surfaces of the semiconductor thin films 246 in addition to the planarization of the semiconductor thin films 246.

With regard to a laser, for example, a XeCl excimer laser which has a wavelength of 308 nm can be used. An irradiation energy density is appropriately adjusted based on the film thickness of the transferred semiconductor thin films 246. As an example, when the film thickness of each of the semiconductor layers 246, acquired after the etch-back process is performed, is approximately 50 nm, the irradiation energy density is 300 to 600 mJ/cm$^2$.

Therefore, the semiconductor substrate 232, in which the plurality of semiconductor thin films 246 are arranged on the insulating substrate 30 to be separated from each other, is formed. That is, each of the spaces 30b is provided between the plurality of semiconductor thin films 246 which are arranged on the semiconductor substrate 232.

FIG. 17 is a schematic diagram illustrating a thin film transistor and a semiconductor circuit which is prepared using the semiconductor substrate 41 according to the present invention. Although detailed process diagrams are omitted, with regard to the semiconductor substrate 41 according to the present invention, a TFT substrate 300 in which TFTs 340a and 340b are formed on the semiconductor substrate 41 is acquired based on the general TFT forming process of poly-Si or the like (islanding the semiconductor thin films 46→forming a gate insulating film 303→forming gate electrodes 348→forming LDD regions 346→injecting source/drain ions (forming sources/drains 347)→interlayer deposition (forming an interlayer insulating film 304)→activation→forming contact holes 304a→forming metal lines 349→forming interlayer insulating film 305).

It is possible, as the TFTs 340a and 340b, respectively to form an n-channel type TFT (nch-TFT) 340a, in which the semiconductor thin films 46 are p-type semiconductors, and a p-channel type TFT (pch-TFT) 340b, in which the semiconductor thin films 46 are n-type semiconductors, by doping ions.

Since the TFTs 340a and 340b acquired from each of the semiconductor thin films 46 of the semiconductor substrate 41 show characteristics which are equal to those of single crystal silicon and fluctuation in the film thickness of the semiconductor thin films 46 is small, it is possible to acquire the TFTs 340a and 340b which have less fluctuation in TFT characteristics (threshold).

In addition, it is possible to acquire a complementary type MOS transistor (CMOS) circuit 340 by combining the nch-TFT (TFT 340a) and pch-TFT (TFT 340b).

If the CMOS circuit 340 is used, it is possible to realize various semiconductor circuits. For example, it is possible to prepare an amplification circuit, a power supply circuit, a feed-back circuit, an operational amplification circuit, a phase compensation circuit and a filter circuit which are necessary for wireless communication, or the like.

Since the semiconductor substrate 41 which is acquired according to the present invention is an extremely large glass substrate, the semiconductor substrate 41 may be cut off according to the size of a necessary panel or the like in an apparatus as shown below.

Figure 18:
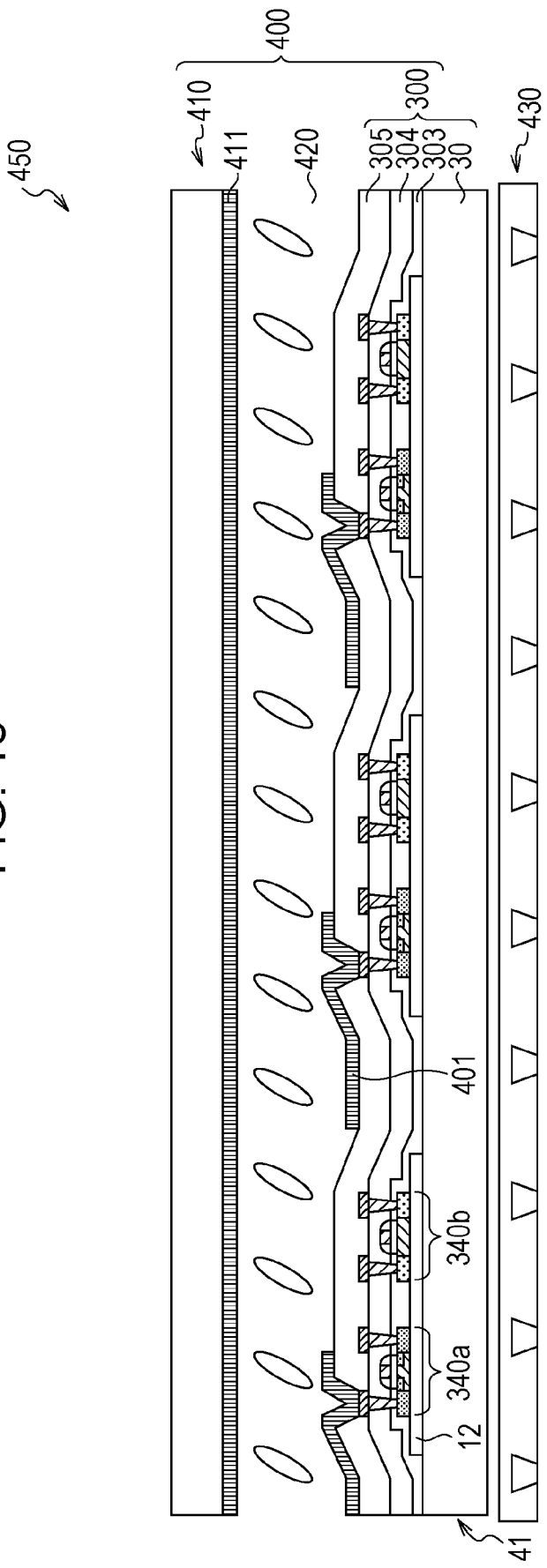
FIG. 18 is a view illustrating the configuration of a liquid crystal display apparatus according to the present invention.

FIG. 18 is a schematic diagram illustrating a liquid crystal display apparatus which is prepared using the semiconductor substrate 41 according to the present invention. A part of the TFT 340a of the TFT substrate 300 as shown in FIG. 17 functions as a pixel transistor (switching element) in order to drive each pixel.

Therefore, a pixel electrode 401 is formed on the upper layer of the interlayer insulating film 305, and the pixel electrode 401 is connected to each TFT 340a through a contact hole.

In addition, a liquid crystal driving circuit is formed by combining the TFT 304a with the TFT 304b other than the pixel transistor. In addition, a photo detection element and a photodiode may be further provided on the TFT substrate 300, and the TFTs 340a and 340b may be formed to control the drive of the detection element. Therefore, it is possible to configure a touch panel function-attached liquid crystal display apparatus which realizes a touch panel function by detecting the location of light received by the photo detection element.

A liquid crystal panel 400 is acquired by bonding the TFT substrate 300, on which the pixel electrode 401 is formed, to an opposite substrate 410, on which the opposite electrode 411 is formed, sealing them up, and injecting liquid crystal 420 between both the substrates. The direction of the liquid crystal 420 varies according to the application of a voltage, and thus the liquid crystal panel 400 performs a function as a shutter which causes light of each pixel to pass through or to be blocked. Therefore, a liquid crystal display apparatus 450 is acquired in which a backlight module 430 is arranged on the rear surface of the liquid crystal panel 400, and in which the liquid crystal panel 400 turns on or off light from the backlight module 430 as a shutter. It is possible to use an LED, a cold-cathode tube, or the like for the backlight module 430.

Figure 19:
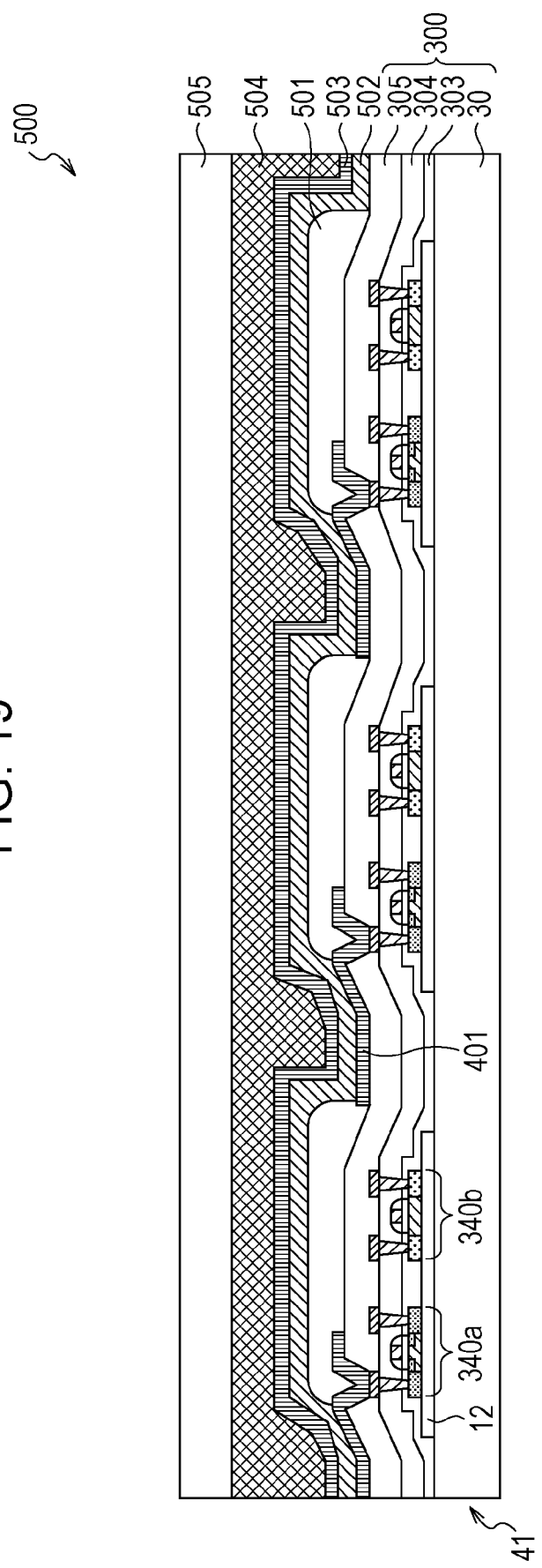
FIG. 19 is a view illustrating the configuration of an electroluminescence apparatus according to the present invention.

FIG. 19 is a schematic diagram illustrating an electroluminescence apparatus which is prepared using the semiconductor substrate 41 according to the present invention. Like the case of the liquid crystal display apparatus in FIG. 18, the pixel electrode 401 is formed on the upper layer of the interlayer insulating film 305, and the pixel electrode 401 is connected to each TFT 340a through a contact hole.

Subsequently, an isolation layer 501 is provided on the TFT substrate 300, in which the pixel electrode 401 is formed, so as to prevent the shorting with adjacent pixels. Subsequently, a layer (EL layer 502) which is formed to include an electroluminescence material, an opposite electrode 503, and a resin layer 504 may be formed in this order, and an opposite substrate 505 for protecting may be bonded last. An electroluminescence (EL) apparatus 500 is acquired in which current flows through the EL layer 502 interposed between each pixel electrode 401 and the opposite electrode 503, and thus light is emitted in the EL layer 502.

It is possible to use the EL apparatus 500 for a display apparatus, such as a display, and for a light emitting apparatus, such as lighting.

Figure 20:
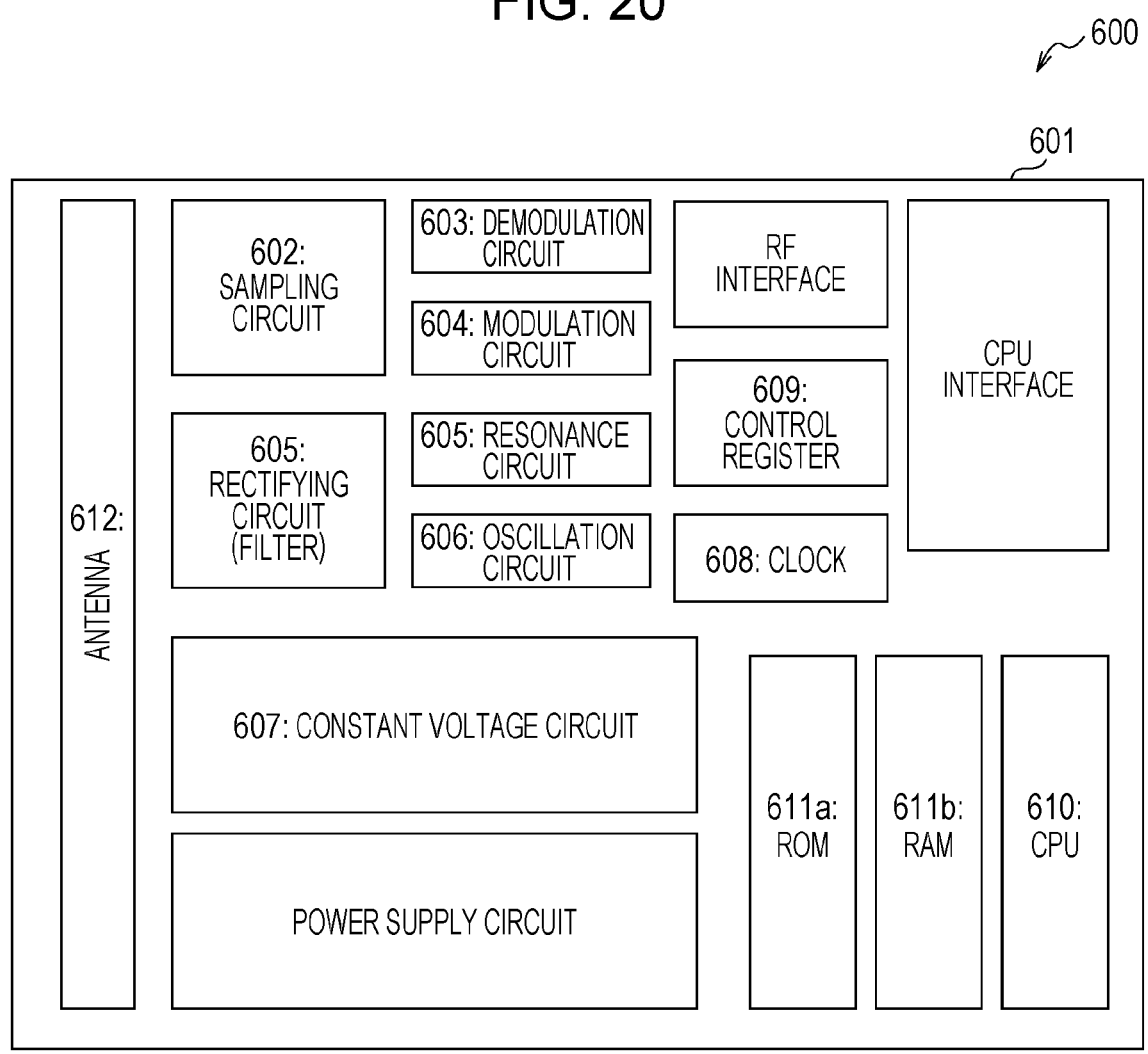
FIG. 20 is a view illustrating the configuration of a wireless communication apparatus according to the present invention.

FIG. 20 is a circuit block diagram illustrating a wireless communication apparatus which is prepared using the semiconductor substrate 41 according to the present invention. It may be considered that the configuration itself of a wireless communication apparatus 600 is basically the same as the configuration of the semiconductor circuit shown in FIG. 17. The wireless communication apparatus 600 includes a wireless communication circuit 601 in which each circuit is formed using the TFT substrate 300 shown in FIG. 17.

The wireless communication circuit 601 of the wireless communication apparatus 600 includes communication system circuits, such as an antenna 612 which receives electromagnetic waves, a sampling circuit 602, a demodulation circuit 603 which demodulates the received electromagnetic waves, a modulation circuit 604 which puts a signal on carrier waves, a rectifying (filtering) circuit 605 which acquires predetermined frequency characteristics, a resonance circuit 605 which resonates the signal, an oscillation circuit 606 which oscillates the signal, and the like, a power supply system circuit, such as a constant voltage circuit 607 which supplies a constant voltage to each circuit or the like, control system circuits, such as a clock 608 which measures signal exchanging timing, a control register 609, a CPU 610 which operates them, and the like, and a memory circuit, such as a RAM 611a or a ROM 611b which stores data, or the like.

Figure 21:
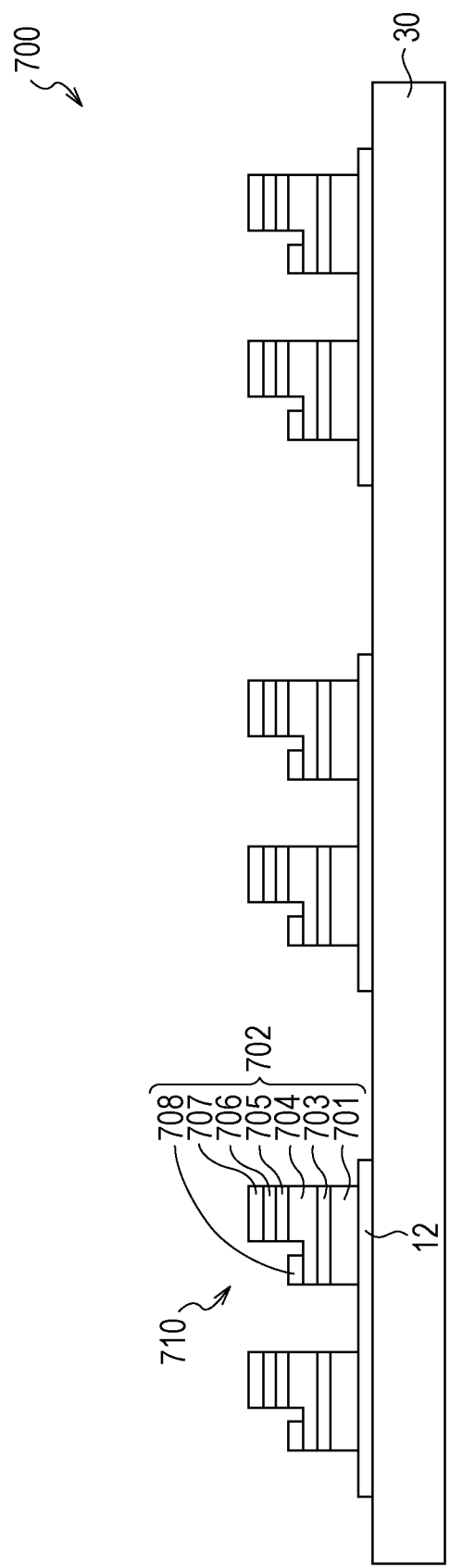
FIG. 21 is a view illustrating the configuration of a light emitting apparatus according to the present invention.

FIG. 21 is a schematic diagram illustrating a light emitting apparatus which is prepared using the semiconductor substrate 41 according to the present invention. Instead of the Si substrate described in the first to third embodiments, a semiconductor substrate formed of a compound of GaN or GaAs is used. That is, a laminated film 702 of compound semiconductor films which are epitaxially grown on a sapphire substrate 701 is transferred onto the insulating substrate 30.

In the laminated film 702, from a side of the sapphire substrate 701, a buffer layer 703, an n-contact layer 704, a light emitting layer 705, a p-contact layer 706, and a p-electrode 707 are sequentially laminated, and, further, an n-electrode 708 is laminated on the n-contact layer 704 while being separated from the light emitting layer 704.

In this manner, an LED 710 which is a light emitting element is formed on the insulating substrate 30, and thus a light emitting apparatus 700 is acquired.

Figure 22:
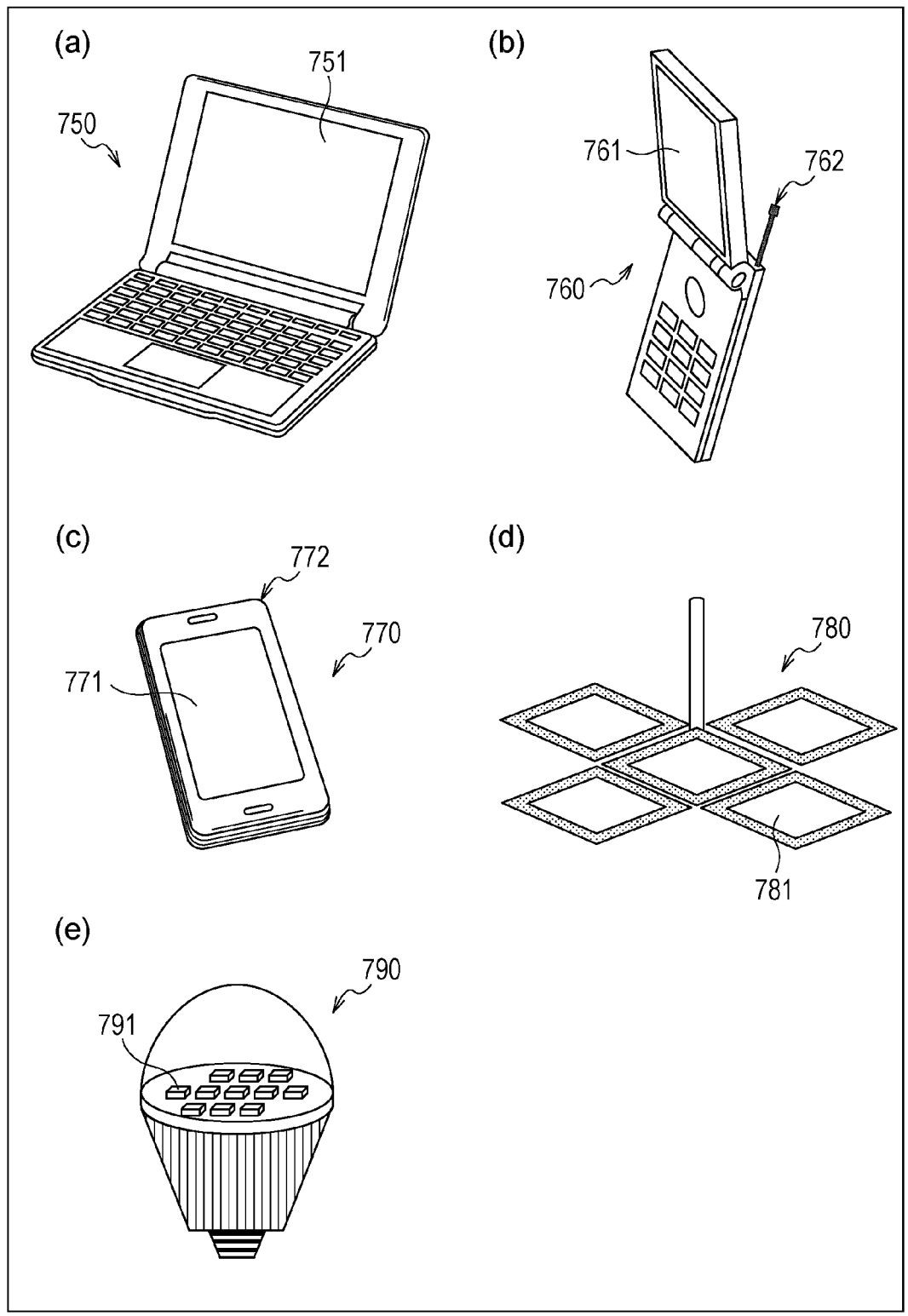
FIG. 22 is a view illustrating detailed examples of products using the liquid crystal display apparatus, the electroluminescence apparatus, the wireless communication apparatus, the light emitting apparatus, and the like according to the present invention.

FIG. 22 illustrates examples of the images of application products using the liquid crystal display apparatus, the electroluminescence apparatus, the wireless communication apparatus, and the light emitting apparatus according to the present invention. It is possible to use the liquid crystal display apparatus 450 and the electroluminescence apparatus 500 for the display unit 751 of a Personal Computer (PC) 750 shown in FIG. 22(a), the display unit 761 of a mobile phone 760 shown in FIG. 22(b), the display unit 771 of a wireless communication machine 770 shown in FIG. 22(c), or the like. It is possible to use the wireless communication apparatus 600 for the wireless communication unit 762 of the mobile phone 760 shown in FIG. 22(b), the wireless communication unit 772 of the wireless communication machine 770 shown in FIG. 22(c), or the like. In addition, it is possible to use the electroluminescence apparatus 500 for the light emitting unit 781 of an organic EL lighting 780 or the like shown in FIG. 22(d) in addition to the display units 751, 761, and 771. It is possible to use the light emitting apparatus 700 for the light emitting unit 791 of an LED bulb 790 or the like shown in FIG. 22(e).

The present invention is not limited to each of the above-described embodiments, and various modifications are possible in the range of the claims. An embodiment acquired by appropriately combining technical means which are respectively disclosed in different embodiments is included in the technical range of the present invention.

In order to solve the above-problem, the semiconductor substrate according to the present invention includes: an insulating substrate that is formed of an insulating material; a plurality of semiconductor thin films that are arranged on the insulating substrate to be separated from each other; and a conductive film which is arranged between the semiconductor thin films.

According to the configuration, since the conductive film is formed between the plurality of semiconductor thin films of the insulating substrate, it is possible to suppress the exposure of the surface of the insulating substrate between the semiconductor thin films.

Therefore, when the dry etching process is performed on the surface of the insulating substrate in order to make each of the semiconductor thin films a desired film thickness, (hereinafter, there is a case in which the dry etching process to thin the semiconductor thin films is called an etch-back process), it is possible to acquire semiconductor thin films on which the etch-back process is performed in such a way that the occurrence of potential difference between the semiconductor thin films and in the semiconductor thin films is suppressed, and that the convergence of electric fields on the edge portions in each of the semiconductor thin films is suppressed.

Therefore, it is possible to acquire a semiconductor substrate in which semiconductor thin films, which are uniform up to the peripheral portions thereof and which are thinned to desired film thickness, are formed, by performing the etch-back process.

In addition, it is preferable that the conductive film be arranged to surround peripheries of the semiconductor thin films.

According to the configuration, since the peripheries in the semiconductor thin films are surrounded by the conductive film, it is possible to further prevent electric fields from converging on the peripheries in the semiconductor thin films when the etch-back process is performed, and thus it is possible to acquire the semiconductor thin films having further uniform film thickness.

In addition, it is preferable that the plurality of semiconductor thin films be connected to the conductive film. According to the configuration, it is possible to completely prevent the insulating substrate from being exposed between the plurality of semiconductor thin films. Therefore, when the etch-back process is performed, it is possible to securely prevent electric fields from converging on the peripheries in the semiconductor thin films, and thus it is possible to securely configure a semiconductor substrate, in which the semiconductor thin films, which have uniform film thickness and in which the film thickness thereof is thinned, are formed.

It is preferable that the plurality of semiconductor thin films be separated from the conductive film in a range of 1 mm or less.

According to the configuration, even though the semiconductor thin films are separated from the conductive film, the distance therebetween is close to each other, and a small area of the insulating substrate is exposed. Therefore, when the etch-back process is performed, it is possible to prevent electric fields from converging on the peripheries in the semiconductor thin films, and thus it is possible to acquire the semiconductor substrate, in which the semiconductor thin films, which have uniform film thickness and in which the film thickness thereof is thinned, are formed.

Further, preferably, it is preferable that the plurality of semiconductor thin films be separated from the conductive film in a range of 100 µm or less.

Therefore, the distance between each of the semiconductor thin films and the conductive film is further closer and little area of the insulating substrate is exposed. Therefore, when the etch-back process is performed, the electric fields are securely prevented from converging on the peripheries in each of the semiconductor thin films, and it is possible to acquire the semiconductor substrate, in which the semiconductor thin films, which have uniform film thickness and in which the film thickness thereof is thinned, are formed.

In addition, it is preferable that the plurality of semiconductor thin films be arranged in a matrix.

According to the configuration, since it is possible to regularly and closely spread and arrange the semiconductor thin films on the insulating substrate, it is possible to increase the panel obtainment efficiency by minimizing regions in which the semiconductor thin films are not arranged on the insulating substrate. In addition, since the arrangement of the semiconductor thin films is simple and regular, it is possible to decrease the number of exposure shots, which is necessary when the conductive film is formed between the semiconductor thin films, and thus it is possible to effectively form the conductive film between the semiconductor films.

In this way, it is possible to acquire the semiconductor substrate in which the plurality of semiconductor thin films, which are separated from each other, and the conductive film, which is formed between the semiconductor thin films, are efficiently formed.

In addition, it is preferable that the plurality of semiconductor thin films be separated from each other at intervals of 5 mm or larger. According to the configuration, when the semiconductor substrate is placed on the tray, a minimum clearance for picking up by a jig or for letting the jig out is secured between the semiconductor substrates, and thus it is possible to arrange the plurality of semiconductor substrates on the insulating substrate without touching the surfaces thereof. Therefore, it is possible to acquire a semiconductor substrate on which semiconductor thin films having little occurrence of defects, such as damage, holes, or the like are arranged.

As an example, if the intervals between the plurality of semiconductor thin films are set to 50 mm or less, it is possible to suppress the deterioration of the panel obtainment efficiency attributable to the deterioration of efficiency of arranging the plurality of semiconductor thin films on the insulating substrate.

That is, if the intervals between the plurality of semiconductor thin films are equal to or larger than 5 mm and equal to less than 50 mm, the deterioration of the panel obtainment efficiency is suppressed, and it is possible to acquire a semiconductor substrate on which semiconductor thin films having little occurrence of defects, such as damage, holes, or the like are arranged.

In addition, it is preferable that the reflectance of the conductive film be lower than reflectance of the semiconductor thin films. According to the configuration, in order to form the conductive film between the semiconductor thin films, it is possible to pattern the resist, which is applied between the semiconductor thin films and on the upper side of each of the semiconductor thin films, with self-alignment using the back exposure. In this manner, since the back exposure is used to pattern the resist, a mask to pattern the resist is not necessary, and thus it is possible to reduce manufacturing costs.

In addition, since the patterning is performed with self-alignment, it is possible to form a desired pattern without requiring high-precision alignment between the mask and the substrate when the large glass substrate is exposed. Therefore, an exposure machine which includes a high-precision and expensive stage is not necessary, and thus it is possible to suppress manufacturing costs.

In addition, it is preferable that the conductive film be formed of a transparent material. According to the configuration, in order to form the conductive film between the semiconductor thin films, it is possible to pattern the resist, which is applied between the semiconductor thin films and on the upper side of each of the semiconductor thin films, with self-alignment using the back exposure, with the result that a mask to pattern the resist is not necessary, and thus it is possible to reduce manufacturing costs. In addition, since the patterning is performed with self-alignment, it is possible to form a desired pattern without requiring high-precision alignment between the mask and the substrate when the large glass substrate is exposed. Therefore, an exposure machine which includes a high-precision and expensive stage is not necessary, and thus it is possible to suppress manufacturing costs.

In addition, it is preferable that the conductive film be formed of a conductive resist material. According to the configuration, it is not necessary to apply the resist in order to arrange the conductive film between the semiconductor thin films. Therefore, compared to a case in which the resist is applied, it is possible to reduce the number of processes, and thus it is possible to increase productivity.

In addition, it is preferable that, when the dry etching is performed, the conductive film have a selection ratio with an etching rate, which is equal to or larger than 0.8 and equal to or less than 1.2, with respect to a semiconductor material which configures each of the semiconductor thin films.

According to the configuration, it is possible to cause the etching rate acquired when the dry etching is performed on the conductive film to be approximately the same as the etching rate of the semiconductor material which configures the semiconductor thin films.

Therefore, according to the configuration, since it is easy to control the remaining film of the conductive film, it is possible to use normal gas used to perform etching on the semiconductor thin films without change even though gases are not complicatedly combined or dangerous gas is not used for prevention of the elimination of the conductive film on the way, and thus it is possible to simplify the process or suppress manufacturing costs.

In addition, it is preferable that, when the dry etching of the etch-back process is performed, the conductive film has a selection ratio, which is equal to or larger than 10 and equal to or less than 50, with respect to a semiconductor material which configures each of the semiconductor thin films.

According to the configuration, it is possible to form the conductive film with comparatively thin film thickness. Therefore, for example, when the semiconductor thin films are transferred to the insulating substrate acquired after the conductive film is formed, a step is small (the film thickness of the conductive film is thin) even though the semiconductor thin films which runs over the conductive film are transferred, with the result that only little regions of the semiconductor thin films, which are not bonded to insulating substrate, remain, and thus it is possible to bond almost whole surfaces of the semiconductor thin films to the insulating substrate, and it is possible to form a semiconductor substrate having high reliability.

In addition, it is preferable that the semiconductor thin films be single crystal silicon. According to the configuration, it is possible to configure a semiconductor substrate as an SOI substrate.

In addition, it is preferable that the insulating substrate be formed of glass. According to the configuration, it is possible to configure an inexpensive and large-area semiconductor substrate.

In addition, it is preferable that each of the semiconductor thin films have a film thickness which is equal to or larger than 50 nm and equal to or less than 200 nm before the dry etching is performed to acquire a desired film thickness.

According to the configuration, when the semiconductor substrate is bonded to the insulating substrate and the semiconductor thin films are transferred to the insulating substrate, sufficient film thickness is secured in advance such that holes are not formed, and thus it is possible to prevent yield from deteriorating because holes are formed in the semiconductor thin films when transferring is performed.

In addition, it is preferable that, when the dry etching process is performed on each of the semiconductor thin films in order to acquire the desired film thickness, a film thickness of each of the etched semiconductor thin films be equal to or less than 100 nm. According to the configuration, since it is possible to suppress the film thickness for etching or for etching time, it is difficult to receive the difference in the etching rate due to the position in the substrate (the influence of in-plane distribution), and thus it is possible to acquire a semiconductor substrate which includes semiconductor thin films having uniform film thickness.

In addition, it is preferable to form a thin film transistor, a semiconductor circuit, a liquid crystal display apparatus, an electroluminescence apparatus, a wireless communication apparatus, and a light emitting apparatus using the semiconductor substrate according to the present invention. According to the configuration, it is possible to use a high-quality semiconductor substrate in which single crystal semiconductor thin films are formed on an inexpensive glass substrate. Therefore, with use of a high-performance and low-fluctuation thin film transistor which is equal to a case in which a single crystal semiconductor substrate, such as an SOI substrate or the like, is used, it is possible to chiefly provide a high-performance semiconductor circuit, a liquid crystal display apparatus, an electroluminescence apparatus, a wireless communication apparatus, and a light emitting apparatus, compared to a case in which a single crystal semiconductor substrate, such as an SOI substrate or the like, is used.

As described above, a method for manufacturing the semiconductor substrate according to the present invention includes: bonding a plurality of single crystal semiconductor substrates to an insulating substrate such that the plurality of single crystal semiconductor substrates are separated from each other; dividing a part of each of the single crystal semiconductor substrates, and transferring a plurality of semiconductor thin films to the insulating substrate such that the plurality of semiconductor thin films are separated from each other; and forming a conductive film that is formed of a conductive material between the plurality of semiconductor thin films.

Otherwise, as described above, a method for manufacturing the semiconductor substrate according to the present invention includes: forming a film, which is formed of a conductive material, on an insulating substrate; forming the conductive film in such a way as to expose the insulating substrate by removing the film, which is formed of the conductive material, in regions to which a plurality of single crystal semiconductor substrates are bonded, and, at the same time, to cause the conductive film to remain on the insulating substrate in regions to which the single crystal semiconductor substrates are not bonded; bonding the plurality of single crystal semiconductor substrates to the regions which expose the insulating substrate because the film which is formed of the conductive material is removed such that the plurality of single crystal semiconductor substrates are separated from each other; and dividing a part of each of the single crystal semiconductor substrates, and transferring the plurality of semiconductor thin films to the insulating substrate on which the conductive film is formed such that the plurality of semiconductor thin films are separated from each other.

According to the configuration, since it is possible to form the conductive film between the plurality of semiconductor thin films which are transferred to the insulating substrate, it is possible to suppress the exposure of the surface of the insulating substrate between the semiconductor thin films.

Therefore, when the etch-back process is performed on the semiconductor substrate in order to make each of the semiconductor thin films be a desired film thickness, it is possible to perform the etch-back process in such a way that the occurrence of potential difference between the plurality of semiconductor thin films and the insulating substrate is suppressed, and that the convergence of electric fields on the peripheral portions (end portions) of each of the semiconductor thin films is suppressed.

Therefore, it is possible to uniformly thin the plurality of semiconductor thin films up to the peripheral portions thereof with desired film thickness by performing the etch-back process.

In addition, it is preferable that the method further include: forming a film, which is formed of the conductive material used to configure the conductive film between the plurality of semiconductor thin films which are bonded to be separated from each other, and on the semiconductor thin films, to the insulating substrate; applying a resist on an upper layer of the film which is formed of the conductive material; patterning the resist by exposing and developing the resist; and forming the conductive film between the plurality of single crystal semiconductor substrates by etching the film which is formed of the conductive material.

According to the configuration, the conductive film is formed between the plurality of semiconductor thin films.

In addition, it is preferable that the resist be a negative resist. According to the configuration, when back exposure is performed, the resist between the plurality of semiconductor thin films is exposed, and thus it is possible to leave the exposed resist between the plurality of semiconductor thin films and to perform patterning using self-alignment.

In addition, it is preferable that, in the patterning performed by exposing the negative resist, back exposure be performed in which exposure is performed from a rear surface side of the insulating substrate, which is a rear surface of a surface on the side to which the negative resist is applied.

According to the configuration, since it is possible to expose the negative resist by using the plurality of semiconductor thin films as masks, a mask to expose the negative resist is not necessary. Therefore, it is possible to suppress manufacturing costs.

In addition, it is preferable that the method further include: performing dry etching, using plasma, on the surface of the insulating substrate on which the conductive film is formed between the plurality of semiconductor thin films, and forming thin semiconductor thin films by thinning the semiconductor thin films to a desired film thickness (etch-back process).

According to the configuration, the conductive film is formed between the plurality of semiconductor thin films which are transferred to the insulating substrate. That is, since it is suppressed that the surface of the insulating substrate is exposed between the plurality of semiconductor thin films, it is possible to perform the etch-back process in such a way that the occurrence of potential difference between the semiconductor thin films and the semiconductor substrates is suppressed, and that the convergence of electric fields on the peripheral portions (end portions) of each of the semiconductor thin films is suppressed. Therefore, it is possible to acquire semiconductor thin films, which are uniform up to the peripheral portions thereof and which have desired film thickness by performing the etch-back process.

In addition, it is preferable that the thinning of the semiconductor thin films by performing the dry etching using the plasma include performing the dry etching using any of $ClF_3$, $BrF_2$, $F_2$, $CF_4$, and $XeF_2$ as etching gas.

According to the configuration, since it is possible to increase the selection ratio of the etching rate of the conductive film with respect to the semiconductor thin films to 10 or larger (it is possible to slow the etching rate of the conductive film by 10 times or larger, compared to the etching rate of the semiconductor thin films), it is possible to form the conductive film with thin film thickness.

Therefore, for example, when the semiconductor thin films are transferred to the insulating substrate acquired after the conductive film is formed, a step is small (the film thickness of the conductive film is thin) even though the semiconductor thin films which run over the conductive film are transferred, with the result that little regions of the semiconductor thin films, which are not bonded to insulating substrate, remain, and thus it is possible to bond almost whole surfaces of the semiconductor thin films to the insulating substrate, and it is possible to form a semiconductor substrate having high reliability.

In addition, it is preferable that the method further include: respectively arranging the plurality of single crystal semiconductor substrates in a plurality of first depressed portions of a first support tray in which the first depressed portions separated from each other are formed; and bonding the plurality of single crystal semiconductor substrates which are respectively arranged in the first depressed portions to the insulating substrate collectively.

According to the configuration, since the plurality of single crystal semiconductor substrates are bonded to the insulating substrate collectively, it is possible to reduce the time that is taken for alignment or bonding, compared to the case in which the plurality of single crystal semiconductor substrates are individually bonded to the insulating substrate.

In addition, it is preferable that the method further include: forming fragile layers in the respective plurality of semiconductor substrates by irradiating ions to each of the plurality of single crystal semiconductor substrates; storing the plurality of single crystal semiconductor substrates in second depressed portions by arranging a second support tray, which includes the second depressed portions formed to store the plurality of single crystal semiconductor substrates, on a lower side of the insulating substrate to which the plurality of single crystal semiconductor substrates are bonded; dividing a part of each of the single crystal semiconductor substrates along each of the fragile layers by heating the single crystal semiconductor substrates which are stored in the respective plurality of second depressed portions; and recovering side portions of the substrates of the single crystal semiconductor substrate acquired through the division.

According to the configuration, the second depressed portions are arranged on the lower sides of the plurality of semiconductor substrates, the plurality of semiconductor substrates are stored in the respective second depressed portions, and a part of each of the single crystal semiconductor substrates is divided along each of the fragile layers with regard to the semiconductor substrates. Therefore, the side portions of the substrate of each of the semiconductor substrates acquired through the division fall into each of the second depressed portions due to gravity. In addition, since the second support tray is detached from the insulating substrate, it is possible to recover the side portions of the substrate of each of the separated semiconductor substrates acquired through the division.

Therefore, the side portions of the substrate of each of the separated semiconductor substrates acquired through the division are stored in each of the second depressed portions one by one and then recovered, there is not a case in which the semiconductor substrate comes into contact with or damages its transferred semiconductor layers or adjacent semiconductor layers in such a way that the side portions of the substrate of each of the separated semiconductor substrates acquired through the division moves or is deviated, and thus it is possible to acquire the semiconductor substrates which have few scratches or holes and excellent yield.

In addition, it is preferable that the first support tray have alkaline resistance. According to the configuration, it is possible to perform the hydrophilization process using an alkaline solvent. Therefore, compared to the hydrophilization process performed using a plasma process which requires an expensive vacuum apparatus, it is possible to perform the hydrophilization process using a cheap wet apparatus.

In addition, it is preferable that the second support tray be formed of quartz. According to the configuration, when division is performed by heating, it is possible to prevent the second support tray from transforming even when a comparatively high temperature heat of 600° C. or larger is applied to the second support tray.

In addition, it is preferable that a depth of each of the first depressed portions of the first support tray be shallower than a thickness of each of the single crystal semiconductor substrates and a thickness of an insulating film which is laminated on the single crystal semiconductor substrates. Therefore, it is possible to bond the single crystal semiconductor substrates which are arranged in the first depressed portions to the insulating substrate collectively.

In addition, it is preferable that a depth of each of the second depressed portions of the second support tray be deeper than a thickness of each of the single crystal semiconductor substrates stored in the second depressed portions and a thickness of the insulating film which is laminated on the single crystal semiconductor substrates. According to the configuration, it is possible to securely store the single crystal semiconductor substrates in the second depressed portions, and, when a part of each of the fragile layers is divided, it is possible to securely recover the part of the single crystal semiconductor substrate acquired through the division.

INDUSTRIAL APPLICABILITY

It is possible to use the present invention for a transistor which requires high speed and low power consumption, an electronic apparatus which uses the transistor, and the like.

REFERENCE SIGNS LIST 10 substrate
10a substrate
11 single crystal semiconductor substrate
11a single crystal semiconductor substrate
12 oxide film (insulating film)
12a oxide film (insulating film)
13 fragile layer
16, 46 semiconductor thin film
21 tray (first support tray)
22 depressed portion (first depressed portion)
25 tray (second support tray)
27 depressed portion (second depressed portion)
30 insulating substrate
30a space
30b space
32 semiconductor substrate
33, 133 conductive film
34 resist
34a resist
40, 41 semiconductor substrate
46 semiconductor thin film
46a semiconductor thin film
47 panel
50, 51 semiconductor substrate
133' conductive film (film formed of conductive material)

The invention claimed is:
1. A semiconductor substrate comprising:
an insulating substrate that is formed of an insulating material;
a plurality of semiconductor thin films that are arranged on the insulating substrate to be separated from each other; and
a conductive film which is arranged to fill a plurality of spaces between the plurality of semiconductor thin films preventing the insulating substrate from being exposed from the plurality of spaces between the plurality of semiconductor thin films, wherein the conductive film is arranged to surround peripheries of the semiconductor thin films, and wherein the plurality of semiconductor thin films are physically connected to the conductive film.

2. The semiconductor substrate according to claim 1, wherein the plurality of semiconductor thin films are arranged in a matrix.

3. The semiconductor substrate according to claim 1, wherein the plurality of semiconductor thin films are separated from each other at intervals of 5 mm or larger.

4. The semiconductor substrate according to claim 1, wherein reflectance of the conductive film is lower than reflectance of the semiconductor thin films.

5. The semiconductor substrate according to claim 1, wherein the conductive film is formed of a transparent material.

6. The semiconductor substrate according to claim 1, wherein the conductive film is formed of a conductive resist material.

7. The semiconductor substrate according to claim 1, wherein, when dry etching is performed, the conductive film has a selection ratio of an etching rate, which is equal to or larger than 0.8 and equal to or less than 1.2, with regard to a semiconductor material which configures each of the semiconductor thin films.

8. The semiconductor substrate according to claim 1, wherein, when dry etching is performed, the conductive film has a selection ratio of an etching rate, which is equal to or larger than 10 and equal to or less than 50, with regard to a semiconductor material which configures each of the semiconductor thin films.

9. The semiconductor substrate according to claim 1, wherein the semiconductor thin films are single crystal silicon.

10. The semiconductor substrate according to claim 1, wherein the insulating substrate is formed of glass.

11. The semiconductor substrate according to claim 10, wherein each of the semiconductor thin films has a film thickness which is equal to or larger than 50 nm and equal to or less than 200 nm before the dry etching is performed to acquire a desired film thickness.

12. The semiconductor substrate according to claim 11, wherein, when the dry etching process is performed on each of the semiconductor thin films in order to acquire the desired film thickness, a film thickness of each of the etched semiconductor thin films is equal to or less than 100 nm.

13. A thin film transistor manufactured using the semiconductor substrate according to claim 1.

14. A semiconductor circuit manufactured using the semiconductor substrate according to claim 1.

15. A liquid crystal display apparatus manufactured using the semiconductor substrate according to claim 1.

16. An electroluminescence apparatus manufactured using the semiconductor substrate according to claim 1.

17. A wireless communication apparatus manufactured using the semiconductor substrate according to claim 1.

* * * * *